US006995520B2

(12) United States Patent
Inukai

(10) Patent No.: US 6,995,520 B2
(45) Date of Patent: Feb. 7, 2006

(54) ACTIVE MATRIX LIGHT-EMITTING DEVICE AND A DRIVING METHOD THEREOF

(75) Inventor: Kazutaka Inukai, Kanagawa (JP)

(73) Assignee: Semiconductor Energy Laboratory Co., Ltd., (JP)

(*) Notice: Subject to any disclaimer, the term of this patent is extended or adjusted under 35 U.S.C. 154(b) by 0 days.

(21) Appl. No.: 10/872,073

(22) Filed: Jun. 18, 2004

(65) Prior Publication Data

US 2004/0227707 A1 Nov. 18, 2004

Related U.S. Application Data

(62) Division of application No. 09/840,584, filed on Apr. 23, 2001, now Pat. No. 6,791,129.

(30) Foreign Application Priority Data

Apr. 27, 2000 (JP) ............................. 2000-127384

(51) Int. Cl.
*G09G 3/10* (2006.01)
*G09G 5/00* (2006.01)
*G09G 3/30* (2006.01)

(52) U.S. Cl. .................. 315/169.3; 345/214; 345/77

(58) Field of Classification Search .. 315/169.1–169.3; 345/204, 214, 76–77, 82, 84; G09G 3/10, G09G 3/30, 5/00
See application file for complete search history.

(56) References Cited

U.S. PATENT DOCUMENTS

| 5,543,947 A | 8/1996 | Mase et al. ............... 345/92 |
| 5,936,686 A | 8/1999 | Okumura et al. .......... 349/38 |
| 6,034,659 A | 3/2000 | Wald et al. ............... 345/76 |
| 6,246,180 B1 | 6/2001 | Nishigaki ............... 315/169.3 |
| 6,362,798 B1 | 3/2002 | Kimura et al. ........... 345/55 |
| 6,501,448 B1 * | 12/2002 | Komiya et al. .......... 345/76 |
| 6,548,960 B2 | 4/2003 | Inukai ................. 315/169.3 |
| 6,611,108 B2 | 8/2003 | Kimura ................ 315/169.3 |
| 2001/0002703 A1 | 6/2001 | Koyama ................. 257/40 |

(Continued)

FOREIGN PATENT DOCUMENTS

EP 0 750 288 A2 12/1996

(Continued)

OTHER PUBLICATIONS

Tsutsui, T., et al, "Electroluminescence in Organic Thin Films," Photochemical Processes in Organized Molecular Systems, pp. 437-450, (1991).

(Continued)

*Primary Examiner*—Thuy Vinh Tran
(74) *Attorney, Agent, or Firm*—Cook, Alex, McFarron, Manzo, Cummings & Mehler, Ltd.

(57) ABSTRACT

An active matrix light emitting device which is capable of clear color display of multiple gray scales and a driving method hereof is provided. The light emitting device has a pixel portion, and the pixel portion has a plurality of pixels. Each of the plurality of pixels has an EL element, a first EL driver TFT, a second EL driver TFT, a switching TFT, and an erasure TFT. The first EL driver TFT and the second EL driver TFT are connected in parallel. The method of driving the device includes inputting a digital video signal outputted from a source signal line driver circuit, and forming n write-in periods and (m−1) erasure periods within one frame period, wherein m is an arbitrary number from 2 to n, wherein display and non-display periods are specifically defined, and wherein the plurality of EL elements are selected to emit light or not to emit light in the display periods in accordance with the digital video signal.

30 Claims, 25 Drawing Sheets

U.S. PATENT DOCUMENTS

| | | | |
|---|---|---|---|
| 2001/0035849 A1 | 11/2001 | Kimura et al. | 345/76 |
| 2002/0000576 A1 | 1/2002 | Inukai | 257/202 |
| 2002/0053884 A1 | 5/2002 | Kimura | 315/169.3 |
| 2002/0113760 A1 | 8/2002 | Kimura | 345/82 |

FOREIGN PATENT DOCUMENTS

| | | |
|---|---|---|
| EP | 1 003 150 A1 | 5/2000 |
| EP | 1 061 497 | 12/2000 |
| JP | 11-272233 | 10/1999 |
| JP | 2000-221903 | 8/2000 |
| JP | 2000-221942 | 8/2000 |
| JP | 2000-235370 | 8/2000 |
| JP | 2000-347621 | 12/2000 |
| JP | 2001-042822 | 2/2001 |
| JP | 2001-060076 | 3/2001 |
| WO | WO 99/48078 | 9/1999 |

OTHER PUBLICATIONS

Baldo, M.A. et al, "Highly Efficient Phosphorescent Emission from Organic Electroluminescent Devices," Nature, vol. 395, pp. 151-154, Sep. 10, (1998).

Baldo, M.A. et al, "Very High-Efficiency Green Organic Light-Emitting Devices Based on Electrophosphorescence," Applied Physics Letters, vol. 75, No. 1, pp. 4-6, Jul. 5, (1999).

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, (1999).

U.S. Appl. No. 09/724,387 (pending) to Inukai, including specification, claims, abstract, drawings and PTO filing receipt.

U.S. Appl. No. 09/725,798 (pending) to Koyama, including specification, claims, abstract, drawings and PTO filing receipt.

U.S. Appl. No. 09/747,646 (pending) to Inukai, including specification, claims, abstract, drawings and PTO filing receipt.

U.S. Appl. No. 09/836,719 (pending) to Kimura, including specification, claims, abstract, drawings and PTO filing receipt.

U.S. Appl. No. 09/841,098 (pending) including specification, claims, abstract, drawings and PTO filing receipt.

U.S. Appl. No. 09/886,148 (pending) to Inukai, including specification, claims, abstract, drawings and PTO filing receipt.

U.S. Appl. No. 09/992,569 (pending) to Kimura, including specification, claims, abstract, drawings and PTO filing receipt.

U.S. Appl. No. 10/079,072 (pending) to Kimura, including specification, claims, abstract, drawings and PTO filing receipt.

European Search Report for application No. 01 11 0471, dated Jan. 7, 2003.

First Office Action re Chinese Patent Application no. 01117948.1, dated Sep. 23, 2005 (9 pages).

* cited by examiner

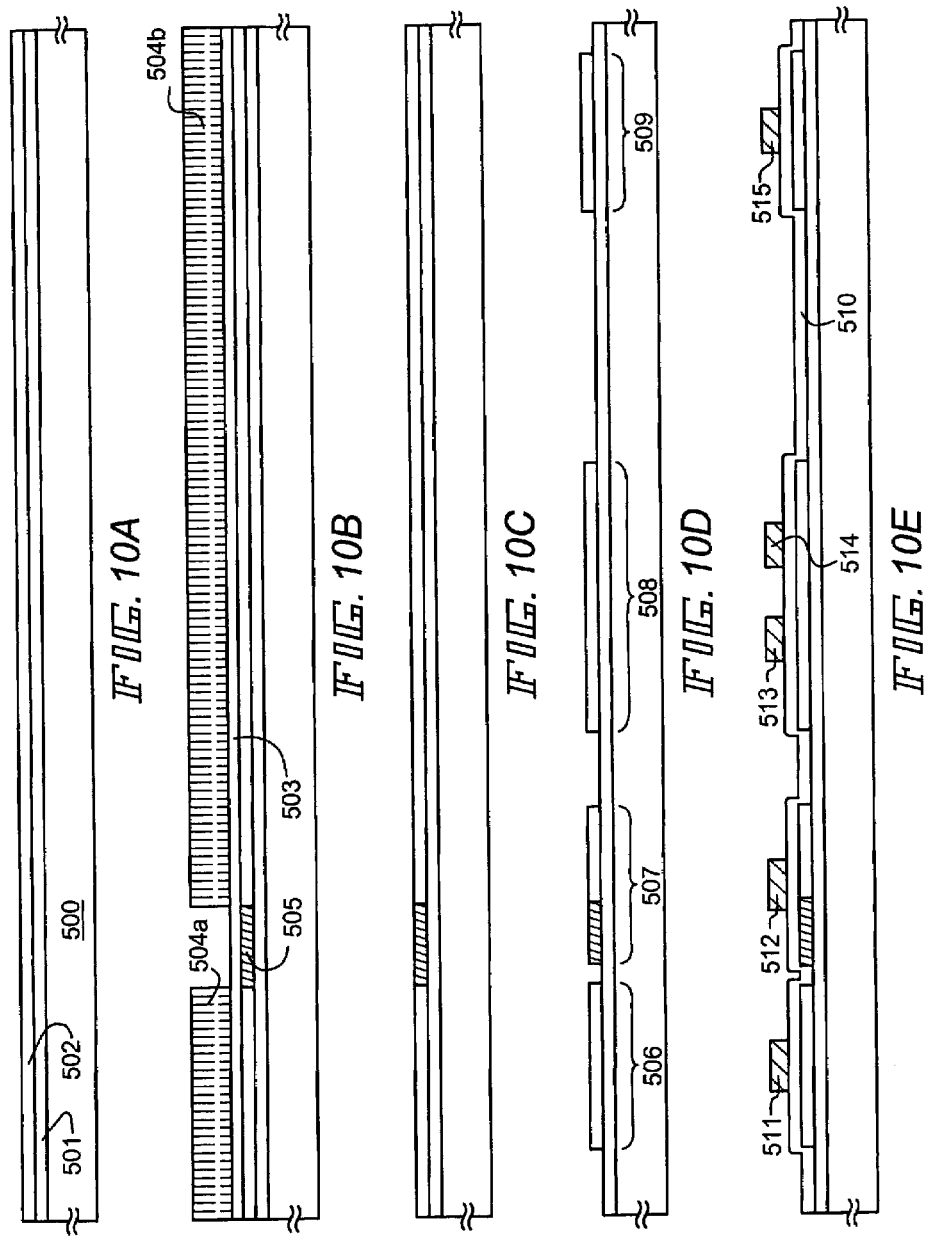

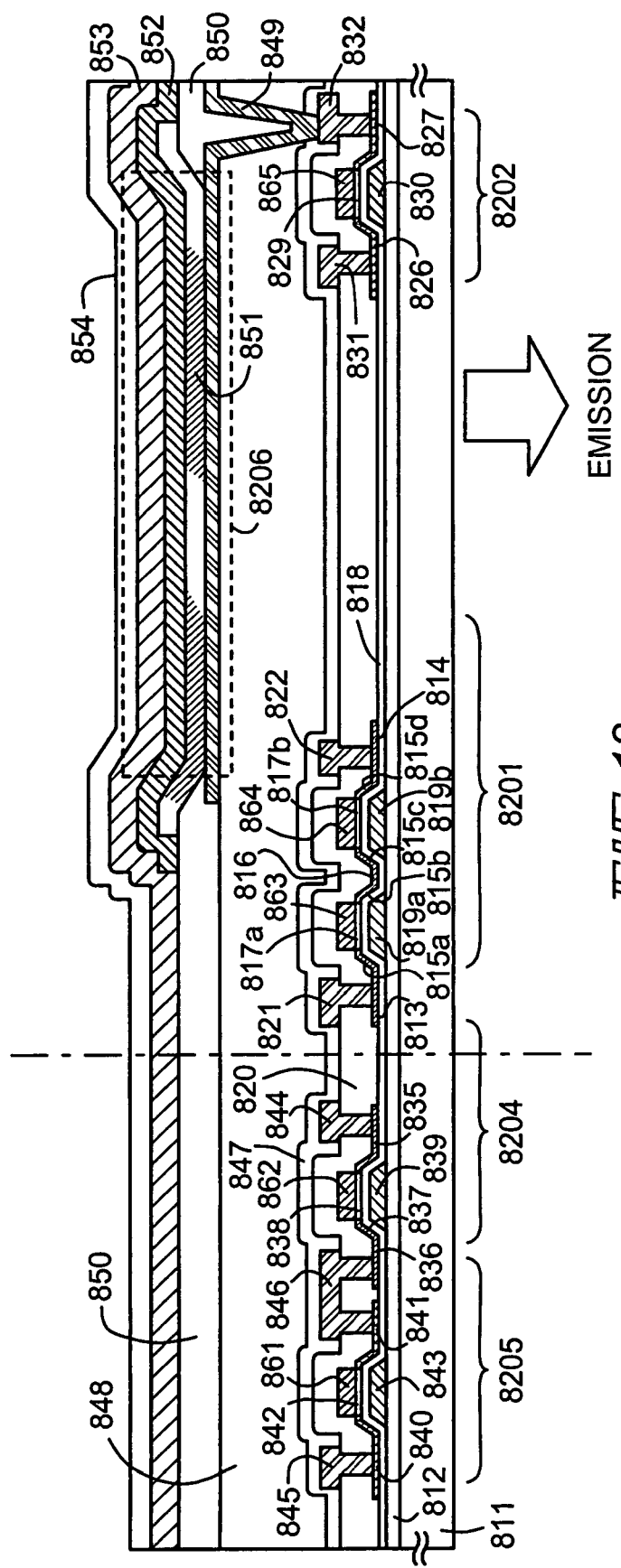

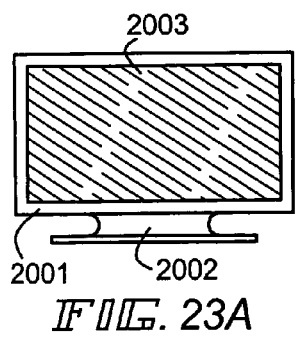
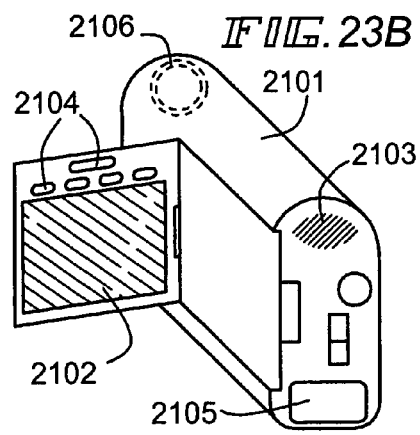
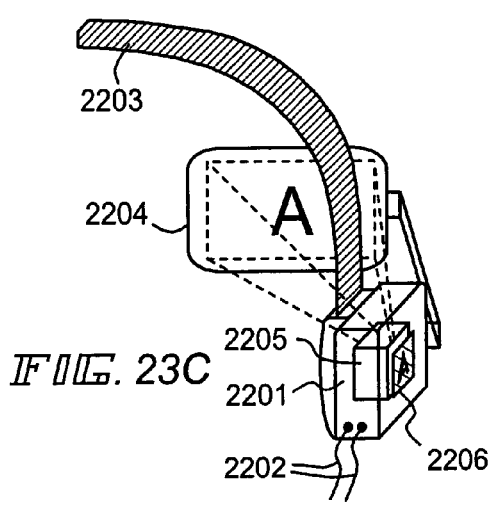
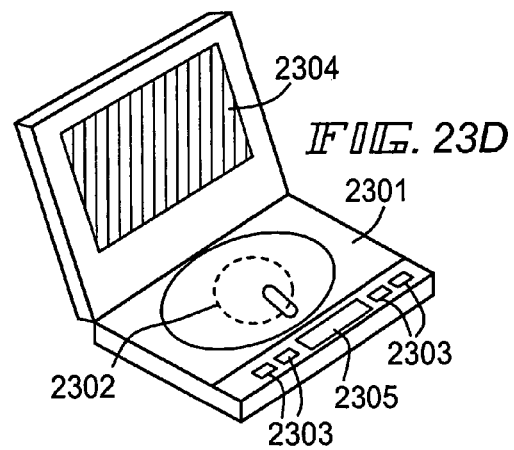
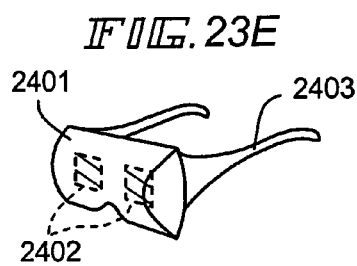
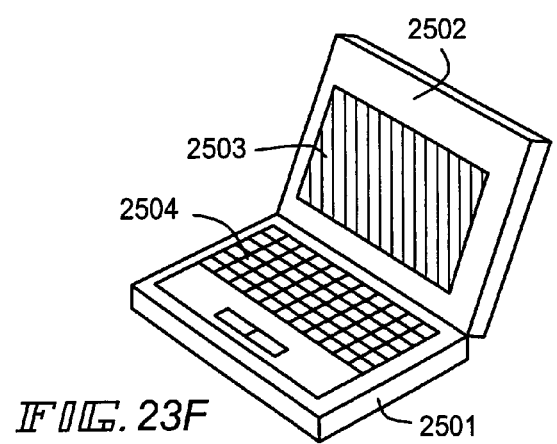

ACTIVE MATRIX LIGHT-EMITTING DEVICE AND A DRIVING METHOD THEREOF

This application is a divisional of U.S. application Ser. No. 09/840,584, filed on Apr. 23, 2001 which is now U.S. Pat. No. 6,791,129.

BACKGROUND OF THE INVENTION

1. Field of the Invention

The present invention relates to an electronic display formed by fabricating an EL (electro luminescence) on a substrate, in particular, to an EL display using a semiconductor element (an element which uses a semiconductor thin film). Further, the present invention relates to a light emitting device using an EL display in a display portion.

2. Description of the Related Art

Recently, a technique for forming TFTs on a substrate has been remarkably developed, and its application to an active matrix electronic display has been in proceeding. In particular, TFTs using a polysilicon film can operate at high speed, because such TFTs have a higher field effect mobility than TFTs using a conventional amorphous silicon film. Therefore, the control of pixels, which has been conventionally conducted by a driver circuit provided outside a substrate, can be performed by a driver circuit provided on the same substrate on which the pixels are provided.

Such an active matrix electronic display includes various circuits and elements formed on the same substrate. With this structure, the active matrix electronic display provides various advantages such as reduced manufacturing cost, reduced size of an electronic display, an increased yield, and an increased throughput.

Furthermore, an active matrix EL display including an EL element as a self-light emitting element has been actively studied. The EL display is also called Organic EL Display (OELD) or Organic Light Emitting Diode (OLED).

In contrast with the liquid crystal display device, the EL display has a type of self-light emitting. The EL element has such a structure that a layer containing an organic compound (hereinafter, referred to as an EL layer) is sandwiched between a pair of electrodes (anode and cathode). The EL layer generates luminescence by applying an electric field across the pair of electrodes and has normally a laminate structure. As a typical example of the laminate structures, a laminate structure "hole transporting layer/light emitting layer/electron transporting layer" proposed by Tang et al. of Eastman Kodak Company is cited. This structure has an extremely high light emitting efficiency. For this advantage, most light emitting devices, Which are currently under study and development, employ this structure.

Furthermore, the light emitting device may have such a laminate structure that a hole injecting layer/a hole transporting layer/a light emitting layer/an electron transporting layer, or a hole injecting layer/a hole transporting layer/a light emitting layer/an electron transporting layer/an electron injecting layer are deposited on an anode in this order. Moreover, the light emitting layer may be doped with a fluorescent pigment or the like.

All layers formed between a cathode and an anode are referred to generically as EL layers within this specification. The above stated hole injecting layer, hole transporting layer, light emitting layer, electron transporting layer, electron injecting layer, and the like are therefore all contained within the EL layer. There is emission of light when returning to a base state from a triplet excitation state (phosphorescence), and when returning to a base state from a singlet excitation state (fluorescence), in luminescence of organic compounds, and a light emitting device of the present invention may use any one of the above light emitting types, or may also use both types of light emission.

A predetermined voltage is then applied to the EL layer with the above structure by a pair of electrodes, recombination of carriers thus occurs in the light emitting layer, and light is emitted. Note that the emission of light by the EL element is referred to as driving the EL element throughout this specification. Further, a light emitting element formed by an anode, an EL layer, and a cathode is referred to as an EL element throughout this specification.

As a method of driving an EL display, an analog driving method (analog drive) can be given. The analog drive of an EL display is described with reference to FIGS. 25 and 26.

FIG. 25 shows a structure of a pixel portion 1800 of an EL display that is driven in an analog manner. Gate signal lines (G1 through Gy) to which gate signals from a gate signal line driver circuit are input are connected to gate electrodes of switching TFTs 1801 included in respective pixels. Source regions or drain regions of the switching TFTs 1801 included in the respective pixels is connected to source signal lines (also referred to as data signal lines) S1 to Sx to which an analog video signal is input, whereas the others are connected gate electrodes of EL driver TFT 1804 and capacitors 1808 included in the respective pixels.

Source region of the EL driver TFTs 1804 included in pixels are connected to power source supply lines Vd1 through Vx, whereas drain regions of the EL driver TFTs 1804 are connected to EL elements 1806. An electric potential of the power source supply lines V1 through Vx is referred to as an power source electric potential. The power source supply lines V1 through Vx are connected to the capacitors 1808 included in the respective pixels.

The EL element 1806 includes an anode, a cathode and an EL layer sandwiched between the anode and the cathode. If the anode of the EL element 1806 is connected to the drain region of the EL driver TFT 1804, the anode and the cathode of the EL element 1806 become a pixel electrode and an opposing electrode, respectively. On the other hand, if the cathode of the EL element 1806 is connected to the drain region of the EL driver TFT 1804, the anode and the cathode of the EL element 1806 become an opposing electrode and a pixel electrode. respectively.

Note that the electric potential of the opposing electrode is referred to as an opposing electric potential in this specification. Note also that an power source for imparting the opposing electric potential to the opposing electrode is referred to as an opposing electric power supply. The electric potential difference between the electric potential of the pixel electrode and the electric potential of the opposing electrode is an EL driver voltage, and the EL driver voltage is applied to the EL layer.

FIG. 26 shows a timing chart in the case where the EL display shown in FIG. 25 is driven in an analog manner. The period from the selection of one gate signal line to the selection of the next gate signal line is called one line period (L). The period from starting display of one image to starting display the next image corresponds to one frame period (F). In the case of the EL display shown in FIG. 25, since there are y gate signal lines, y line periods (L1 to Ly) are provided within one frame period.

With the enhancement in resolution, the number of line periods within one frame period increases. As a result, the driver circuit must be driven at a high frequency.

An power source electric potential at the power source supply lines V1 through Vx is held constant, and an opposing electric potential at the opposing electrodes is also held constant. There is a potential difference between the opposing electric potential and the power source electric potential to such a degree that a EL element emits light.

The gate signal line G1 is selected in the first line period L1 by a gate signal input to the gate signal line G1 from the gate signal line driver circuit.

Note that, in this specification, the term "a gate signal line is selected" refers to a state in which all of the thin film transistors which have gate electrodes connected to the gate signal line are in an ON state.

An analog video signal is then input to the source signal lines S1 to Sx in order. All of the switching TFTs 1801 connected to the gate signal line G1 are in an ON state, and therefore the analog video signals input to the source signal lines S1 to Sx are input to gate electrodes of the EL driver TFTs 1804 through the switching TFTs 1801.

The amount of current flowing through a channel formation region of the EL driver TFT 1804 is controlled by a level of an electric potential (voltage) of a signal input to the gate electrode of the EL driver TFT 1804. Accordingly, the electric potential applied to the pixel electrode of the EL element 1806 is determined by the level of the electric potential of the analog video signal input to the gate electrode of the EL driver TFT 1804. Then, the EL element 1806 is controlled by the electric potential of the analog video signal to emit light.

When the above-described operation is repeated to complete the input of analog video signals to the source signal lines (S1 through Sx), the first line period (L1) terminates. One line period may alternatively be constituted by the period until the completion of input of the analog video signals to the source signal lines (S1 through Sx) and a horizontal blanking period.

Then, a second line period (L2) starts when a gate signal line G2 is selected by a gate signal. As in the first line period (L1), analog video signals are sequentially input to the source signal lines (S1 through Sx) during the second line period.

When all gate signal lines (G1 through Gy) are selected in this manner, all line periods (L1 through Ly) are completed. The completion of all the line periods (L1 through Ly) corresponds to the completion of one frame period. All pixels perform display during one frame period to form an image. One frame period may be alternatively constituted by all line periods (L1 through Ly) and a vertical blanking period.

The amount of light emitted by the EL element is thus controlled in accordance with the analog video signal, and gray scale display is performed by controlling the amount of light emitted. This method is namely a driving method referred to as an analog driving method, gray scale display is performed by changing the electric potential of the analog video signal input to the source signal lines.

The control of the amount of current to be supplied to an EL element by a gate voltage of an EL driver TFT in an analog driving method as described above will be described in detail with reference to FIGS. 27A and 27B.

FIG. 27A is a graph showing a transistor characteristic of an EL driver TFT. In this graph, a line 2801 is referred to as an $I_{DS}$–$V_{GS}$ characteristic (or an $I_{DS}$–$V_{GS}$ curve). Here, $I_{DS}$ indicates a drain current, and $V_{GS}$ indicates a voltage (gate voltage) between a gate electrode and a source region. This graph allows to see the amount of current that flows at an arbitrary gate voltage.

When gray scale display is performed in the analog driving method, the EL element is driven using a region shown by a dotted line 2802 of the above $I_{DS}$–$V_{GS}$ characteristic. An enlargement of the region surrounded by reference numeral 2802 is shown in FIG. 27B.

A region shown by slanted lines in FIG. 27B is referred to as a saturated region. Specifically, if the threshold voltage value is taken as $V_{TH}$, the saturation region is a region in which the gate voltage satisfies $|V_{GS}-V_{th}|<|V_{DS}|$, and the drain current changes exponentially with respect to changes in the gate voltage in this region. Electric current control is performed by the gate voltage using this region.

A gate voltage of an EL driver TFT is determined by an analog video signal which is input into a pixel with turning on a switching TFT. At this time, based on the $I_{DS}$–$V_{GS}$ characteristic shown in FIG. 27A, a drain current with respect to a gate voltage is determined in a one-to-one correspondence. More specifically, a voltage of the analog video signal input to the gate electrode of the EL driver TFT determines an electric potential of the drain region. As a result, a predetermined amount of drain current flows into an EL element so that the EL element emits light in the amount corresponding to the amount of the current.

As described above, the amount of light emitted from the EL element is controlled by a video signal to perform gray-scale display.

However, the above analog driving has a disadvantage of being extremely affected by fluctuation in TFT characteristics. Even when the same gate voltage is applied to the EL driver TFTs of the respective pixels, the EL driver TFTs cannot output the same drain current if there exists a fluctuation in $I_{DS}$–$V_{GS}$ characteristics of the EL driver TFTs. Furthermore, as is apparent from FIG. 27A, since the region in which a drain current exponentially changes with respect to a change in gate voltage is used, the amount of current to be output may greatly differ with a slight shift in $I_{DS}$–$V_{GS}$ characteristic even when the same gate voltage is applied to the TFTs. Under such a condition, even when signals of the same voltage are input, the amounts of light emitted from the EL elements of adjacent pixels differ from each other due to a slight fluctuation in $I_{DS}$–$V_{GS}$ characteristic.

As described above, the analog driving is extremely sensitive to fluctuation in characteristic of EL driver TFTs, which is a problem in the gray-scale display of a conventional active matrix EL device.

SUMMARY OF THE INVENTION

The present invention has been made in view of the above problems, and has an object of providing an active matrix EL display which enable clear multi-gray scale color display. Moreover, the present invention has another object of providing light emitting devices (electronic appliances) with high performance, including such an active matrix EL display as a display.

The inventors of the present invention consider that the problems in analog driving result from conducting a gray-scale display using a saturated region that is susceptible to the effect of fluctuation in $I_{DS}$–$V_{GS}$ characteristic due to an exponential change in a drain current with respect to a change in a gate voltage.

More specifically, in the case where there is a variation in $I_{DS}$–$V_{GS}$ characteristic, a drain current exponentially varies with a change in a gate voltage in a saturated region. Therefore, even if the same gate voltage is applied, different currents (drain currents) are output, resulting in inconvenience that a desired gray-scale cannot be obtained.

Thus, the present inventors considered controlling the amount of light emitted from an EL element by control of a period during which the EL element emits light, not by control of current using a saturated region. In other words, the amount of light emitted from the EL element is controlled in terms of time to realize a gray-scale display in the present invention. A driving method for performing gray-scale display by controlling a light emitting period of an EL element is called a time-division driving method (hereinafter, referred to as digital driving). Gray-scale display realized by a time-division driving method is called time division gray-scale display.

In accordance with the above structure, even if there is some fluctuation in the $I_{DS}$-$V_{GS}$ characteristic of the EL driver TFT, it becomes possible to avoid a situation in which the amount of light emitted from the EL elements differs greatly in adjacent pixels when signals of the same voltage are input with the present invention.

BRIEF DESCRIPTION OF THE DRAWINGS

In the accompanying drawings:

FIGS. 10A to 10E show a manufacturing process of the EL display according to the present invention;

FIG. 13 is a view showing in detail a cross-section of the EL display according to the present invention;

FIGS. 23A to 23E are electric appliances using the EL display according to the present invention;

DETAILED DESCRIPTION OF THE PREFERRED EMBODIMENTS

Hereinafter, a structure of an EL display according to the present invention and a driving method thereof will be described. The case where $2^n$ gray-scale display is performed by an n-bit digital video signal is herein described.

[Embodiment Mode]

Figure 1:
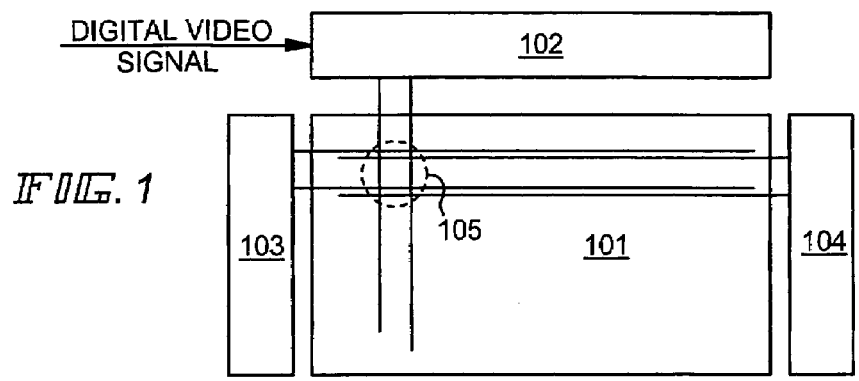
FIG. 1 is a block diagram showing a circuit structure of an El display according to the present invention.

An example of a block diagram of an EL display of the present invention is shown in FIG. 1. The EL display of FIG. 1 has a pixel portion 101, and circuits arranged in the periphery of the pixel portion 101: a source signal line driver circuit 102; a write in gate signal line driver circuit (first gate signal line driver circuit) 103; and an erasure gate signal line driver circuit (a second gate signal line driver circuit) 104, all with TFTs formed on a substrate. Note that, although the EL display shown in the embodiment mode has one source signal line driver circuit, the present invention is not limited to this, and the present invention may also have two or more source signal line driver circuits.

Further, in the present invention the source signal line driver circuit 102, the write in gate signal line driver circuit 103, and the erasure gate signal line driver circuit 104 may also be implemented on the substrate on which the pixel portion 101 is formed, or may also be formed on an IC chip and connected to the pixel portion 101 through an FPC or a TAB.

Figure 2:
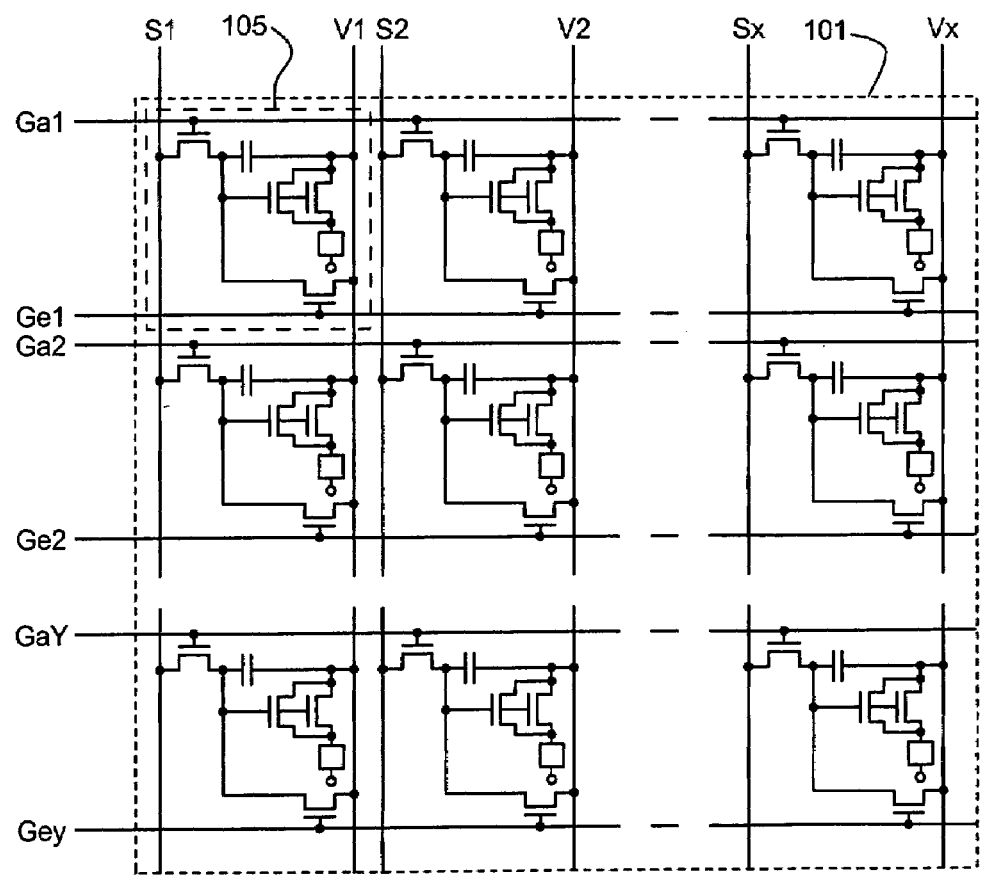
FIG. 2 is a circuit diagram of a pixel portion of the EL display according to the present invention.

FIG. 2 shows an enlarged diagram of the pixel portion 101. Source signal lines S1 to Sx, power source supply lines V1 to Vx, write in gate signal lines (first gate signal lines) Ga1 to Gay, and erasure gate signal lines (second gate signal lines) Ge1 to Gey are formed in the pixel portion 101.

A pixel 105 is a region which has one of the source signal lines S1 to Sx, one of the power source supply lines V1 to Vx, one of the write in gate signal lines Ga1 to Gay; and one of the erasure gate signal lines Ge1 to Gey. A plurality of the pixels 105 are arranged in a matrix shape in the pixel portion 101.

Figure 3:
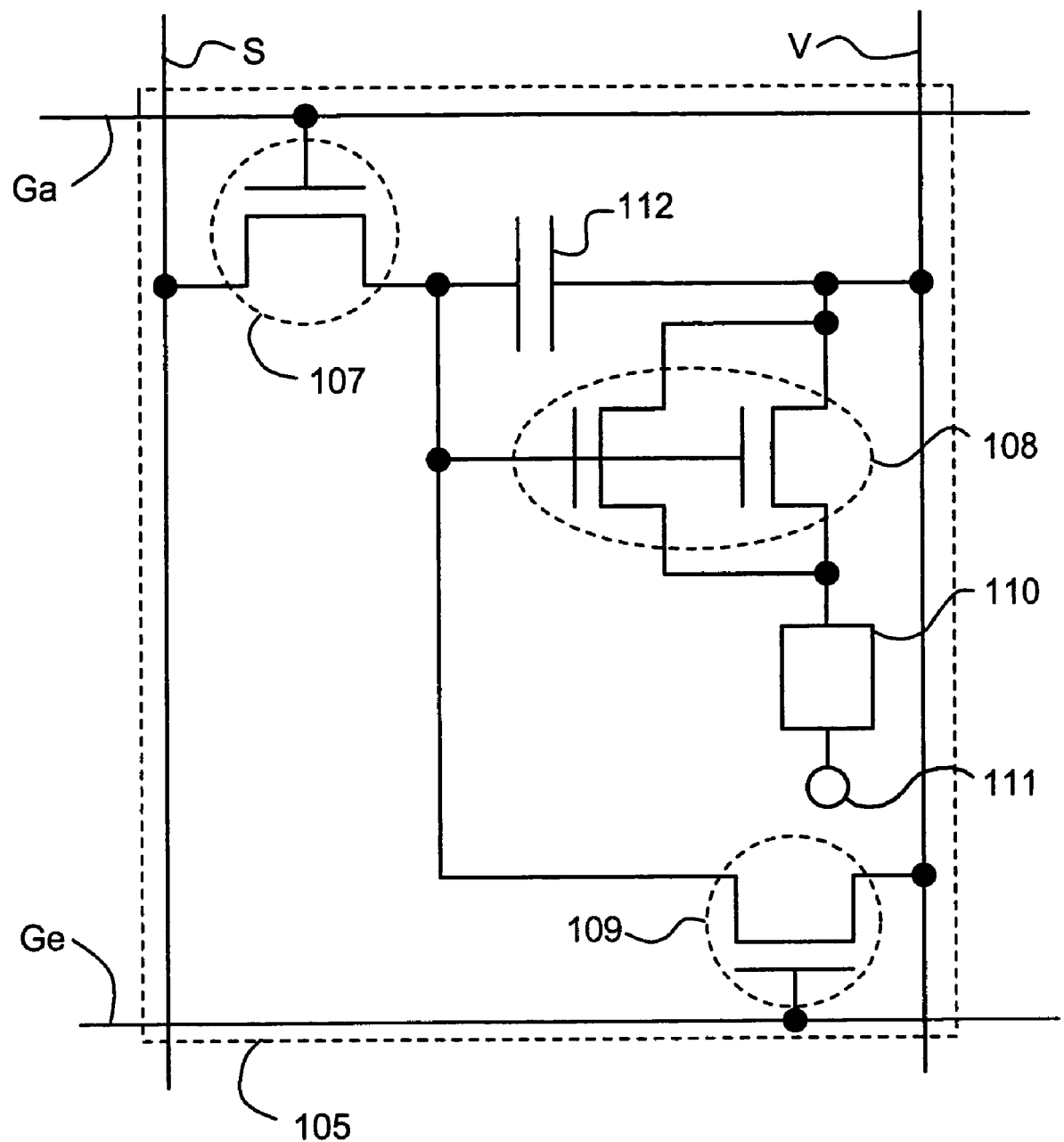
FIG. 3 is a circuit diagram of the pixel of the EL display according to the present invention.

An enlarged diagram of the pixel 105 is shown in FIG. 3. Reference numeral 107 denotes a switching TFT, reference numeral 108 denotes an EL driver TFT, reference numeral 109 denotes an erasure TFT, reference numeral 110 is an EL element, reference numeral 111 is an opposing power source, and reference numeral 112 is a capacitor. The EL driver TFT 108 consists of two EL driver TFTs (a first EL driver TFT and a second EL driver TFT) connected in parallel. The first EL driver TFT and the second EL driver TFT are referred to as the EL driver TFT in this specification.

A gate electrode of the switching TFT 107 is connected to a write in gate signal line Ga (one of the write in gate signal lines Ga1 to Gay). One of a source region and a drain region of the switching TFT 107 is connected to a source signal line S (one of the source signal lines S1 to Sx), and the other is connected to a gate electrode of the EL driver TFT 108, to the storage capacitor 112 of each pixel, and to a source region or a drain region of the erasure TFT 109.

The capacitor 112 is provided so as to retain a gate voltage of the EL driver TFT 108 when the switching TFT 107 is in a non-selected state (OFF state). Although the structure in which the capacitor 112 is provided is shown in this embodiment mode, the present invention is not limited thereto; the structure in which the capacitor 112 is not provided may also be employed.

A source region of the EL driver TFT 108 is connected to an power source supply line V (any one of V1 through Vx), and a drain region is connected to an EL element 110. The power source supply line V is connected to the capacitor 112.

From among the source region and the drain region of the erasure TFT 109, the one which is not connected to the gate electrode of the EL driver TFT 108 is connected to the power source supply line V. The gate electrode of the erasure TFT 109 is connected to an erasure gate signal line Ge (any one of Ge1 through Gey).

The EL element 110 includes an anode, a cathode and an EL layer provided between the anode and the cathode. In the case where the anode is connected to the drain region of the EL driver TFT 108, the anode serves as a pixel electrode while the cathode serves as an opposing electrode. On the contrary, in the case where the cathode is connected to the drain region of the EL driver TFT 108, the cathode serves as a pixel electrode while the anode serves as an opposing electrode.

The opposing electrode of the EL element 110 is connected to the opposing power source 111 provided outside the substrate including the pixel portion 101, and an opposing electric potential is always applied to the opposing electrode. Further, the power source supply line V is connected to an power source (not shown in the figure) provided outside the substrate including the pixel portion 101, and an power source electric potential is always applied to the power source supply line V. The opposing electric potential and the power source electric potential are always maintained at an electric potential difference in order that the EL element emits light when the power source electric potential is applied to the pixel electrode.

For a recent typical EL display, about several mA/cm² of current per area of a pixel portion is necessary in the case where the amount of light per area of the pixel portion is 200 cd/m². Therefore, when the size of the pixel portion is increased, it becomes difficult to control the electric potential applied from the power source provided in such as an IC to a power source supply line by a switch. In the present invention, however, the power source electric potential and the opposing electric potential are always held constant. The present invention is effective to realize a panel for a larger screen size since it is not necessary to control the electric potential level applied from the power source in the IC by a switch.

The switching TFT 107, the EL driver TFT 108, and the erasure TFT 109 may be n-channel TFT or p-channel TFTs. However, it is necessary that the first EL driver TFT and the second EL driver TFT have the same polarity. It is preferable that the EL driver TFT 108 is a p-channel TFT for cases in which the anode of the EL element 110 is the pixel electrode and the cathode is the opposing electrode. Conversely, it is preferable that the EL driver TFT 108 is an n-channel TFT when the anode of the EL element 110 is the opposing electrode and the cathode is the pixel electrode.

Further, the switching TFT 107, the EL driver TFT 108, and the erasure TFT 109 may have, in addition to a single gate structure, a multi-gate structure such as a double gate structure or a triple gate structure.

A method of driving the EL display of the present invention shown by FIGS. 1 to 3 is explained next using FIG. 4.

First, the write in gate signal line Ga1 is selected in accordance with a write in gate signal (the first gate signal) input to the write in gate signal line Ga1 from the write in gate signal line driver circuit 103. The switching TFTs 107, all pixels (the first line of pixels) connected to the write in gate signal line Ga1, are then placed in an ON state.

At the same time, the first bit of a digital video signal input to the source signal lines S1 to Sx from the source signal line driver circuit 102 is input to the gate electrodes of the EL driver TFTs 108 through the switching TFTs 107. Note that the input of the digital video signal to the gate electrodes of the EL driver TFT 108 through the switching TFTs 107 indicates that the digital video signal is input to the pixels in the present invention.

The digital video signal has information of "0" or "1". The digital video signals of "0" and "1" are signals where one has a Hi level voltage, while the other has a Lo level voltage.

In this embodiment mode, in the case where the digital video signal has information of "0", the EL driver TFT 108 is turned OFF. Accordingly, the power source electric potential is not applied to the pixel electrode of the EL element 110. As a result, the EL element 110 included in the pixel, to which the digital video signal having information of "0" is input, does not emit light.

On the contrary, in the case where the digital video signal has information of "1", the EL driver TFT 108 is turned ON. Accordingly, the power source electric potential is applied to the pixel electrode of the EL element 110. As a result, the EL element 110 included in the pixel, to which the digital video signal having information of "1" is input, emits light.

In this embodiment mode, the EL driver TFT 108 is turned OFF in the case where the digital video signal has information of "0", and the EL driver TFT 108 is turned ON in the case where the digital video signal has information of "1". However, the present invention is not limited to such a structure. Alternatively, the EL driver TFT 108 may be turned ON with the digital video signal having information of "0", and the EL driver TFT 108 may be turned OFF with the digital video signal having information of "1".

In this way, the EL elements 110 are brought into a light emitting state or a non-light emitting state simultaneously with the input of the digital video signal of the first bit to the first line of pixels and the first line of pixels perform display. A period during which pixels perform display is referred to as a display period Tr. In particular, a display period that starts with the input of the digital video signal of the first bit to a pixel is designated as Tr1. The timing at which the display period of each line starts has a time difference, respectively.

Next, the write in gate signal line Ga2 is selected by the write in gate signal when selection of the write in gate signal line Ga1 is completed. The switching TFTs 107, all pixels connected to the write in gate signal line Ga2, are made an ON state and the first bit of the digital video signal is then input to the second line of pixels from the source signal lines S1 to Sx.

All of the write in gate signal lines Ga1 to Gay are then selected in order, and the first bit of the digital video signal is input to all the pixels. A period during which the first bit of the digital video signal is input to all the pixels denotes a write in period Ta1.

On the other hand, before the first bit of the digital video signal is input to all the pixels, namely before the write in period Ta1 is complete, the erasure gate signal line Ge1 is selected in accordance with an erasure gate signal (the second gate signal) input from the erasure gate signal line driver circuit 104 in parallel with the input of the first bit of the digital video signal to the pixels. The erasure TFTs 109, all the pixels (the first line of pixels) connected to the erasure gate line Ge1, are made an ON state. The power source electric potential of the power source supply lines V1 to Vx is then imparted to the gate electrodes of the EL driver TFTs 108 through the erasure TFT 109.

The gate electrodes and the source regions of the EL driver TFTs 108 are maintained at the same electric potential when the power source electric potential is imparted to the gate electrode of the EL driver TFT 108, and the gate voltage is 0 V. Therefore the EL driver TFTs are made an OFF state. Namely, the digital video signals, which have been stored by the gate electrodes of the EL driver TFTs since the write in gate signal line Ga1 is selected by the write in gate signal, are erased by the power source electric potential imparted to the gate electrodes of the EL driver TFTs. The power source electric potential consequently is not imparted to the pixel electrodes of the EL elements 110, and all of the EL elements 110 of the first line of pixels then become made a non-light emitting state. The first line of pixels therefore do not perform display.

A period during which the pixels do not perform display is referred to as a non-display period Td. For the first line of pixels, a display period Tr1 is simultaneously completed when the erasure gate signal is input to the erasure gate signal line Ge1, and a non-display period Td1 thus begins. Then, similar to the display period Tr, the timing of each line, at which the non-display period Td begins, has a time difference, respectively.

The erasure gate line Ge2 is selected when the selection of Ge1 is complete, and the erasure TFTs 109, all the pixels (the second line of pixels) connected to the erasure gate line Ge2, are then made an ON state. The power source electric potential of the power source supply lines V1 to Vx is then imparted to the gate electrodes of the EL driver TFTs 108 through the erasure TFT 109. The EL driver TFT 108 are made an OFF state when the power source electric potential is imparted to the gate electrodes of the EL driver TFTs 108. The power source electric potential is therefore not imparted to the pixel electrodes of the EL elements 110. As a result, the EL elements of the second line of pixels are all made in a non-light emitting state, and the second line of pixels becomes in a non-display state in which display is not performed.

The erasure gate signal is then input to all of the erasure gate signal lines in order. A period during which all of the erasure gate signal lines (Ge1 to Gey) are selected and the first bit of the digital video signal stored in all the pixels is erased is referred to as an erasure period Te1.

On the other hand, before the first bit of the digital video signal stored in all the pixels is erased, namely before the erasure period Te1 is complete, the write it gate signal line Ga1 is again selected in accordance with the write in gate signal in parallel with the erasure of the first bit of the digital video signal in the pixels, the second bit of the digital video signal is then input to the first line of pixels. Display again is performed in the first line of pixels as a result, the non-display period Td1 finishes, and a display period Tr2 begins.

All of the write in gate signal lines are similarly selected in order, and the second bit of the digital video signal is input to all of the pixels. A period during which the second bit of the digital video signal is input to all the pixels is referred to as the write in period Ta2.

On the other hand, before the second bit is input to all the pixels, namely before the write in period Ta2 is complete, the erasure gate signal line Ge1 is selected in accordance with the erasure gate signal in parallel with the input of the second bit of the digital video signal to the pixels. The EL elements of the first line of pixels are thus all made in a non-light emitting state, and the first line of pixels performs no display. The display period Tr2 therefore finishes in the first line of pixels, and a non-display period Td2 begins.

All of the erasure gate signal lines Ge1 to Gey are selected in order, and the second bit of the digital video signal stored in all of the pixels is erased. A period, during which all of the erasure gate signal lines Ge1 to Gey are selected and the second bit of the digital video signal stored in all the pixels is erased, is an erasure period Te2.

The above operations are repeatedly performed until the m-th bit of the digital video signal is input to the pixels, and the display period Tr and the non-display period Td repeatedly appear. The display period Tr1 begins when the write in period Ta1 begins, and finishes when the erasure period Te1 begins. Further, the non-display period Td1 begins when the erasure period Te1 begins, and finished the next write in period (the write in period Ta2 in thus embodiment) appears. With respect to display periods Tr2, Tr3, ..., Tr(m−1) and non-display periods Td2, Td3, ..., Td(m−1), each of them is determined by the write in periods Ta1, Ta2, ..., Tam, and the erasure periods Te1, Te2, ..., Te(m−1), respectively, similar to the display period Tr1 and the non-display period Td1.

Figure 4:
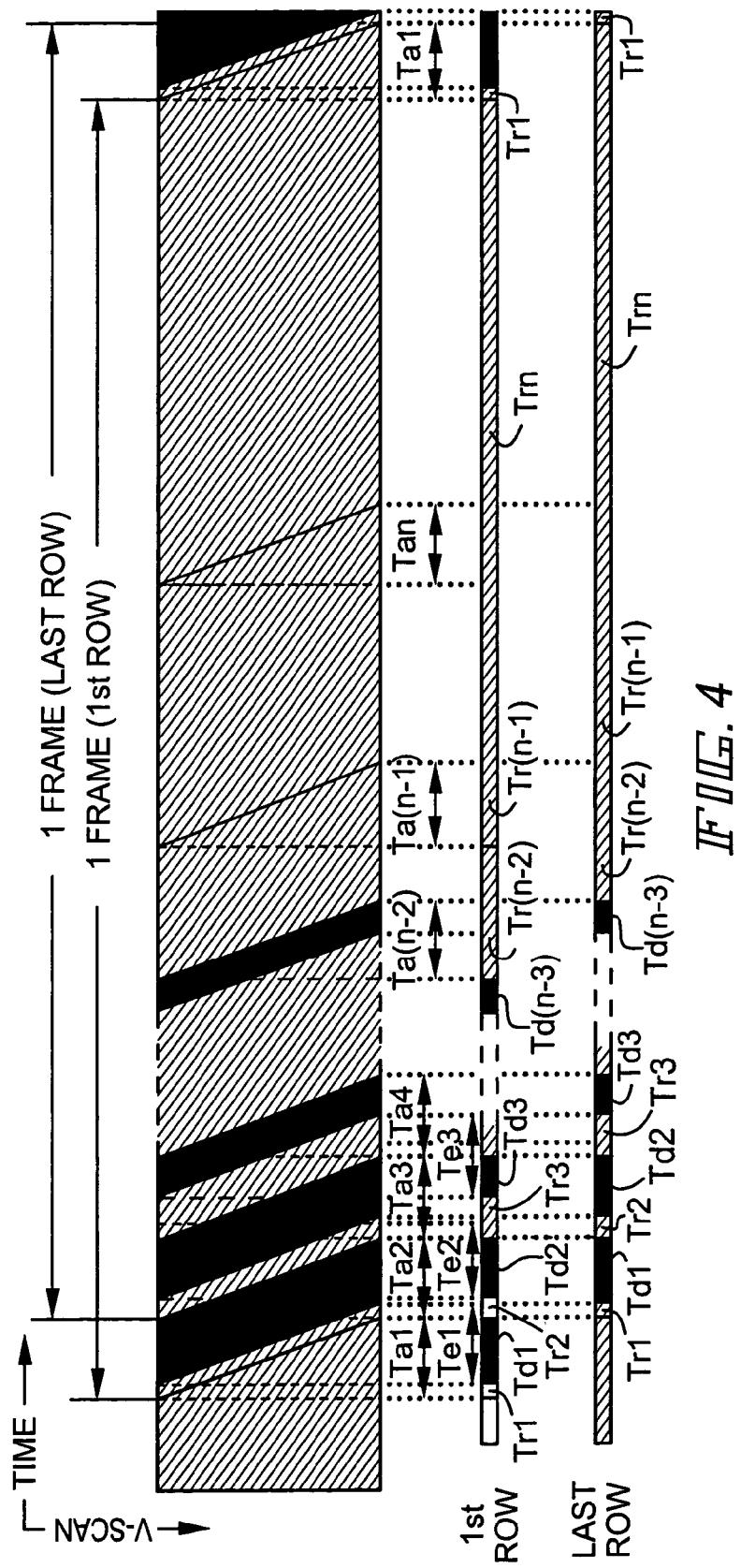
FIG. 4 show a driving method of the EL display according to the present invention.

An example of a case in which m=n-2 is shown in FIG. 4 in order to make the explanation easy to understand, but the present invention is of course not limited to this. It is possible to arbitrarily select m from 1 to n with the present invention.

After a number m[n-2] (a case in which m=n-2 is shown hereafter within the brackets) bit of the digital video signal is input to the first line of pixels, the first line of pixels is made into a display period Trm[n-2] and display is performed. The number m[n-2] bit of the digital video signal is then stored until the next bit of the digital video signal is input.

When the number (m+1)[n-1] bit of the digital video signal is next input to the first line of pixels, the number m[n-2] bit of the digital video signal stored in the pixels is replaced by the number (m+1)[n-1] bit of the digital video signal. The first line of pixels then is made into a display period Tr(m+1)[n-1], and display is performed. The number (m+1)[n-1] bit of the digital video signal is stored in the pixels until the next bit of the digital video signal is input.

The above operations are repeatedly performed until the n-th bit of the digital video signal is input to the pixels. The display periods Trm[n-2], ..., Tm are periods begin when the write in periods Tam[n-2], ..., Tan begin, and finishes the next appearing write in period begins.

When all of the display periods Tr1 to Trn are complete, one image can be displayed. The period during which one image is displayed is referred to as one frame period (F) in the present invention.

After one frame period is complete, the write in gate signal line Ga1 is once again selected in accordance with the write in gate signal. The first bit of the digital video signal is then input to the pixels, and the display period Tr1 once again begins in the first line of pixels. The above-mentioned operations are then repeated.

It is preferable to form 60 or more frame periods every second for a normal EL display device. If the number of images displayed in one second becomes less than 60, image flicker starts to become visually conspicuous.

Further, it is necessary for the total of the lengths of all of the write in periods to be shorter than one frame period in the present invention. In addition, the length of the display periods must be set so that $Tr1::Tr2::Tr3::\ldots ::Tr(n-1)::Trn = 2^0::2^1::2^2::\ldots ::2^{(n-2)}::2^{(n-1)}$. The desired gray-scale display from among $2^n$ gray scales can then be performed by combining the display periods.

The gray scale displayed in a pixel during one frame period is determined by the total of the lengths of the display periods during which the EL element of the pixel emits light during the one frame period. For example, when n=8, if the brightness for a case in which the pixel emits light during all of the display periods is taken as 100%, then a brightness of 1% can be expressed when the pixel emits light during Tr1 and Tr2. When the pixels emit light in Tr3, Tr5, and Tr8, a brightness of 60% can be expressed.

It is vital that the write in period Tam, in which the m-th bit of the digital video signal is written to the pixels, be shorter than the length of the display period Trm. It is necessary, therefore, that the value of the number of bits, m, be a value from among 1 to n, so that the write in period Tam is shorter than the length of the display period Trm.

Further, the display periods Tr1 to Trn may appear in any order. For example, it is possible for the display periods to appear as Tr3, Tr5, Tr2, . . . , follow after Tr1 during one frame period. However, it is preferable that the display periods Tr1 to Trn are in an order so as not to overlap mutually. Further, it is preferable that the erasure periods Te1 to Ten also are in an order so as not overlap mutually.

In accordance with the above structure of the present invention, even if there is some fluctuation in the $I_{DS}$-$V_{GS}$ characteristic of the EL driver TFT, fluctuation in the amount of electric current output when equal gate voltages are applied to the EL driver TFTs can be suppressed. Therefore, it becomes possible to avoid a situation, due to the fluctuation of the $I_{DS}$-$V_{GS}$ characteristic, in which the amount of light emitted from the EL element differs greatly for adjacent pixels even when signals with the same voltage are input.

Further, the first EL driver TFT and the second EL driver TFT are provided in parallel as the EL driver TFT according to the present invention. Irradiation of heat generated by the electric current flowing through the active layers of the EL driver TFT can be efficiently performed in accordance with this structure, and deterioration of the EL driver TFT can be suppressed. In addition, fluctuation in the drain current generated due to fluctuation in characteristics such as the threshold voltage and the mobility of the EL driver TFT can be suppressed.

Note that although two driver TFTs, the first EL driver TFT and the second EL driver TFT, are used as the EL driver TFT in this embodiment mode, the present invention is not limited to such. The number of TFTs used as the EL driver TFT in each pixel may be equal to or greater than two.

Non-light emitting periods during which display is not performed can be formed with the present invention. If a completely white image is displayed in an EL display device using a conventional analog driving method, then it makes the degradation of the EL layer become quick that the EL elements always emit light. Non-light emitting periods can be formed with the present invention, and therefore degradation of the EL layers can be suppressed to a certain extent.

Note that portions of the display periods and the write in periods overlap in the present invention. In other words, it is possible to make the pixels display even during the write in periods. The ratio of the total of the lengths of the display periods in one frame period (duty ratio) is not therefore determined only by the lengths of the write in periods.

Note that a structure is shown in this embodiment mode, in which a capacitor is formed in order to maintain the voltage applied to the gate electrode of the EL driver TFT, but it is also possible to omit the capacitor. If the EL driver TFT has an LDD region formed so as to overlap with the gate electrode through a gate insulating film, a parasitic capacitance, referred to generally as a gate capacitance, is formed in the overlapping region. This gate capacitance can be actively used as a capacitor in order to maintain the voltage applied to the gate electrode of the EL driver TFT.

The capacitance value of the gate capacitance changes in accordance with the surface area in which the gate electrode and the LDD region overlap, and is determined by the length of the LDD region contained in the overlapping region.

Note that the above stated structure of the present invention can be applied not only to EL display but also to devices using other electro-optical elements. Further, if high speed response liquid crystal with a response time which is equal to or less than 10 μsec is developed, it will also be possible to apply the present invention to liquid crystal displays.

Embodiments of the present invention are explained below.

[Embodiment 1]

Figure 5:
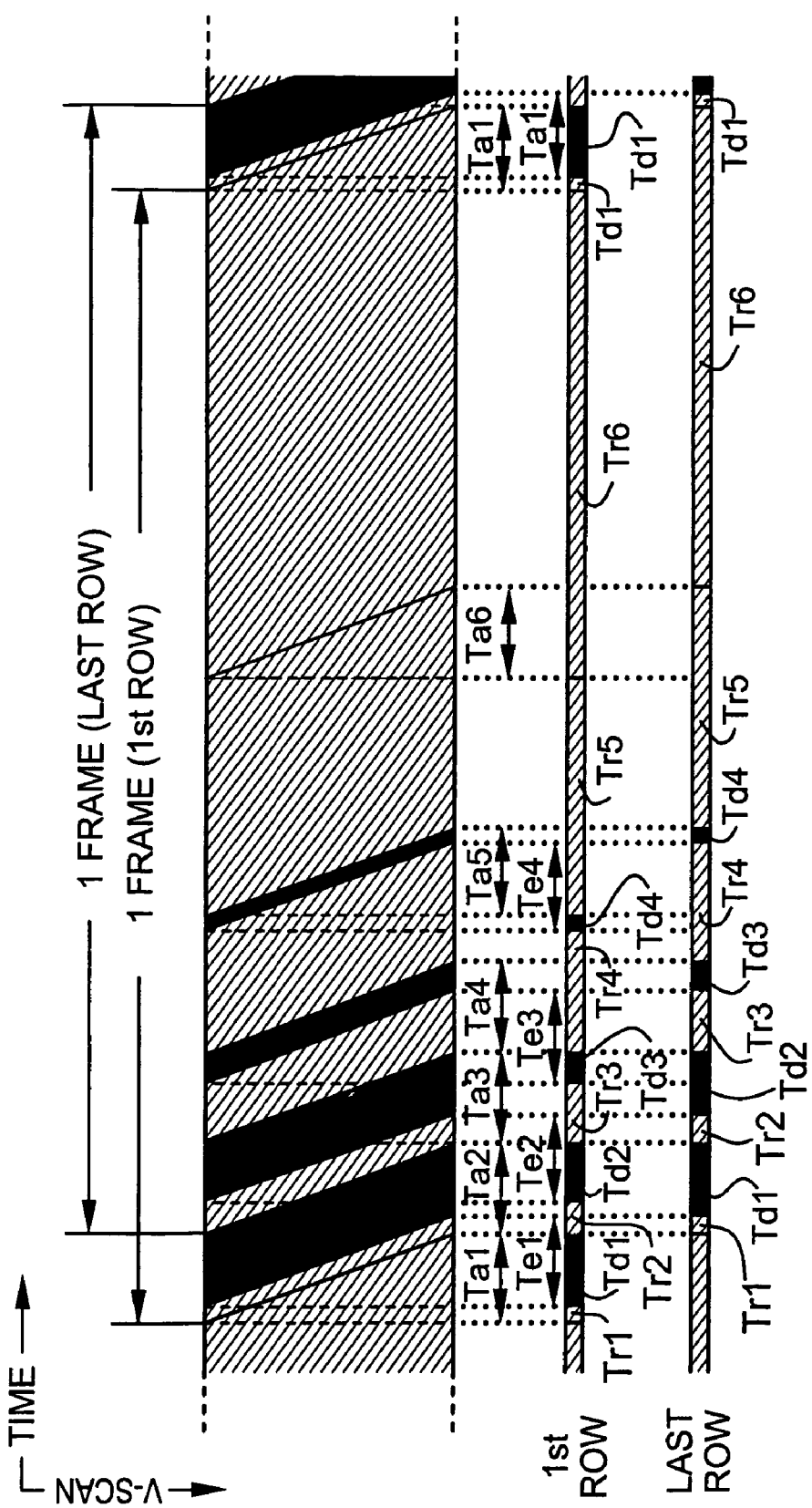
FIG. 5 show a driving method of the EL display according to the present invention.

A case of performing $2^6$ gray scale display with a 6-bit digital video signal in an EL display according to the present invention is explained in Embodiment 1 using FIG. 5. Note that the EL display of Embodiment 1 has the structure shown in FIGS. 1 to 3.

First, the write in gate signal line Ga1 is selected in accordance with a write in gate signal input to the write in gate signal line Ga1 from the write in gate signal line driver circuit 103. The switching TFTs 107, all pixels (the first line of pixels) connected to the write in gate signal line Ga1 are then made an ON state.

At the same time, the first bit of a digital video signal is input to the source signal lines S1 to Sx from the source signal line driver circuit 102, and is input to the gate electrodes of the EL driver TFTs 108 through the switching TFTs 107.

When the digital video signal has "0" information, the EL driver TFTs 108 are made an OFF state in Embodiment 1. The power source electric potential is therefore not imparted to the pixel electrode of the EL elements 110. As a result, the EL elements 110 of pixels into which the digital video signals having "0" information are input do not emit light.

Conversely, the EL driver TFTs 108 are made an ON state when the digital video signal has "1" information. The power source electric potential is therefore imparted to the pixel electrodes of the EL elements 110. As a result, the EL elements 110 of pixels into which the digital video signals having "1" information are input emit light.

The EL elements 110 perform light emission or do not preform light emission simultaneously when the digital video signal is input to the first line of pixels, becoming the display period Tr1. The timing at which the display period of each line begins have a time differences, respectively.

Next, the write in gate signal line Ga2 is selected in accordance with the write in gate signal when selection of the write in gate signal line Ga1 is completed. The switching TFTs 107, all pixels connected to the write in gate signal line Ga2 are then made an ON state, and the first bit of the digital video signal is then input to the second line of pixels from the source signal lines S1 to Sx.

All of the write in gate signal lines Ga1 to Gay are then selected, and the first bit of the digital video signal is input to all of the pixels. A period during which the first bit of the digital video signal is input to the pixels of all lines denotes the write in period Ta1.

On the other hand, before the first bit of the digital video signal is input to all the pixels, namely before the write in period Ta1 is complete, the erasure gate signal line Ge1 is selected in accordance with an erasure gate signal input from the erasure gate signal line driver circuit 104 to the erasure gate signal line Ge1, in parallel with the input of the first bit of the digital video signal to the pixels.

The erasure TFTs 109, all the pixels (the first line of pixels) connected to the erasure gate line Ge1 are then made an ON state. The power source electric potential of the power source supply lines V1 to Vx is then imparted to the gate electrodes of the EL driver TFTs 108 through the erasure TFT 109.

The EL driver TFTs 108 are made an OFF state when the power source electric potential is imparted to the gate electrodes of the driver TFTs 108. The power source electric potential consequently is not imparted to the pixel electrodes of the EL elements 110, and all the EL elements of the first line of pixels then become in a non-light emitting state. The first line of pixels do not perform display. In other words, the digital video signals, which have been stored by the gate electrodes of the EL driver TFTs 108 since the write in gate signal line Ga1 is selected in accordance with the gate signal, are thus erased by imparting the power source electric potential to the gate electrodes of the EL driver TFTs 108. The first line of pixels therefore do not perform display.

The display period Tr1 of the first line of pixels is completed at the same time when the erasure gate signal is selected, and the non-display period Td1 begins. Then, similar to the display period, the timing at which the non-display period of each line begins has a time differences, respectively.

The erasure gate signal line Ge2 is selected by the erasure gate signal when selection of the erasure gate signal line Ge1 is complete, and the erasure TFTs 109, all the pixels (the second line of pixels) connected to the erasure gate line Ge2 are made an ON state. The power source electric potential of the power source supply lines V1 to Vx is then imparted to the gate electrodes of the EL driver TFTs 108 through the erasure TFTs 109. The EL driver TFTs 108 are made an OFF state when the power source electric potential is imparted to the gate electrodes of the EL driver TFTs 108. The power source electric potential is therefore not imparted to the pixel electrodes of the EL elements 110. As a result, the EL elements of the second line of pixels are all made a non-light emitting state, and the second line of pixels do not perform display and become a non-display state.

Then all of the erasure gate signal lines Ge1 to Gey are selected, and the first bit of the digital video signal stored in all of the pixels is erased. A period during which the first bit of the digital video signal stored in all of the pixels is erased is the erasure period Te1.

On the other hand, before the first bit of the digital video signal stored in all the pixels is erased, namely before the erasure period Te1 is complete, selection of the write in gate signal line Ga1 is again performed, in parallel with the erasure of the first bit of the digital video signal in the pixels. The first line of pixels again perform display as a result, the non-display period Td1 finished, and the display period Tr2 begins.

All of the write in gate signal lines are similarly selected in order, and the second bit of the digital video signal is input to all of the pixels. A period during which the second bit of the digital video signal is input to all the pixels is referred to as the write in period Ta2.

On the other hand, before the second bit of the digital video signal pixels is input to all the pixels, namely before the write in period Ta2 is complete, selection of the erasure gate signal line Ge1 is performed, in parallel with the input of the second bit of the digital video signal to the pixels. The EL elements of the first line of pixels are thus all made a non-light emitting state, and the first line of pixels do not perform display. The display period Tr2 therefore finishes in the first line of pixels, and the non-display period Td2 begins.

All of the erasure gate signal lines Ge1 to Gey are then selected, and the second bit of the digital video signal stored in all of the pixels is erased. A period during which the second bit of the digital video signal stored in all the lines of pixels is erased is the erasure period Te2.

The above operations are repeatedly performed until the fifth bit of the digital video signal is input to the pixels, and the display periods Tr and the non-display periods Td repeatedly appear. The display period Tr1 begins when the write in period Ta1 begins, and finishes when the erasure period Te1 begins. Further, the non-display period Td1 begins when the erasure period Te1 begins, and finishes when the next appearing write in period (the write in period Ta2 in Embodiment 1) begins. The display periods Tr2, Tr3, and Tr4, and the non-display periods Td2, Td3, and Td4 are determined by the write in periods Ta1, Ta2, . . . , Ta5, and the erasure periods Te1, Te2, . . . , Te4, respectively, similar to the display period Tr1 and the non-display period Td1.

The display period Tr5 begins and the first line of pixels perform display when the fifth bit of the digital video signal is input to the first line of pixels. The fifth bit of the digital video signal is then stored in the pixels until the next bit of the digital video signal is input.

The fifth bit of the digital video signal stored in the pixels is replaced by the sixth bit of the digital video signal when the sixth bit of the digital video signal is then input to the first line of pixels. The display period Tr6 thus begins in the first line of pixels, and display is performed. The sixth bit of the digital video signal is stored in the pixels until the first bit of the digital video signal of the next frame period is input.

The display period Tr6 is complete when the first bit of the digital video signal of the next frame period is input to the pixel, and the frame period is completed at the same time. One image can be displayed when all of the display periods Tr1 to Tr6 are complete. The above operations are then repeated.

The display period Tr5 begins when the write in period Ta5 begins, and finishes when the write in period Ta6 begins. The display periods Tr6 begins when the write in period Ta6 begins, and finishes when the write in period Ta1 of the next frame begins.

The lengths of the display periods Tr are set so that Tr1::Tr2: . . . Tr5:Tr6=$2^0$:$2^1$:$2^2$: . . . $2^4$:$2^5$. The desired gray scale display can be performed from among the $2^6$ gray scales by combining the display periods.

The gray scale displayed by a pixel during one frame period can be set by finding the total of the lengths of the display periods during which the EL element of the pixel emits light during the one frame period. For example, if the brightness for a case in which the pixel emits light during all of the display periods is taken as 100%, then a brightness of 5% can be expressed for a case in which the pixel emit lights during Tr1 and Tr2. If the pixel emits light in Tr3 and Tr5, a brightness of 32% can be expressed.

It is vital that the write in period Ta5, during which the fifth bit of the digital video signal is written to the pixels, be shorter than the length of the display period Tr5.

Further, the display periods Tr1 to Tr6 may appear in any order. For example, it is possible for the display periods to appear Tr3, Tr5, Tr2, . . . , following after Tr1 during one frame period. However, it is preferable that the erasure periods Te1 to Te6 have an order so that they do not mutually overlap. Further, it is also preferable that the display periods Tr1 to Tr6 have an order so that they do not mutually overlap.

In accordance with the above structure of the present invention, even if there is some fluctuation in the $I_{DS}$-$V_{GS}$ characteristic of the EL driver TFT, fluctuation in the amount of electric current output when equal gate voltages are applied to the EL driver TFTs can be suppressed. Therefore, it becomes possible to avoid a situation in which, due to the fluctuation of the $I_{DS}$-$V_{GS}$ characteristic, the amount of light emitted from the EL element differs greatly for adjacent pixels when signals of the same voltage are input.

Non-light emitting periods during which display is not performed can be formed according to the present invention If a completely white image is displayed in an EL display device using a conventional analog driving method, the EL elements always emit light and degradation of the EL layers is made quicker. Non-light emitting periods can be formed with the present invention, and therefore degradation of the EL layers can be suppressed to a certain extent.

[Embodiment 2]

The order of appearance of the display periods Tr1 to Tr6 in a driving method of the present invention corresponding to a 6-bit digital video signal is explained in Embodiment 2.

Figure 6:
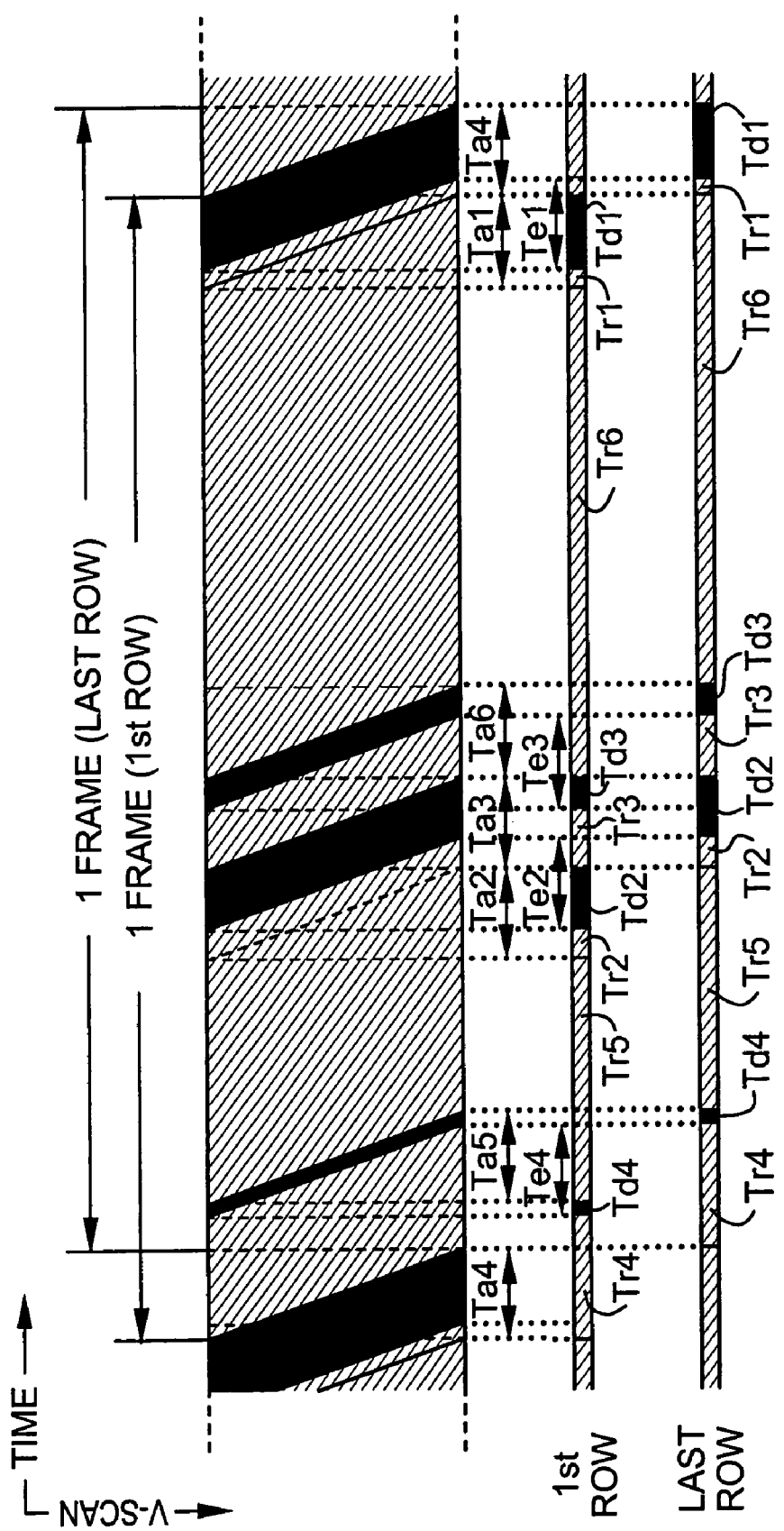
FIG. 6 show a driving method of the EL display according to the present invention.

FIG. 6 shows a timing chart of the driving method of Embodiment 2. Embodiment 1 may be referred to for detailed drive of the pixels, and therefore the explanation is omitted here. The longest non-display period (Td1 in Embodiment 2) within one frame period is provided at the end of the one frame period in the driving method of Embodiment 2. It appears to human eyes that there is a separation between the non-display period Td1 and the first display period (Tr4 in Embodiment 2) of the next frame period in accordance with the above structure. Unevenness of display, which occurs due to adjoining display periods for emitting light between adjacent frame periods, can thus be made more difficult for human eyes to recognize.

Note that, although a case for a 6-bit digital video signal is explained in Embodiment 2, the present invention is not limited thereto. It is possible to implement Embodiment 2 without limiting the number of bits of the digital video signal.

[Embodiment 3]

Figure 7:
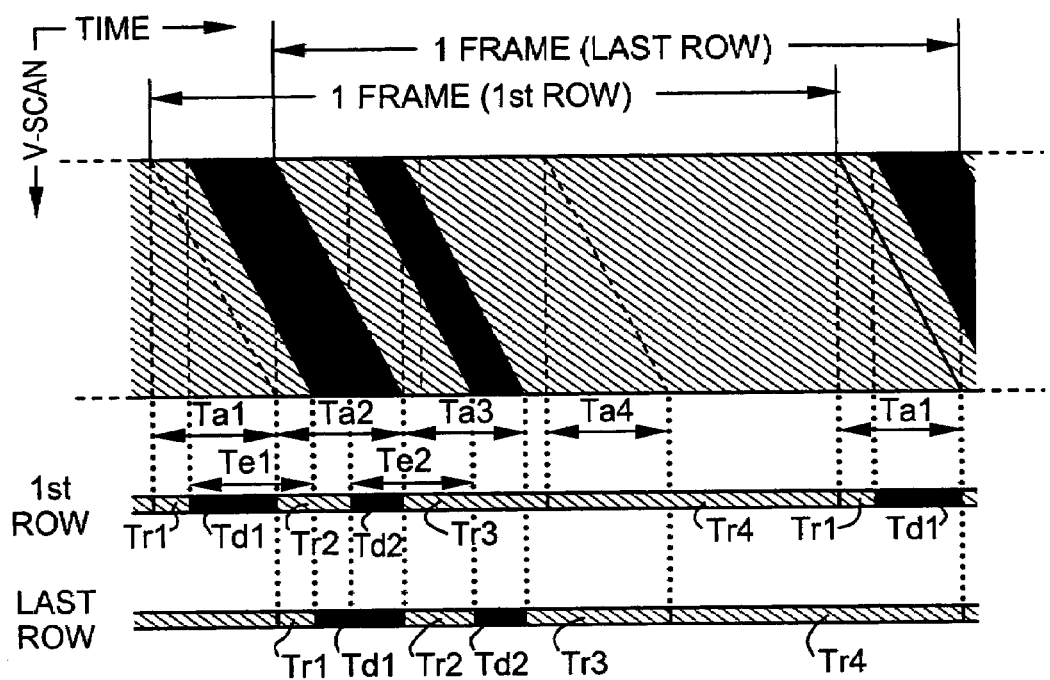
FIG. 7 show a driving method of the EL display according to the present invention.

A case of performing $2^4$ bit gray scale display with a 4-bit digital video signal in an EL display of the present invention is explained in Embodiment 3 using FIG. 7. Note that the EL display of Embodiment 3 has the structure shown in FIGS. 1 to 3.

First, the write in gate signal line Ga1 is selected in accordance with a write in gate signal input to the write in gate signal line Ga1 from the write in gate signal line driver circuit 103. The switching TFTs 107, all pixels (the first line of pixels) connected to the write in gate signal line Ga1 are then made an ON state.

At the same time, the first bit of a digital video signal is input to the source signal lines S1 to Sx from the source signal line driver circuit 102. The digital video signal is input to the gate electrodes of the EL driver TFTs 108 through the switching TFTs 107.

When the digital video signal has "0" information, the EL driver TFTs 108 are made an OFF state in Embodiment 3. The power source electric potential is therefore not imparted to the pixel electrode of the EL elements 110. As a result, the EL elements 110 of pixels into which the digital video signals having "0" information are input do not emit light.

Conversely, the EL driver TFTs 108 are made an ON state when a digital video signal has "1". The power source electric potential is therefore imparted to the pixel electrodes of the EL elements 110. As a result, the EL elements 110 of pixels into which the digital video signals having "1" information are input emit light.

The EL elements 110 perform light emission or do not preform light emission at the same time when the digital video signal is input to the first line of pixels, becoming the display period Tr1. The timing at which the display period of each line begins have time differences, respectively.

Next, the write in gate signal line Ga2 is selected in accordance with the write in gate signal when selection of the write in gate signal line Ga1 is completed. The switching TFTs 107, all pixels connected to the write in gate signal line Ga2 are then made an ON state, and the first bit of the digital video signal is then input to the second line of pixels from the source signal lines S1 to Sx.

All of the write in gate signal lines Ga1 to Gay are then selected, and the first bit of the digital video signal is input to all the pixels. A period during the first bit of the digital video signal is input to all the pixels denotes the write in period Ta1.

On the other hand, before the first bit of the digital video signal is input to all the pixels, namely before the write in period Ta1 is complete, the erasure gate signal line Ge1 is selected in accordance with an erasure gate signal input from the erasure gate signal line driver circuit 104 to the erasure gate signal line Ge1, in parallel with the input of the first bit of the digital video signal to the pixels.

The erasure TFT 109, all the pixels (the first line of pixels) connected to the erasure gate signal line Ge1 are made an ON state. The power source electric potential of the power source supply lines V1 to Vx is then imparted to the gate electrodes of the EL driver TFTs 108 through the erasure TFT 109.

The EL driver TFTs 108 are made an OFF state when the power source electric potential is imparted to the gate electrodes of the EL driver TFT 108. The power source electric potential consequently is not imparted to the pixel electrodes of the EL elements 110, all of the EL elements of the first line of pixels then become in a non-light emitting state, and the first line of pixels do not perform display. In other words, the digital video signals, which have been stored by the gate electrodes of the EL driver TFTs 108 since the write in gate signal line Ga1 is selected in accordance with the write in gate signal, are thus erased by imparting the power source electric potential to the gate electrodes of the EL driver TFTs 108. The first line of pixels therefore do not perform display.

The display period Tr1 for the first line of pixels is completed at the same time when the erasure gate signal line Ge1 is selected, and the non-display period Td1 begins. The timing at which the non-display period Td of each line begins, similar to the display period, has a time difference, respectively.

The erasure gate signal line Ge2 is selected by the erasure gate signal when selection of the erasure gate signal line Ge1 is complete, and the erasure TFTs 109, all the pixels (the second line of pixels) connected to the erasure gate line Ge2 are made an ON state. The power source electric potential of the power source supply lines V1 to Vx is then imparted to the gate electrodes of the EL driver TFTs 108 through the erasure TFTs 109. The EL driver TFTs 108 are made an OFF state when the power source electric potential is imparted to the gate electrodes of the EL driver TFTs 108. The power source electric potential is therefore not imparted to the pixel electrodes of the EL elements 110. As a result, the EL elements of the second line of pixels are all made in a non-light emitting state, the second line of pixels do not perform display, becoming a non-display state.

Then all of the erasure gate signal lines Ge1 to Gey are selected, and the first bit of the digital video signal stored in all of the pixels is erased. A period during which the first bit of the digital video signal stored in all of the pixels is erased is the erasure period Te1.

On the other hand, before the first bit of the digital video signal stored in all the pixels is erased, namely before the erasure period Te1 is complete, selection of the write in gate signal line Ga1 is again performed, in parallel with the erasure of the first bit of the digital video signal in the pixels. The first line of pixels again perform display as a result, the non-display period Td1 finishes, and the display period Tr2 begins.

All of the write in gate signal lines are similarly selected in order, and the second bit of the digital video signal is input to all of the pixels. A period during which the second bit of the digital video signal is input to all the pixels is referred to as the write in period Ta2.

On the other hand, before the second bit of the digital video signal is input to all the pixels, namely before the write in period Ta2 is complete, selection of the erasure gate signal line Ge1 is performed in parallel with the write in of the second bit of the digital video signal to the pixels. The EL elements of the first line of pixels are thus all made in a non-light emitting state, and the first line of pixels do not perform display. The display period Tr2 therefore finishes in the first line of pixels, and the non-display period Td2 begins.

All of the erasure gate signal lines Ge1 to Gey are then selected, and the second bit of the digital video signal stored in all of the pixels is erased. A period during which the second bit of the digital video signal stored in all the pixels is erased is the erasure period Te2.

The display period Tr1 begins when the write in period Ta1 begins, and finishes when the erasure period Te1 begins. Further, the non-display period Td1 begins when the erasure period Te1 begins, and finishes the next write in period (the write in period Ta2 in Embodiment 3) begins. The display period Tr2 begins when the write in period Ta2 begins, and finishes the erasure period Te2 begins. Further, the non-display period Td2 begins when the erasure period Te2 begins, and finishes the next appearing write in period (the write in period Ta3 in Embodiment 3) begins.

The display period Tr3 begins and the first line of pixels perform display when the third bit of the digital video signal is input to the first line of pixels. The third bit of the digital video signal is then stored in the pixels until the next bit of the digital video signal is input.

The third bit of the digital video signal stored in the pixels is replaced by the fourth bit of the digital video signal when the fourth bit of the digital video signal is then input to the first line of pixels. The display period Tr4 thus begins in the first line of pixels, and display is performed. The fourth bit of the digital video signal is stored by the pixels until the first bit of the digital video signal of the next frame period is input.

The display period Tr4 is complete when the first bit of the digital video signal of the next frame period is input, and the frame period completes at the same time. One image can be displayed when all of the display periods Tr1 to Tr4 are complete. The above operations are then repeated.

The display period Tr3 is begins when the write in period Ta3 begins, and finishes the write in period Ta4 begins. The display periods Tr4 begins when the write in period Ta4 begins, and finishes the write in period Ta1 of the next frame begins.

The lengths of the display periods Tr are set so that Tr1:Tr2:Tr3:Tr4=$2^0:2^1:2^2:2^4$. The desired gray scale display can be performed from among the $2^4$ gray scales by combining the display periods.

The gray scale displayed by a pixel during one frame period can be set by finding the total of the lengths of the display periods during which the EL element of the pixel emits light during the one frame period. For example, if the brightness for a case in which the pixel emits light during all of the display periods is taken as 100%, then a brightness of 20% can be expressed for a case in which the pixel emits light during Tr1 and Tr2. If the pixel emits light only in Tr3, a brightness of 27% can be expressed.

It is vital that the write in period Ta3, in which the third bit of the digital video signal is written into the pixels, be shorter than the length of the display period Tr3.

Further, the display periods Tr1 to Tr4 may appear in any order. For example, it is possible for the display periods to appear in an order of Tr3, Tr4, and Tr2 following after Tr1 within one frame period. However, it is preferable that the erasure periods Te1 to Te4 have an order so that they do not mutually overlap. Further, it is also preferable that the display periods Tr1 to Tr4 have an order so that they do not mutually overlap.

In accordance with the above structure of the present invention, even if there is some fluctuation in the $I_{DS}$-$V_{GS}$ characteristic of the EL driver TFT, fluctuation in the amount of electric current output when an equal gate voltage is applied to the EL driver TFTs can be suppressed. Therefore, it becomes possible to avoid a situation in which, due to the fluctuation in the $I_{DS}$-$V_{GS}$ characteristic, the amount of light emitted from the EL element differs greatly for adjacent pixels when signals having the same voltage are input.

Non-light emitting periods during which display is not performed can be formed with the present invention. If a completely white image is displayed in an EL display device using a conventional analog driving method, then the EL elements always emit light and degradation of the EL layers is made quicker. Non-light emitting periods can be formed with the present invention, and therefore degradation of the EL layers can be suppressed to a certain extent.

Note that it is possible to implement Embodiment 3 in combination with Embodiment 2.

[Embodiment 4]

A top surface diagram (FIG. 8) of the pixel of the EL display according to the present invention shown in FIG. 3 is explained in Embodiment 4. Common reference numerals are used in FIG. 3 and FIG. 8, and therefore both figures may be mutually referenced.

Figure 8:
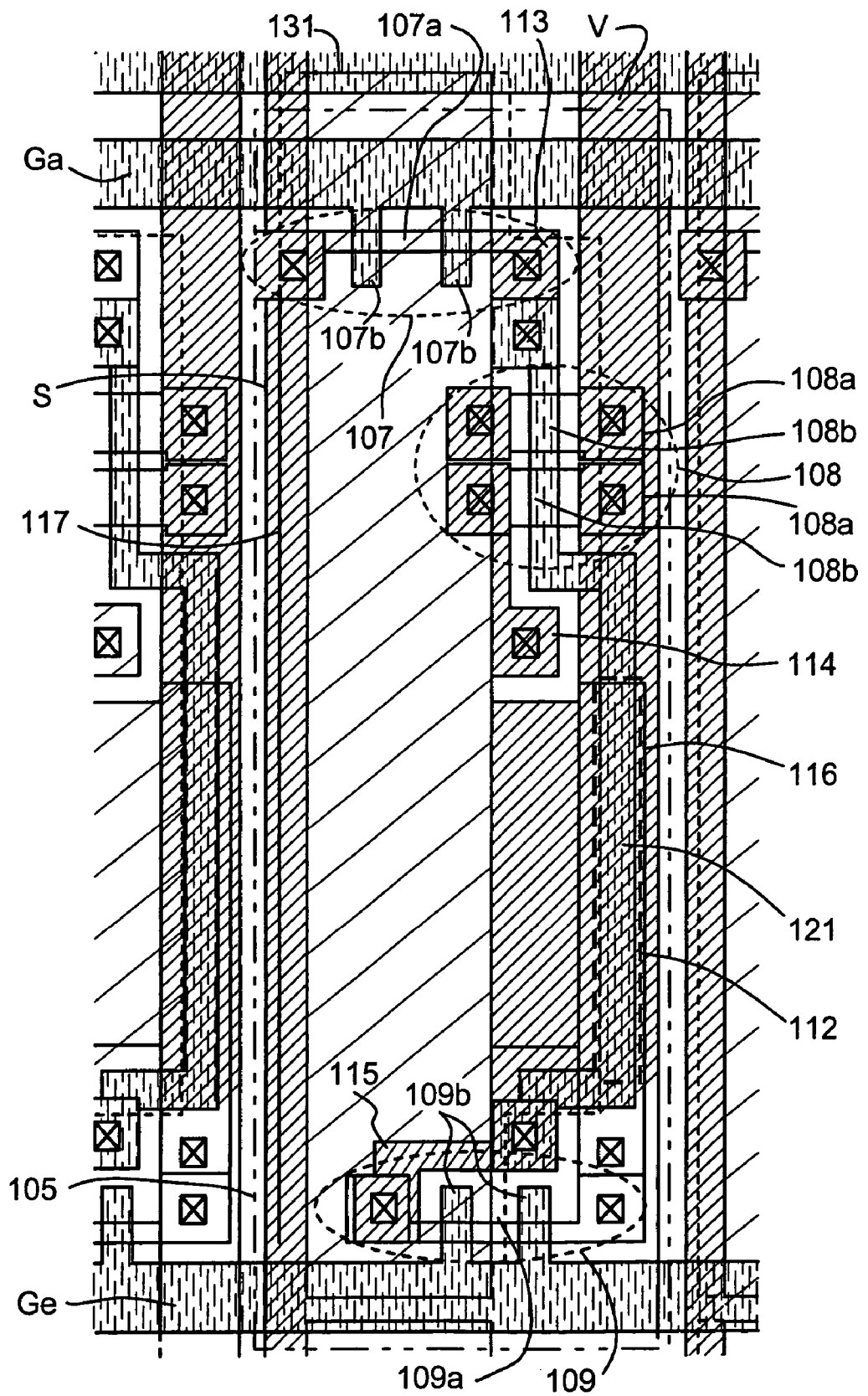
FIG. 8 is a top view of a pixel of the EL display according to the present invention.

In FIG. 8, the region 105, which has a source signal line S, an power source supply line V, a write in gate signal line Ga, and an erasure gate signal line Ge, is a pixel. The pixel 105 has the switching TFT 107, the EL driver TFT 108, and the erasure TFT 109. The EL driver TFT 108 has the first and the second EL driver TFT, and the first and the second EL driver TFTs are connected in parallel.

The switching TFT 107 has an active layer 107a, and a gate electrode 107b which is a portion of the write in gate signal line Ga. The EL driver TFT 108 has an active layer 108a, and a gate electrode 108b which is a portion of a gate wiring 121. The erasure TFT 109 has an active layer 109a, and a gate electrode 109b which is a portion of the write in gate signal line Ge.

One of a source region and a drain region of the active layer 107a of the switching TFT 107 is connected to the source signal line, and the other of the source region and the drain region is connected to the gate wiring 121 through a connection wiring 113. Note that the connection wiring 113 is referred to as a source wiring, or as a drain wiring, depending on the electric potential of a signal input to source signal line (S).

One of a source region and a drain region of the active layer 109a of the erasure TFT 109 is connected to the power source supply line, and the other of the source region and the drain region is connected to the gate wiring 121 through a connection wiring 115. Note that the connection wiring 115 is referred to as a source wiring, or as a drain wiring, depending on the power source electric potential of the power source supply line (V).

A source region and a drain region of the active layer 108a of the EL driver TFT 108 are connected to the power source supply line (V) and to a drain wiring 114, respectively. The drain wiring 114 is connected to a pixel electrode 117.

A capacitor wiring 116 is formed of a semiconductor film. The capacitor 112 is formed by the capacitor wiring 116, an insulating film (not shown in the figures) which is the same layer as the gate insulating film and the gate wiring 121. Further, it is also possible to use a capacitance formed by the gate wiring 121, a layer (not shown in the figures) which is the same as the first interlayer insulating film, and the power source supply line V.

Note that a bank, provided with an opening 131 by etching an organic resin film, is formed on the pixel electrode 117. The EL layers and the opposing electrode are then laminated in order on the pixel electrode 117, although not shown in the figure. The pixel electrode 105 and the EL layer contact in the open portion 131 of the bank, and the EL layer emits light only in a portion sandwiched between the contacting opposing electrode and pixel electrode.

Note that the top surface diagram of the pixel portion of the EL display according to the present invention is not limited to the structure shown in FIG. 8.

It is possible to implement Embodiment 4 in combination with Embodiments 1 to 3.

[Embodiment 5]

Figure 9:
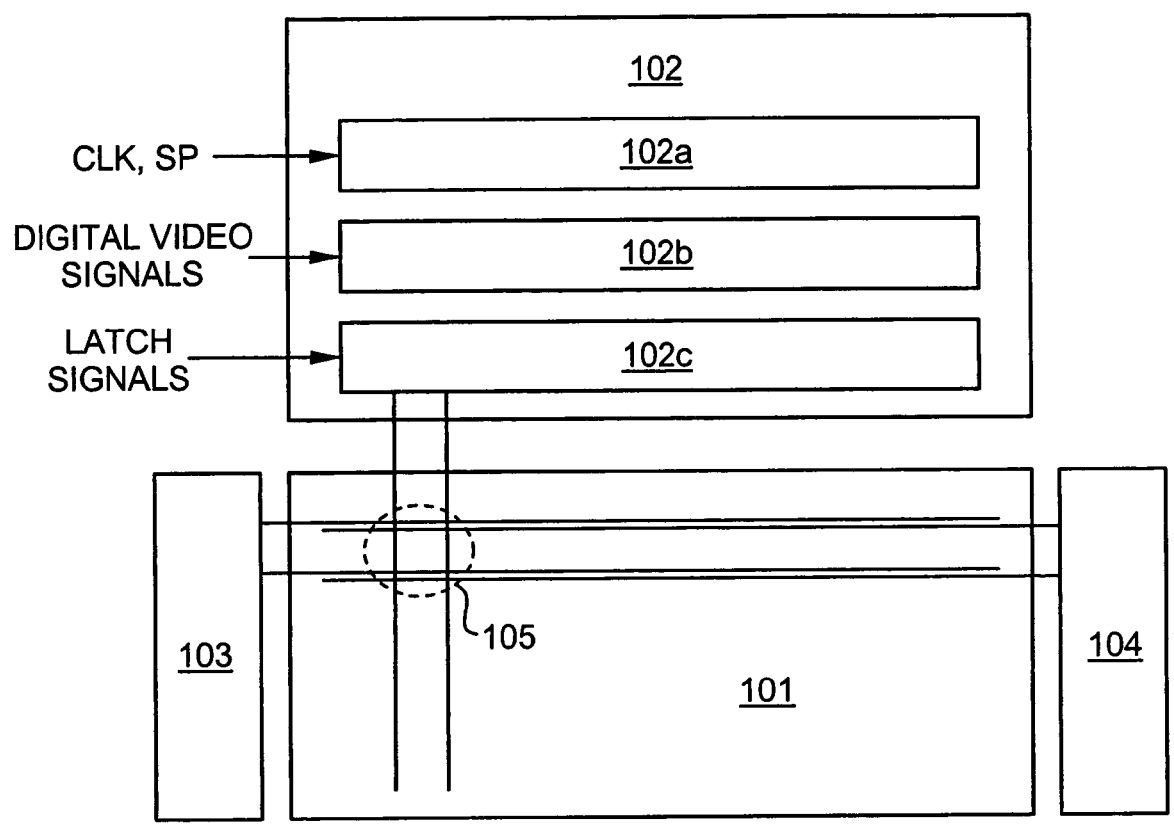
FIG. 9 is a block diagram showing a structure of a driver circuit of the EL display according to the present invention.

A detailed structure of the driver circuit of the EL display according to the present invention shown in FIG. 1 is explained in Embodiment 5 using FIG. 9.

The source signal line driver 102 has a shift register 102a, a latch (A) (the first latch) 102b, and a latch (B) (the second latch) 102c basically.

A clock signal CLK and a start pulse SP are input to the shift register 102a in the source signal line driver circuit 102. The shift register 102a generates timing signals in order based upon the clock signal CLK and the start pulse SP, and supplies the timing signals one after another to the latch (A) 102b.

Note that, although not shown in FIG. 9, the timing signals output from the shift register circuit 102a may be buffered and amplified by a circuit such as a buffer (not shown in the figure) and then input to the latch (A) 102b which is a downstream circuit. The load capacitance (parasitic capacitance) of wirings to which the timing signalss are supplied is large because many circuits or elements are connected to the wirings. The buffer is formed in order to prevent bluntness in the rise and fall of the timing signal, generated due to the large load capacitance.

The latch (A) 102b has a plurality of latch stages for processing n-bit digital video signals. The latch (A) 102b takes and maintains the n-bit digital video signal input from outside of the source signal line driver circuit 102, when the timing signal is input.

Note that the digital video signal may be input in order to the plurality of latch stages of the latch (A) 102b when the digital video signal are taken to the latch (A) 102b. However, the present invention is not limited to this structure. The plurality of latch stages of the latch (A) 102b may be divided into some groups, and the digital video signal may be input to the respective groups at the same time in parallel, performing partitioned driving. For example, this is referred to as partitioned driving with 4 divisions, which is the nimber of division, when the latch is divided into groups every four stages.

The period during which the digital video signal is completely written into all of the latch stages of the latch (A) 102b is referred to as a line period. Namely, within the latch (A) 102b, the line period begins when it is started that the digital video signal is written into the leftmost latch stage, and finishes when it is completed that the digital video signal is written into the rightmost latch stage. In practice, the line period may include a horizontal blanking period in addition to the above line period.

A latch signal is supplied to the latch (B) 102c when one line period is complete. The digital video signal written into and stored in the latch (A) 102b is sent all at once at this instant to the latch (B) 102c, is written into all of the latch stages of the latch (B) 102c, and is stored.

It is again performed again to write the digital video signal input from the outside of the source signal line driver circuit 102 into the latch (A) 102b in order in accordance with the timing signal from the shift register 102a after sending the digital video signal to the latch (B) 102c.

The digital video signal written into and stored in the latch (B) 102c is input to source signal lines during the second one line period.

On the other hand, each of the write in gate signal line driver circuit 103 and the erasure gate signal line driver circuit 104 has a shift register and a buffer (both not shown in the figure). Further, the write in gate signal line driver circuit 103 and the erasure gate signal line driver circuit 104 may also have a level shifter in addition to the shift register and the buffer, depending upon the circumstances.

A timing signal from the shift register (not shown in the figure) is supplied to the buffer (not shown in the figure), and is supplied to the corresponding gate signal line (also referred to as a scanning line), in the write in gate signal line driver circuit 103 and the erasure gate signal line driver circuit 104. The gate electrodes of the pixel TFTs for one line period are connected to the gate signal line, and the pixel TFTs for the line period must be made an ON state simultaneously. A circuit which is capable of flowing a large amount of electric current is therefore used for the buffer.

Note that it is possible to implement Embodiment 5 in combination with Embodiments 1 to 4.

[Embodiment 6]

In Embodiment 6, a method of forming a TFT of a pixel portion of an EL display and a TFT of a driver circuit portion (such as a source signal line driver circuit, a write in gate signal line driver circuit and an erasure gate signal line driver circuit) formed in the periphery of the pixel portion at the same time is explained. Note that, a CMOS circuit which is a fundamental unit, is illustrated as the driver circuit in order to simplify the explanation. Further, the erasure TFT can be fabricated with reference to a method of fabricating a switching TFT or an EL driver TFT, therefore, an explanation will be omitted. With regard to the EL driver TFT, a first EL driver TFT is only described, however, a second EL driver TFT can be fabricated in the same manner as that of the first EL driver TFT.

First, as shown in FIG. 10A, a base film 501 is formed to a thickness of 300 nm on a glass substrate 500. A silicon oxynitride film is laminated as the base film 501 in Embodiment 6. At this point, it is appropriate to set the nitrogen concentration to between 10 and 25 wt % in the film contacting the glass substrate 500. In addition, it is effective that the base film 501 has a thermal radiation effect, and a DLC (diamond-like carbon) film may also be provided.

Next, an amorphous silicon film (not shown in the figure) is formed with a thickness of 50 nm on the base film 501 by a known deposition method. Note that it is not necessary to limit to the amorphous silicon film, and a semiconductor film containing an amorphous structure (including a microcrystalline semiconductor film) may be used. In addition, a compound semiconductor film having an amorphous structure, such as an amorphous silicon germanium film, may also be used. Further, the film thickness may be made from 20 to 100 nm.

The amorphous silicon film is then crystallized by a known technique, forming a crystalline silicon film (also referred to as a polycrystalline silicon film or a polysilicon film) 502. Thermal crystallization using an electric furnace, laser annealing crystallization using a laser light, and lamp annealing crystallization using an infrared light as known crystallization methods. Crystallization is performed in Embodiment 6 using an excimer laser light, which uses XeCl gas.

Note that pulse emission excimer laser light formed into a linear shape is used in Embodiment 6, but a rectangular shape may also be used. Continuous emission type argon laser light and continuous emission type excimer laser light can also be used.

In this embodiment, although the crystalline silicon film is used as the active layer of the TFT, it is also possible to use an amorphous silicon film as the active layer.

Note that it is effective to form the active layer of the switching TFT, in which there is a necessity to reduce the off current, by the amorphous silicon film, and to form the active layer of the EL driver TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 10B, a protective film 503 made of a silicon oxide film is formed to a thickness of 130 nm on the crystalline silicon film 502. This thickness may be selected within the range of 100 to 200 nm (preferably between 130 and 170 nm). Furthermore, another films such as insulating films containing silicon may also be used. The protective film 503 is formed so that the crystalline silicon film is not directly exposed to plasma during addition of an impurity, and so that it is possible to have delicate concentration control of the impurity.

Resist masks 504a and 504b are then formed on the protective film 503, and an impurity element, which imparts n-type conductivity (hereafter referred to as an n-type impurity element), is added through the protective film 503. Note that elements residing in periodic table group 15 are generally used as the n-type impurity element, and typically phosphorous or arsenic can be used. Note that a plasma doping method is used, in which phosphine ($PH_3$) is plasma-excited without separation of mass, and phosphorous is added at a concentration of $1 \times 10^{18}$ atoms/$cm^3$ in Embodiment 6. An ion implantation method, in which separation of mass is performed, may also be used, of course.

The dose amount is regulated such that the n-type impurity element is contained in n-type impurity regions (b) 505 thus formed by this process, at a concentration of $2 \times 10^{16}$ to $5 \times 10^{19}$ atoms/$cm^3$ (typically between $5 \times 10^{17}$ and $5 \times 10^{18}$ atoms/$cm^3$).

Next, as shown in FIG. 10C, the protective film 503 and the resist masks 504a and 504b are removed, and an activation of the added n-type impurity elements is performed. A known technique of activation may be used as the means of activation, but activation is done in Embodiment 6 by irradiation of excimer laser light (laser annealing). Of course, both of a pulse emission excimer laser and a continuous emission excimer laser may be used, and it is not necessary to place any limits on the use of excimer laser light. Since an object is activation of the added impurity element, it is preferable that irradiation is performed at an energy level at which the crystalline silicon film does not melt. Note that the laser light may also be irradiated with the protective film 503 in place.

The activation of impurity elements by heat treatment (furnace annealing) may also be performed along with activation of the impurity element by laser light. When activation is performed by heat treatment, considering the heat resistance of the substrate, it is good to perform heat treatment at about 450 to 550° C.

A boundary portion (connecting portion) with end portions of the n-type impurity regions (b) 505, namely regions in which the n-type impurity element is not added, on the periphery of the n-type impurity regions (b) 505 is delineated by this process. This means that, at the point when the TFTs are later completed, extremely good connecting portion can be formed between LDD regions and channel forming regions.

Unnecessary portions of the crystalline silicon film are removed next, as shown in FIG. 10D, and island-shape semiconductor films (hereinafter referred to as active layers) 506 to 509 are formed.

Then, as shown in FIG. 10E, a gate insulating film 510 is formed, covering the active layers 506 to 509. An insulating film containing silicon with a thickness of 10 to 200 nm, preferably between 50 and 150 nm, may be used as the gate insulating film 510. A single layer structure or a lamination structure may be used. A 110 nm thick silicon oxynitride film is used in Embodiment 6.

Thereafter, a conductive film having a thickness of 200 to 400 nm is formed and patterned to form gate electrodes 511 to 515. Note that, in Embodiment 6, the gate electrodes and wirings (hereinafter referred to as gate wirings) electrically connected to the gate electrodes for providing conductive paths are formed of the different materials. More specifically, the gate wirings are made of a material having a lower resistivity than the gate electrodes. This is because a material enabling fine processing is used for the gate electrodes, while the gate wirings are formed of a material that can provide a smaller wiring resistance but is not suitable for fine processing. Of course, the gate electrode and the gate wiring may be formed of same materials.

Although the gate electrode can be made of a single-layered conductive film, it is preferable to form a lamination film with two layers or three layers, if necessary. Any known conductive films can be used for the gate electrodes. Note that, as mentioned above, a material enabling fine processing, specifically a material enabling patterning into a line width of 2 μm or less, is preferable for the gate electrodes.

Typically, it is possible to use a film made of an element selected from the group consisting of tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy or Mo—Ta alloy), or a silicide film of the above element (typically a tungsten silicide film or titanium silicide film). Of course, the films may be used as a single layer or a laminate layer.

In Embodiment 6, a laminate film of a tungsten nitride (WN) film having a thickness of 30 nm and a tungsten (W) film having a thickness of 370 nm is used. This may be formed by sputtering. When an inert gas such as Xe or Ne is added as a sputtering gas, film peeling due to stress can be prevented.

The gate electrode 512 is formed at this time so as to overlap a portion of the n-type impurity regions (b) 505 through the gate insulating film 510. This overlapping portion later becomes an LDD region overlapping the gate electrode. (FIG. 10E)

Figure 11A:
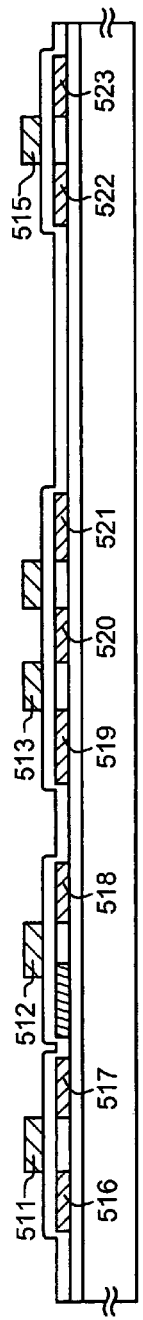
FIGS. 11A to 11D show a manufacture process of the EL display according to the present invention.

Next, an n-type impurity element (phosphorous is used in Embodiment 6) is added in a self-aligning manner with the gate electrodes 511 to 515 as masks, as shown in FIG. 11A. The addition is regulated such that phosphorous is added to n-type impurity regions (c) 516 to 523 thus formed at a concentration of 1/10 to 1/2 that of the n-type impurity regions (b) 505 (typically between 1/4 and 1/3). Specifically, a concentration of $1 \times 10^{16}$ to $5 \times 10^{18}$ atoms/cm$^3$ (typically $3 \times 10^{17}$ to $3 \times 10^{18}$ atoms/cm$^3$) is preferable.

Figure 11B:
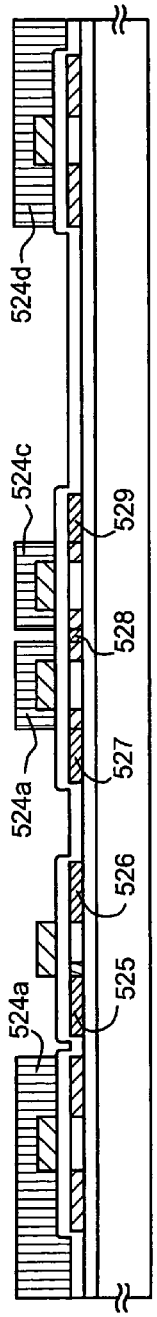

Resist masks 524a to 524d are formed next, with a shape covering the gate electrodes 511, 513 to 515, as shown in FIG. 11B, and an n-type impurity element (phosphorous is used in Embodiment 6) is added, forming impurity regions (a) 525 to 529 containing phosphorous at high concentration. Ion doping using phosphine (PH$_3$) is also performed here, and the phosphorous concentration of these regions is regulated so as to be set to from $1 \times 10^{20}$ to $1 \times 10^{21}$ atoms/cm$^3$ (typically between $2 \times 10^{20}$ and $5 \times 10^{21}$ atoms/cm$^3$).

A source region or a drain region of the n-channel TFT is formed by this process, and in a switching TFT, a portion of the n-type impurity regions (c) 519 to 521 formed by the process of FIG. 11A is remained. These remaining regions correspond to LDD regions of the switching TFT.

Figure 11C:
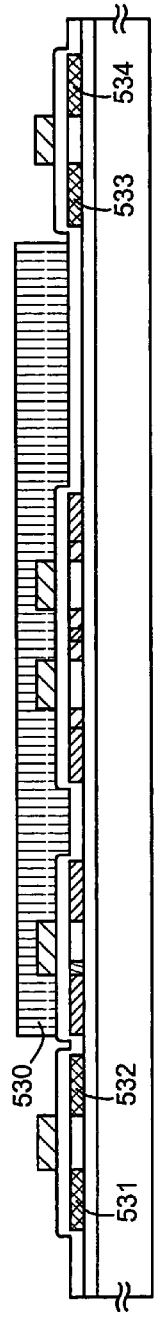

Next, as shown in FIG. 11C, the resist masks 524a to 524d are removed, and new resist mask 530 is formed. A p-type impurity element (boron is used in Embodiment 6) is then added, forming p-type impurity regions 531 and 534 containing boron at high concentration. Boron is added here at a concentration of $3 \times 10^{20}$ to $3 \times 10^{21}$ atoms/cm$^3$ (typically between $5 \times 10^{20}$ and $1 \times 10^{21}$ atoms/cm$^3$) by ion doping using diborane (B$_2$H$_6$).

Note that phosphorous has already been added to the p-type impurity regions 531 to 534 at a concentration of $1 \times 10^{20}$ to $1 \times 10^{21}$ atoms/cm$^3$, but boron is added here at a concentration of at least 3 times or more that of the phosphorous. Therefore, the n-type impurity regions already formed completely invert to p-type, and function as p-type impurity regions.

Next, after removing the resist mask 530, the n-type or p-type impurity elements added to the active layer at respective concentrations are activated. Furnace annealing, laser annealing or lamp annealing can be used as a means of activation. In Embodiment 6, heat treatment is performed for 4 hours at 550° C. in a nitrogen atmosphere in an electric furnace.

At this time, it is important to eliminate oxygen from the surrounding atmosphere as much as possible. This is because an exposed surface of the gate electrode is oxidized, which results in an increased resistance if only a small amount of oxygen exists. At the same time, it becomes more difficult to make an ohmic contact later. Accordingly, the oxygen concentration in the surrounding atmosphere for the activation process is set at 1 ppm or less, preferably at 0.1 ppm or less.

Figure 11D:
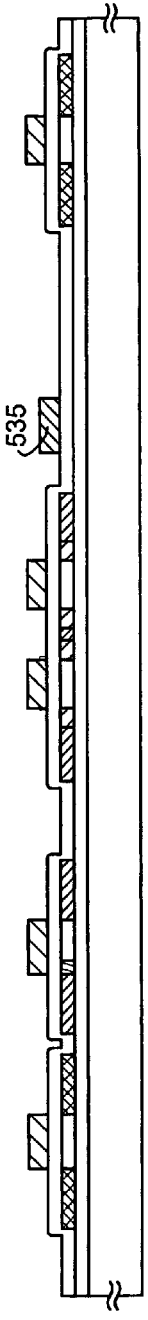

After the activation process is completed, a gate wiring (gate signal line) 535 having a thickness of 300 nm is formed. As a material for the gate wiring 535, a metal film containing aluminum (Al) or copper (Cu) as its main component (occupied 50 to 100% in the composition) can be used. The gate wiring 535 is arranged so as to provide electrical connection for the gate electrodes 513 and 514 of the switching TFT (see FIG. 11D).

The above-described structure can allow the wiring resistance of the gate wiring to be significantly reduced, and therefore, an image display region (display portion) with a large area can be formed. More specifically, the pixel structure in accordance with Embodiment 6 is advantageous for realizing an EL display device having a display screen with a diagonal size of 10 inches or larger (or 30 inches or larger.)

Figure 12A:
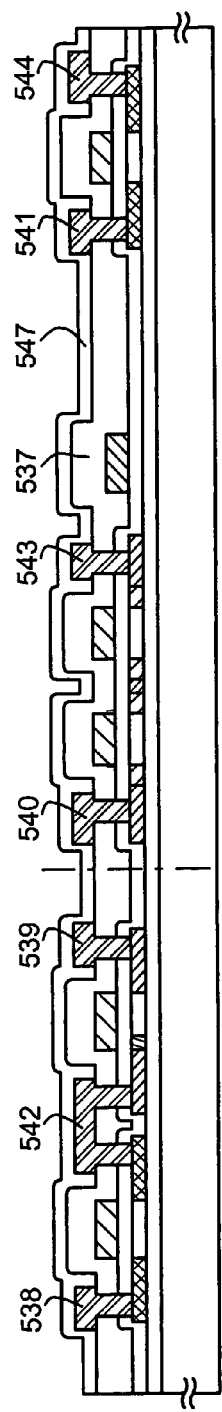
FIGS. 12A to 12C show a manufacturing process of the EL display according to the present invention.

A first interlayer insulating film 537 is formed next, as shown in FIG. 12A. A single layer insulating film containing silicon is used as the first interlayer insulating film 537, or a lamination film may be used. Further, a film thickness of between 400 nm and 1.5 μm may be used. A lamination structure of a silicon oxide film having a thickness of 800 nm on a silicon oxynitride film having a thickness of 200 nm thick is used in Embodiment 6.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen, which is thermally excited. Plasma hydrogenation (using hydrogen excited by plasma) may also be performed as another means of hydrogenation.

Note that the hydrogenation processing may also be inserted during the formation of the first interlayer insulating film 537. Namely, hydrogen processing may be performed as above after forming the 200 nm thick silicon oxynitride film, and then the remaining 800 nm thick silicon oxide film may be formed.

Next, a contact hole is formed in the first interlayer insulating film 537, thereby source wirings 538 to 541 and drain wirings 542 to 544 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by sputtering. Of course, other conductive films may be used.

Then, as shown in FIG. 12A, a first passivation film 547 is formed next with a thickness of 50 to 500 nm (typically between 200 and 300 nm). A 300 nm thick silicon oxynitride film is used as the first passivation film 547 in Embodiment 6. This may also be substituted by a silicon nitride film. Note that it is effective to perform plasma processing using a gas containing hydrogen such as $H_2$ or $NH_3$ before the formation of the silicon oxynitride film. Hydrogen activated by this preprocess is supplied to the first interlayer insulating film 537, and the film quality of the first passivation film 547 is improved by performing heat treatment. At the same time, the hydrogen added to the first interlayer insulating film 537 diffuses to the lower side, and the active layers can be hydrogenated effectively.

Figure 12B:
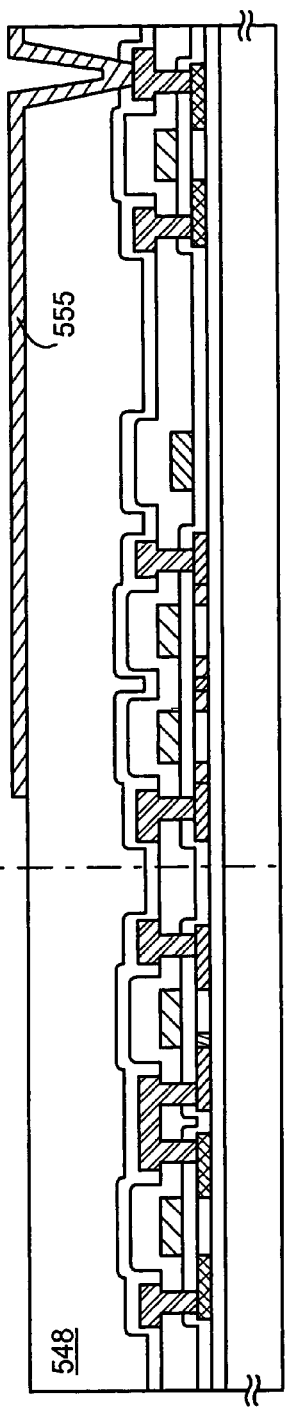

Next, a second interlayer insulating film 548 made of organic resin is formed. As the organic resin, it is possible to use polyimide, polyamide, acryl, BCB (benzocyclobutene) or the like. Especially, since the second interlayer insulating film 548 is primarily used for leveling, acryl excellent in leveling properties is preferable. In this embodiment, an acrylic film is formed to a thickness sufficient to level a stepped portion formed by TFTs. It is appropriate that the thickness is made 1 to 5 $\mu$m (more preferably, 2 to 4 $\mu$m). (FIG. 12B)

Next, a contact hole is formed in the second interlayer insulating film 548 and the first passivation film 547 so as to reach the drain wiring 544, and a pixel electrode 555 is formed. In Embodiment 6, an indium tin oxide (ITO) film is formed with a thickness of 110 nm, and patterning is then performed to form the pixel electrode 555. Further, a transparent conductive film in which between 2 and 20% zinc oxide (ZnO) is mixed with indium oxide may also be used. The pixel electrode 555 becomes an anode of an EL element.

Then, an organic resin film is formed on the pixel electrode 555 and the second interlayer insulating film 548, and the organic resin film is patterned to form a bank 556. The bank 556 is formed between pixels in a matrix shape so as to separate a light emitting layer or an EL layer of adjacent pixels from each other. In particular, the bank portion 556 is formed on the connecting portion of the pixel electrode 555 and a drain wiring 544 of an EL driver TFT 583, thereby to prevent poor light emission of the EL layer 557 due to a step at a contact hole portion of the pixel electrode 555. Note that the bank 556 may be a shielding film by mixing a pigment or the like with a resin material forming the bank 556.

Next, an EL layer 557 and a cathode (MgAg electrode) 558 are continuously formed by using the vacuum evaporation method without exposing to the atmosphere. The EL layer 557 has a thickness of from 80 to 200 nm (typically from 100 to 120 nm), and the cathode 558 has a thickness of from 180 to 300 nm (typically from 200 to 250 nm). Note that although only one pixel is illustrated in Embodiment 6, an EL layer for emitting red light, an EL layer for emitting green light, and an EL layer for emitting blue light are simultaneously formed at this time.

In this process, the EL layer 557 and the cathode 558 are sequentially formed with respect to a pixel corresponding to red, a pixel corresponding to green and a pixel corresponding to blue. In this case, since the EL layer 557 has an insufficient resistance against a solution, the EL layers must be formed separately for each color instead of using a photolithography technique. Therefore, it is preferable to cover a portion except for desired pixels using a metal mask so that the EL layer 557 and the cathode 558 are formed selectively only in a required portion.

Namely, a mask for covering all portions except for the pixel corresponding to red is first set, and the EL layer and the cathode for emitting red light are selectively formed by using this mask. Next, a mask for covering all portions except for the pixel corresponding to green is set, and the EL layer and the cathode for emitting green light are selectively formed by using this mask. Next, a mask for covering all portions except for the pixel corresponding to blue is similarly set, and the EL layer and the cathode for emitting blue light are selectively formed by using this mask. Here, different masks are used, but instead the same single mask may be used repeatedly. It is preferable to perform processing without breaking a vacuum until the EL layer and the cathode are formed with respect to all the pixels.

Note that the EL layer 557 has a single layer structure composed of only a light-emitting layer in Embodiment 6, but a structure having layers such as a hole transporting layer, a hole injecting layer, an electron transporting layer, and an electron injecting layer in addition to the light-emitting layer may also be used for the EL layer. Various examples of these types of combinations have already been reported, and all such structures may be used. A known material can be used as the EL layer 557. Considering the EL driver voltage, it is preferable to use an organic material as the known material. Further, an example in which MgAg electrode is used as the cathode of an EL element, is shown in Embodiment 6, and it is also possible to use known another materials.

Figure 12C:
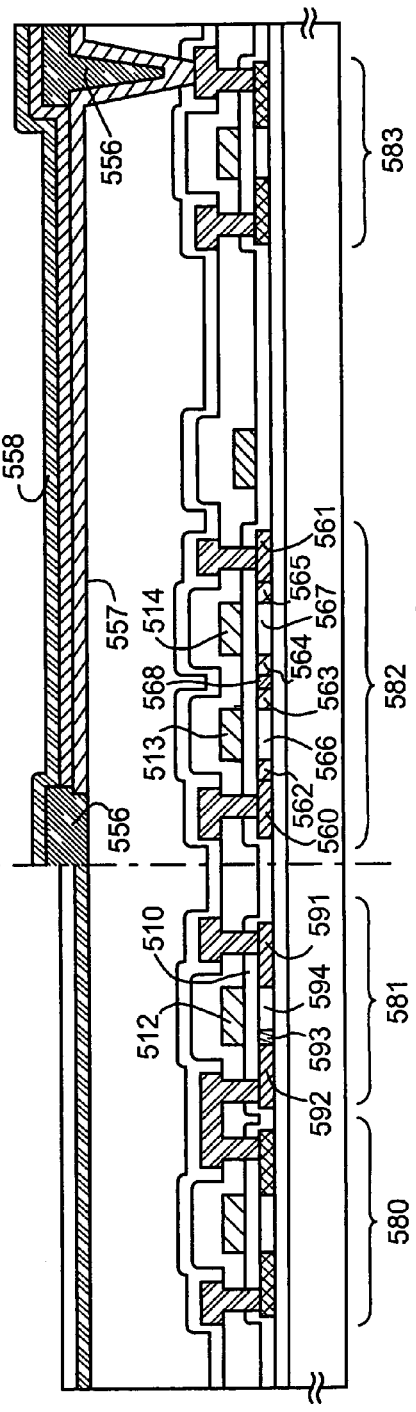

An active matrix substrate having a structure as shown in FIG. 12C is thus completed. Note that, after forming the bank 556, it is effective to perform processing in succession without exposure to the atmosphere up through to the formation of the cathode 558 by using a multi-chamber method (or an in-line method) thin film formation apparatus.

In Embodiment 6, a source region 560, a drain region 561, LDD regions 562 to 565, channel forming regions 566 and 567, and a separation region 568 are contained in an active layer of a switching TFT 582. The LDD regions 562 to 565 are formed so as not to overlap with the gate electrodes 513 and 514 through the gate insulating film 510. This type of structure is extremely effective in reducing the off current.

Further, the switching TFT 582 is made to have a double gate structure, so that two TFTs are substantially connected in series by using the double structure, giving the advantage of reducing an off current. In Embodiment 6, a double gate structure is used, but the present invention may also have a single gate structure, or a triple gate structure or a multi-gate structure having more gates.

Note that the active matrix substrate of Embodiment 6 shows an extremely high reliability, and its operational characteristics are also increased, by arranging optimally structured TFT in not only the pixel portion, but also in the driver circuit portion.

First, a TFT having a structure in which hot carrier injection is reduced so as not to have a very large drop in operational speed is used as an n-channel TFT 203 of a CMOS circuit forming the driver circuit portion. Note that circuits such as a shift register, a buffer, a level shifter, and a sampling circuit (sample and hold circuit) are included as the driver circuits here. Signal conversion circuits such as a D/A converter can also be included when performing digital drive.

In case of this embodiment, the active layer of the n-channel TFT 581 includes a source region 591, a drain region 592, an LDD region 593 and a channel-forming region 594, and the LDD region 593 is superimposed on the gate electrode 512 through the gate insulating film 510 interposed therebetween.

The reason for that the LDD region 593 is formed on only the drain region side 592 is because the operating speed is prevented from decreasing. Also, it is better that the n-channel TFT 581 does not require the off current value much but regards the operating speed as importance. Therefore, it is desirable that the LDD region 593 is completely superimposed on the gate electrode 512, and the resistant component is reduced as much as possible. That is, it is better to eliminate so-called offset.

Also, since a p-channel TFT 580 of the CMOS circuit is hardly deteriorated by hot carrier injection, the LDD region may not be particularly disposed. It is possible that the LDD region is disposed as in the n-channel TFT 581 for countermeasure against hot carriers.

In fact, after the device shown in FIG. 12C is completed, it is preferable that the device is packaged (sealed) with a protective film (a laminate film, an ultraviolet setting resin film and the like) high in air tightness or a housing material such as a ceramic sealing can so as not to be exposed to the exterior. In this situation, if the interior of the housing material is made in an inert atmosphere or a hygroscopic material (for example, barium oxide) is disposed within the housing material, the reliability (lifetime) of the EL layer is improved.

Also, if the air tightness is enhanced by a process such as packaging, a connector (flexible printed circuit: FPC) for connecting a terminal drawn from the elements or the circuits formed on the substrate and an external signal terminal is fitted to the device, thus completing the device as a product. The EL display device which, is in a state where it can be shipped is called an EL module in this specification.

Note that it is possible to implement Embodiment 6 in combination with Embodiments 1 to 5.

[Embodiment 7]

An outline of a cross sectional structure of an EL display of the present invention is explained in Embodiment 7 using FIG. 13, an example differing from that of FIGS. 12A to 12C. An example is shown in FIGS. 12A to 12C in which the switching TFT, the erasure TFT, and the first and the second EL driver TFTs are top gate TFTs, but an example of using bottom gate thin film transistors for the TFTs is explained in Embodiment 7.

Reference numeral 811 denotes a substrate in FIG. 13, and reference numeral 812 denotes an insulating film which becomes a base (hereafter referred to as a base film). A light transmitting substrate, typically a glass substrate, a quartz substrate, a glass ceramic substrate, or a crystalline glass substrate can be used as the substrate 811. However, the substrate used must be one able to withstand the highest process temperature during the manufacturing processes.

Further, the base film 812 is particularly effective when using a substrate containing mobile ions or a substrate which has conductivity, but the base film 812 need not be formed on a quartz substrate. An insulating film containing silicon may be used as the base film 812. Note that the term insulating film containing silicon specifically indicates an insulating film such as a silicon oxide film, a silicon nitride film, and a silicon oxynitride film (denoted as SiOxNy, where x and y are arbitrary integers) containing oxygen or nitrogen at predetermined ratios with respect to silicon.

Reference numeral 8201 denotes a switching TFT, reference numeral 8202 denotes a first EL driver TFT, and both are formed by p-channel TFTs. When the direction of EL light emitted is toward the substrate lower side (surface where TFTs and the EL layer are not formed), it is preferable that the switching TFT and the EL driver TFT have the above structure. However, the present invention is not limited to this structure. The switching TFT and the first EL driver TFT may be either n-channel TFTs or p-channel TFTs. Note that, although an erasure TFT is not shown in Embodiment 7, it is possible to form the erasure TFT similar to the switching TFT, and therefore a detailed structure of the erasure TFT is omitted here. Further, a second EL driver TFT has the same structure as the first EL driver TFT, and therefore an explanation of its detailed structure is omitted here.

The switching TFT 8201 has an active layer containing a source region 813, a drain region 814, LDD regions 815a to 815d, a separation region 816, and channel forming regions 817a and 817b; a gate insulating film 818; gate electrodes 819a and 819b; a first interlayer insulating film 820; a source wiring 821; a drain wiring 822; and channel forming region protecting films 863 and 864. Note that the gate insulating film 818 and the first interlayer insulating film 820 may be common among all TFT on the substrate, or may differ depending upon the circuit or the element.

Furthermore, the switching TFT 8201 shown in FIG. 13 is electrically connected to the gate electrodes 817a and 817b, becoming namely a double gate structure. Not only the double gate structure, but also a multi-gate structure (a structure containing an active layer having two or more channel forming regions connected in series) such as a triple gate structure, may of course also be used.

The multi-gate structure is extremely effective in reducing the off current, and provided that the off current of the switching TFT is sufficiently lowered, a capacitor connected to the gate electrode of the first EL driver TFT 8202 can be have its capacitance reduced to the minimum necessary. Namely, the surface area of the capacitor can be made smaller, and therefore using the multi-gate structure is also effective in expanding the effective light emitting surface area of the EL elements.

In addition, the LDD regions 815a to 815d are formed so as not to overlap the gate electrodes 819a and 819b through the gate insulating film 818 in the switching TFT 8201. This type of structure is extremely effective in reducing the off current. Furthermore, the length (width) of the LDD regions 815a to 815d may be set from 0.5 to 3.5 μm, typically between 2.0 and 2.5 μm.

Note that forming an offset region (a region which is a semiconductor layer having the same composition as the channel forming region and to which the gate voltage is not applied) between the channel forming region and the LDD region is additionally preferable in that the off current is lowered. Further, when using a multi-gate structure having two or more gate electrodes, the separation region 816 (a region to which the same impurity element, at the same concentration, as that added to the source region or the drain region, is added) is effective in reducing the off current.

Next, the first EL driver TFT 8202 is formed having an active layer containing a source region 826, a drain region 827, and a channel forming region 829; the gate insulating film 818; a gate electrode 830, the first interlayer insulating film 820; a source wiring 831; and a drain wiring 832. The first EL driver TFT 8202 is a p-channel TFT in Embodiment 7.

Further, the drain region 814 of the switching TFT 8201 is connected to the gate 830 of the first EL driver TFT 8202. Although not shown in the figure, specifically the gate electrode 829 of the EL driver TFT 8202 is electrically connected to the drain region 814 of the switching TFT 8201 through the drain wiring (also referred to as a connection wiring) 822. Note that, although not shown in the figure, the gate electrode 830, the source region 826, and the drain region 827 are electrically connected to a gate electrode, a source region, and a drain region of the second EL driver TFT, respectively. Irradiation of heat generated by the electric current flowing in the active layers of the EL driver TFT can be efficiently performed in accordance with this structure, and deterioration of the EL driver TFT can be suppressed. In addition, dispersion in the drain current developing due to dispersion in characteristics such as the threshold voltage and the mobility of the EL driver TFT can be suppressed. The source signal line 831 of the first EL driver TFT 8202 is connected to an power source supply line (not shown in the figure).

The first EL driver TFT 8202 and the second EL driver TFT (not shown in the figure) are elements for controlling the amount of electric current injected to the EL element 8206, and a relatively large amount of current flows. It is therefore preferable to design the channel width W to be larger than the channel width of the switching TFT 8201. Further, it is preferable to design the channel length L such that an excess of electric current does not flow in the EL driver TFT 731. It is preferable to have from 0.5 to 2 $\mu$A (more preferably between 1 and 1.5 $\mu$A) per pixel.

In addition, by making the film thickness of the active layers (particularly the channel forming region) of the first and the second EL driver TFTs thicker (preferably from 50 to 100 nm, even better between 60 and 80 nm), degradation of the TFT may be suppressed. Conversely, it is also effective to make the film thickness of the active layer (particularly the channel forming region) thinner (preferably from 20 to 50 nm, even better between 25 and 40 nm), from the standpoint of making the off current smaller, for the case of the switching TFT 8201.

The structures of the TFTs formed within the pixel are explained above, but a driver circuit is also formed simultaneously at this point. A CMOS circuit, which becomes a basic unit for forming the driver circuit, is shown in FIG. 13.

A TFT having a structure in which hot carrier injection is reduced without an excessive drop in the operating speed is used as an n-channel TFT 8204 of the CMOS circuit in FIG. 13. Note that the term driver circuit indicates a source signal line driver circuit and a gate signal line driver circuit here. It is also possible to form other logic circuit (such as a level shifter, an A/D converter, and a signal partitioning circuit).

An active layer of the n-channel TFT 8204 of the CMOS circuit contains a source region 835, a drain region 836, an LDD region 837, and a channel forming region 838. The LDD region 837 overlaps with a gate electrode 839 through the gate insulating film 818.

Formation of the LDD region 837 on only the drain region 836 side is so as not to have drop the operating speed. Further, it is not necessary to be very concerned about the off current with the n-channel TFT 8204, and it is good to place more importance on the operating speed. It is therefore preferable to eliminate the offset.

Furthermore, there is almost no need to be concerned with degradation of a p-channel TFT 8205 of the CMOS circuit, due to hot carrier injection, and therefore no LDD region need be formed in particular. Its active layer therefore contains a source region 840, a drain region 841, and a channel forming region 842, and a gate insulating film 818 and a gate electrode 843 are formed on the active layer. It is also possible, of course, to take measures against hot carrier injection by forming an LDD region similar to that of the n-channel TFT 8204.

Note that reference numerals 861 to 865 denote masks for forming channel forming regions 842, 838, 817a 817b and 829.

Further, the n-channel TFT 8204 and the p-channel TFT 8205 have source signal lines 844 and 845, respectively, on their source regions, through the first interlayer insulating film 820. In addition, the drain regions of the n-channel TFT 8204 and the p-channel TFT 8205 are mutually connected electrically by a drain wiring 846.

Next, reference numeral 847 denotes a first passivation film, and its film thickness may be set from 10 nm to 1 $\mu$m (preferably between 200 and 500 nm). An insulating film containing silicon (in particular, it is preferable to use an oxidized silicon nitride film or a silicon nitride film) can be used as the passivation film material. The passivation film 847 possesses a role of protecting the TFTs from alkaline metals and moisture. Alkaline metals such as sodium are contained in an EL layer formed last on the final TFT (in particular, the EL driver TFT). In other words, the first passivation film 847 works as a protecting layer so that these alkaline metals (mobile ions) do not penetrate into the TFT.

Further, reference numeral 848 denotes a second interlayer insulating film, which has a function as a leveling film for performing leveling of a step due to the TFTs. An organic resin film is preferable as the second interlayer insulating film 848, and one such as polyimide, polyamide, acrylic, or BCB (benzocyclobutene) may be used. These organic resin films have the advantages of easily forming a good, level surface, having a low specific dielectric constant. The EL layer is extremely sensitive to unevenness, and therefore it is preferable to mostly absorb the TFT step by the second interlayer insulating film 848. In addition, it is preferable to form the low specific dielectric constant material thickly in order to reduce the parasitic capacitance formed between the gate signal wiring and the cathode of the EL element. The thickness, therefore, is preferably from 0.5 to 5 $\mu$m (more preferably between 1.5 and 2.5 $\mu$m).

Further, reference numeral 849 denotes a pixel electrode (EL element anode) made from a transparent conducting film. After forming a contact hole (opening) in the second interlayer insulating film 848 and in the first passivation film 847, the pixel electrode 849 is formed so as to be connected to the drain wiring 832 of the first EL driver TFT 8202. Note that if the pixel electrode 849 and the drain region 827 are formed so as not to be directly connected, as in FIG. 13, then alkaline metals of the EL layer can be prevented from entering the active layer via the pixel electrode.

A third interlayer insulating film 850 is formed on the pixel electrode 849 from a silicon oxide film, a silicon oxynitride film, or an organic resin film, with a thickness of from 0.3 to 1 $\mu$m. The third interlayer insulating film 850 functions as a bank. An open portion is formed in the third interlayer insulating film 850 over the pixel electrode 849 by etching, and the edge of the open portion is etched so as to become a tapered shape. The taper angle may be set from 10 to 60°, (preferably between 30 and 50°). In particular, light emitting irregularities of the EL layer 851 due to a step in the pixel electrode 849 which develops in a contact hole portion can be prevented by forming the third interlayer insulating film 850 on portions in which the pixel 849 and the first EL driver TFT 8202, and the second EL driver TFT and the drain wiring 832 are connected.

An EL layer 851 is formed on the third interlayer insulating film 850. A single layer structure or a lamination structure can be used for the EL layer 851, but the lamination structure has a better light emitting efficiency. In general, a hole injecting layer, a hole transporting layer, a light emitting layer, and an electron transporting layer are formed in order on the pixel electrode, but a structure having a hole transporting layer, a light emitting layer, and an electron transporting layer, or a structure having a hole injecting layer, a hole transporting layer, a light emitting layer, an electron transporting layer, and an electron injecting layer may also be used. Any known structure may be used by the present invention, and doping of such as a fluorescing pigment into the EL layer may also be performed.

The structure of FIG. 13 is an example of a case of forming three types of EL elements corresponding to R, G, and B. Note that although only one pixel is shown in FIG. 13, pixels having an identical structure are formed corresponding to green and blue colors, respectively, and that color display can thus be performed. It is possible to implement the present invention without concern as to the method of color display.

A cathode 852 of the EL element is formed on the EL layer 851. A material containing a low work coefficient material such as magnesium (Mg), lithium (Li), or calcium (Ca), is used as the cathode 852. Preferably, an electrode made from MgAg (a material made from Mg and Ag at a mixture of Mg:Ag=10:1) is used. In addition, a MgAgAl electrode, an LiAl electrode, and an LiFAl electrode can be given as other examples.

It is preferable to form the cathode 852 in succession, without exposure to the atmosphere, after forming the EL layer 851. This is because the interface state between the cathode 852 and the EL layer 851 greatly influences the light emitting efficiency of the EL element. Note that, throughout this specification, an EL element formed by a pixel electrode (anode), an EL layer, and a cathode is referred to as an EL element 8206.

The lamination body composed of the EL layer 851 and the cathode 852 must be formed separately for each pixel, but the EL layer 851 is extremely weak with respect to moisture, and consequently a normal photolithography technique cannot be used. It is therefore preferable to use a physical mask material such as a metal mask, and to selectively form the layers by a gas phase method such as vacuum evaporation, sputtering, or plasma CVD.

Note that it is also possible to use a method such as ink jet printing, screen printing or spin coating as the method of selectively forming the EL layer. However, the cathode cannot be formed in succession with these methods at present, and therefore it is preferable to use the other methods stated above.

Further, reference numeral 853 denotes a protective electrode, which protects the cathode 852 from external moisture, and at the same time is an electrode for connecting the cathodes 852 of each pixel. It is preferable to use a low resistance material containing aluminum (Al), copper (Cu), or silver (Ag) as the protective electrode 853. The protective electrode 853 can also be expected to have a heat radiating effect which relieves the amount of heat generated by the EL layer. Further, it is effective to form the protective electrode in succession, without exposure to the atmosphere, after forming the EL layer 851 and the cathode 852.

Reference numeral 854 denotes a second passivation film, which may be formed with a film thickness of 10 nm to 1 $\mu$m (preferably between 200 and 500 nm). The aim of forming the second passivation film 854 is mainly for protecting the EL layer 851 from moisture, but it is also effective to give the second passivation film 854 a heat radiating effect. Note that the EL layer is weak with respect to heat, as stated above, and therefore it is preferable to perform film formation at as low a temperature as possible (preferably within a temperature range from room temperature to 120° C.). Plasma CVD, sputtering, vacuum evaporation, ion plating, and solution coating (spin coating) can therefore be considered as preferable film formation methods.

Note that it goes without saying that all of the TFTs shown in FIG. 13 may have a polysilicon film as their active layer in the present invention.

The present invention is not limited to the structure of the EL display of FIG. 13, and the structure of FIG. 13 is merely one preferred embodiment for the implementation of the present invention.

Note that it is possible to implement Embodiment 7 in combination with Embodiments 1 to 5.

[Embodiment 8]

A process of manufacturing an EL display of the present invention in which a substrate on which an EL element is formed is sealed so that the EL element is not exposed to the atmosphere is explained in Embodiment 8. Note that FIG. 14A is a top surface diagram of an EL display of the present invention, and FIG. 14B is a cross sectional diagram.

Figure 14A:
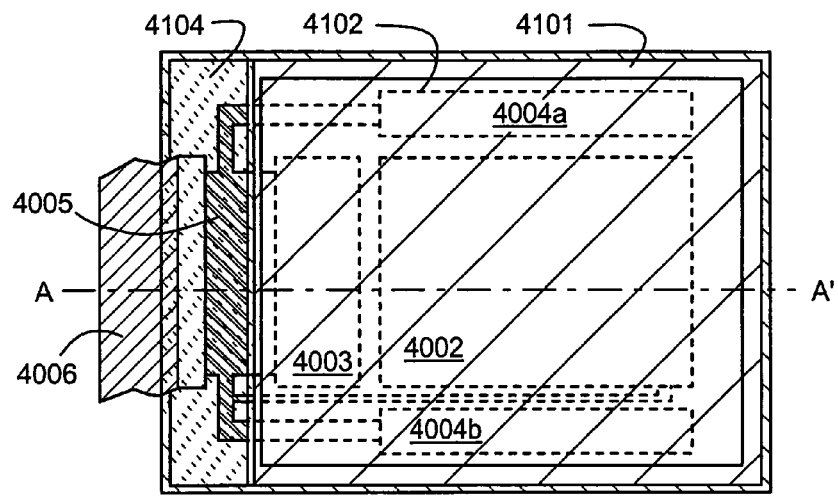
FIGS. 14A and 14B show a top view and a cross-sectional view of the EL display according to the present invention.
Figure 14B:
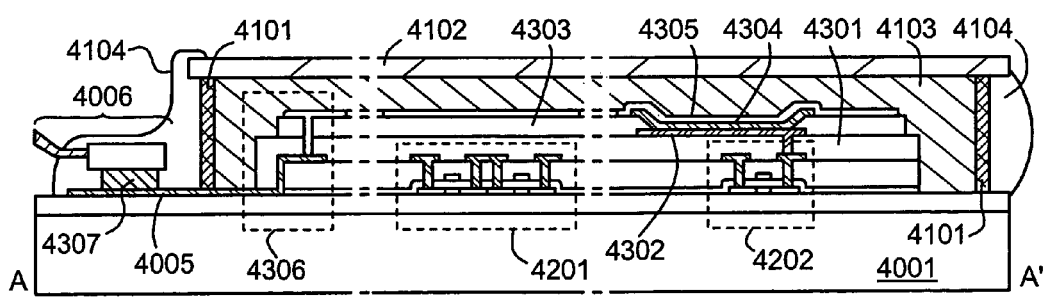

In FIGS. 14A and 14B, reference numeral 4001 denotes a substrate, reference numeral 4002 denotes a pixel portion, reference numeral 4003 denotes a source signal line driver circuit, 4004*a* denotes a write in gate signal line driver circuit, and 4004*b* denotes an erasure gate signal line driver circuit. Each of the driver circuits is connected to external equipment via a wiring 4005 leading to an FPC (flexible printed circuit) 4006.

A first sealing material 4101, a cover material 4102, a filler material 4103, and a second sealing material 4104 are formed at this point so as to surround the pixel portion 4002, the source signal line driver circuit 4003, the write in gate signal line driver circuit 4004*a*, and the erasure gate signal line driver circuit 4004*b*.

FIG. 14B is a cross sectional diagram corresponding to FIG. 14A cut along the line A–A'. A driver TFT 4201 (note that an n-channel TFT and a p-channel TFT are shown here) contained in the source signal line driver circuit 4003 on the substrate 4001, and an EL driver TFT 4202 (a TFT for controlling the electric current flowing in an EL element) contained in the pixel portion 4002 are formed.

A p-channel TFT or an n-channel TFT manufactured by a known method is used in the driver TFT 4201 in Embodiment 8, and a p-channel TFT manufactured by a known method is used in the EL driver TFT 4202. Further, a capacitor connected to a gate of the EL driver TFT 4202 is formed in the pixel portion 4002.

An interlayer insulating film (leveling film) 4301 is formed on the driver TFT 4201 and the pixel TFT 4202 from a resin material, and a pixel electrode (anode) 4302 which is electrically connected to a drain of the pixel TFT 4202 is formed on the interlayer insulating film. A transparent conducting film having a large work coefficient is used as the pixel electrode 4302. A chemical compound of indium oxide and tin oxide, a chemical compound of indium oxide and zinc oxide, zinc oxide, tin oxide, and indium oxide can be used as the transparent conducting film. Further, gallium may also be doped into the above transparent conducting films.

An insulating film 4303 is then formed on the pixel electrode 4302, and an open portion is formed in the insulating film 4303 over the pixel electrode 4302. An EL layer 4304 is formed on the pixel electrode 4302 in the open portion. Known organic EL materials and known inorganic materials can be used for the EL layer 4304. Further, low molecular weight (monomer) materials and high molecular weight (polymer) materials exist as organic EL materials, and both may be used.

A known evaporation technique or a known application technique may be used as a method of forming the EL layer 4304. Further, the structure of the EL layer may be a lamination structure, or a single layer structure, in which hole injecting layers, hole transporting layers, light emitting layers, electron transporting layers, and electron injecting layers are freely combined.

A cathode 4305 composed of a conducting film having light shielding properties (typically a conducting film having aluminum, copper, or silver as its main constituent, or a lamination film of these and another conducting film) is formed on the EL layer 4304. Furthermore, it is preferable to remove, as much as possible, moisture and oxygen existing in the interface between the cathode 4305 and the EL element 4304. It is therefore necessary to employ a scheme such as forming both films in succession within a vacuum, or one in which the EL layer 4304 is formed in a nitrogen or inert gas environment, and then the cathode 4305 is formed without exposure to oxygen or moisture. It is possible to perform the above stated film formation in Embodiment 8 by using a multi-chamber method (cluster tool method) film formation apparatus.

The cathode 4305 is then electrically connected to the wiring 4005 in a region shown by reference numeral 4306. The wiring 4005 is a wiring for imparting a predetermined voltage to the cathode 4305, and the wiring 4005 is electrically connected to the FPC 4006 through an anisotropic conductive film 4307.

Al EL element composed of the pixel electrode (anode) 4302, the EL layer 4304, and the cathode 4305 is thus formed. The EL element is surrounded by the first sealing material 4101, and by the cover material 4102 which is joined to the substrate 4001 by the first sealing material 4101, and is enclosed by the filler material 4103.

Further, a glass material, a metallic material (typically a stainless steel material), a ceramic material, and a plastic material (including plastic films) can be used as the cover material 4102. An FRP (fiberglass reinforced plastics) plate, a PVF (polyvinyl fluoride) film, a mylar film, a polyester film, and an acrylic resin film can be used as the plastic material. Further, a sheet having a structure in which aluminum foil is sandwiched by a PVF film or a mylar film can also be used.

Note that, it is necessary for the cover material to be transparent for cases in which the irradiating direction of light from the EL elements is toward the cover material side. A transparent material such as a glass plate, a plastic plate, a polyester film, or an acrylic film, is used in this case.

Further, an ultraviolet hardening resin or a thermally hardening resin can be used as the filler material 4103. PVC (polyvinyl chloride), acrylic, polyimide, epoxy resin, silicon resin, PVB (polyvinyl butyral) and EVA (ethylene vinyl acetate) can be used. Deterioration of the EL elements can be suppressed if a drying agent (preferably barium oxide) or an oxidation preventing agent having an oxygen capturing effect is formed on the inside of the filler material 4103.

Furthermore, spacers may also be included within the filler material 4103. It is possible to give the spacers themselves moisture absorbency by forming the spacers from barium oxide. Further, when forming spacers, it is also effective to form a resin film on the cathode 4305 as a buffer layer for relieving pressure from the spacers.

The wiring 4005 is electrically connected to the FPC 4006 through the anisotropic conductive film 4307. The wiring 4005 transmits signals sent from the pixel portion 4002, the source signal line driver circuit 4003, the write in gate signal line driver circuit 4004a, and the erasure gate signal line driver circuit 4004b to the FPC 4006, and the wiring is electrically connected to external equipment by the FPC 4006.

Further, the second sealing material 4104 is formed so as to cover exposed portions of the first sealing material 4101 and a portion of the FPC 4006, resulting in a structure in which the EL elements are completely cutoff from the atmosphere. This becomes the EL display having the cross sectional structure of FIG. 14B.

Note that it is possible to implement Embodiment 8 in combination with Embodiments 1 to 7.

[Embodiment 9]

Figure 15A:
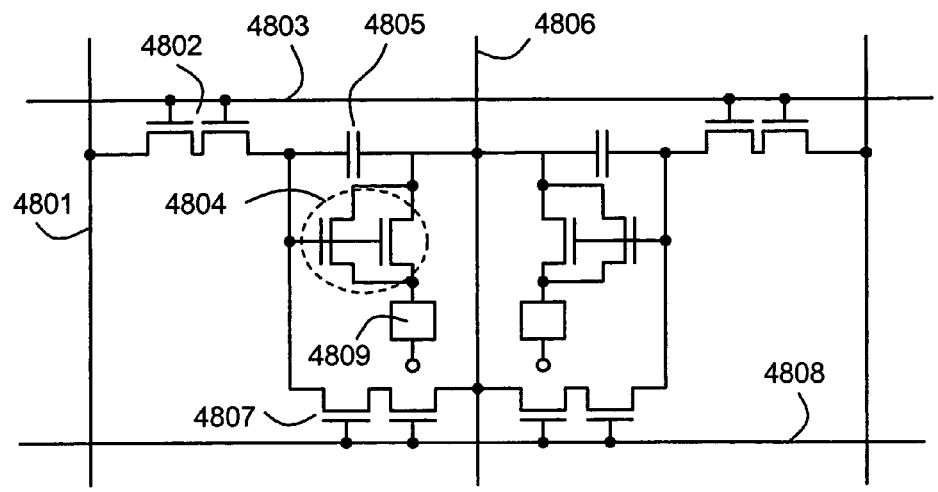
FIGS. 15A and 15B are circuit diagrams of a pixel of the EL display according to the present invention.
Figure 15B:
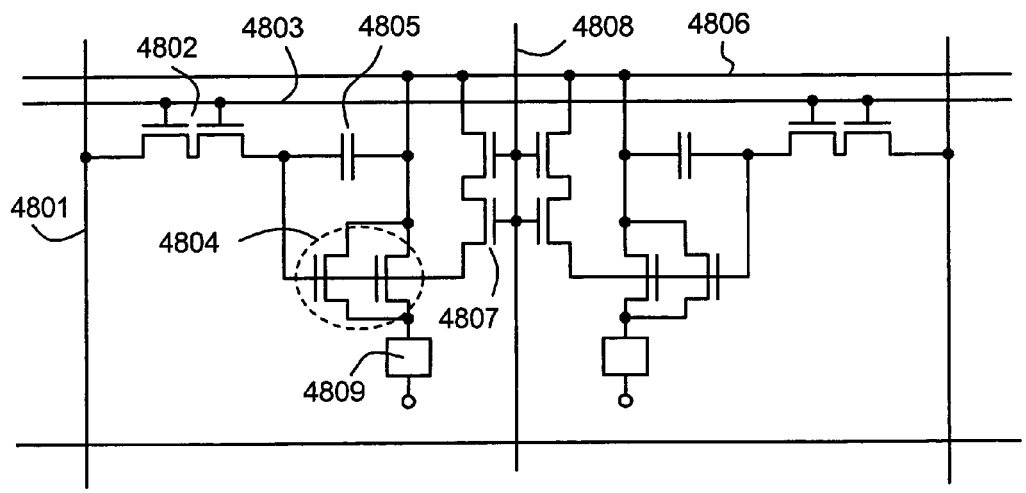

A circuit diagram of a pixel having a structure which differs from that of FIG. 3 is explained in Embodiment 9 using FIGS. 15A and 15B. Note that, in Embodiment 9, reference numeral 4801 denotes a source signal line, reference numeral 4802 denotes a switching TFT, reference numeral 4803 denotes a write in gate signal line, 4804 denotes an EL driver TFT, 4805 denotes a capacitor, 4806 denotes an power source supply line, 4807 denotes an erasure TFT, 4808 denotes an erasure gate signal line, and reference numeral 4809 denotes an EL element.

FIG. 15A is an example of a case in which the power source supply line 4806 is shared between two pixels. Namely, two pixels are formed so as to have linear symmetry with the power source supply line 4806 as the center. In this case the number of power source supply lines can be reduced, and therefore the pixel portion can be made with additionally higher definition.

Further, FIG. 15B is an example of a case in which the power source supply line 4806 is provided so as to be parallel to the write in gate signal line 4803, and forming the erasure gate signal line 4808 is provided so as to be parallel to the source signal line 4801.

Provided that the power source supply line 4806 and the write in gate signal line 4803 are formed in different layers, they can be formed so as to overlap through an insulating film. In this case, the surface area occupied by the power source supply line 4806 and the write in gate signal line 4803 can be shared, and therefore the pixel portion can be made with additionally higher definition.

In addition, provided that the power source supply line 4806 and the erasure gate signal line 4808 are formed in different layers can be formed so as to overlap through an insulating film. In this case, the surface area occupied by the power source supply line 4806 and the erasure gate signal line 4808 can be shared, and therefore the pixel portion can be made with additionally higher definition.

The write in gate signal line and the erasure gate signal line may overlap through an insulating film, the source signal line and the power source supply line may overlap through an insulating film.

Note that it is possible to implement the constitution of Embodiment 9 in combination with the constitutions of Embodiment 1 to 8.

[Embodiment 10]

In Embodiment 10, a detailed structure of the source signal line driver circuit 102a shown in FIG. 9 will be described.

Figure 16:
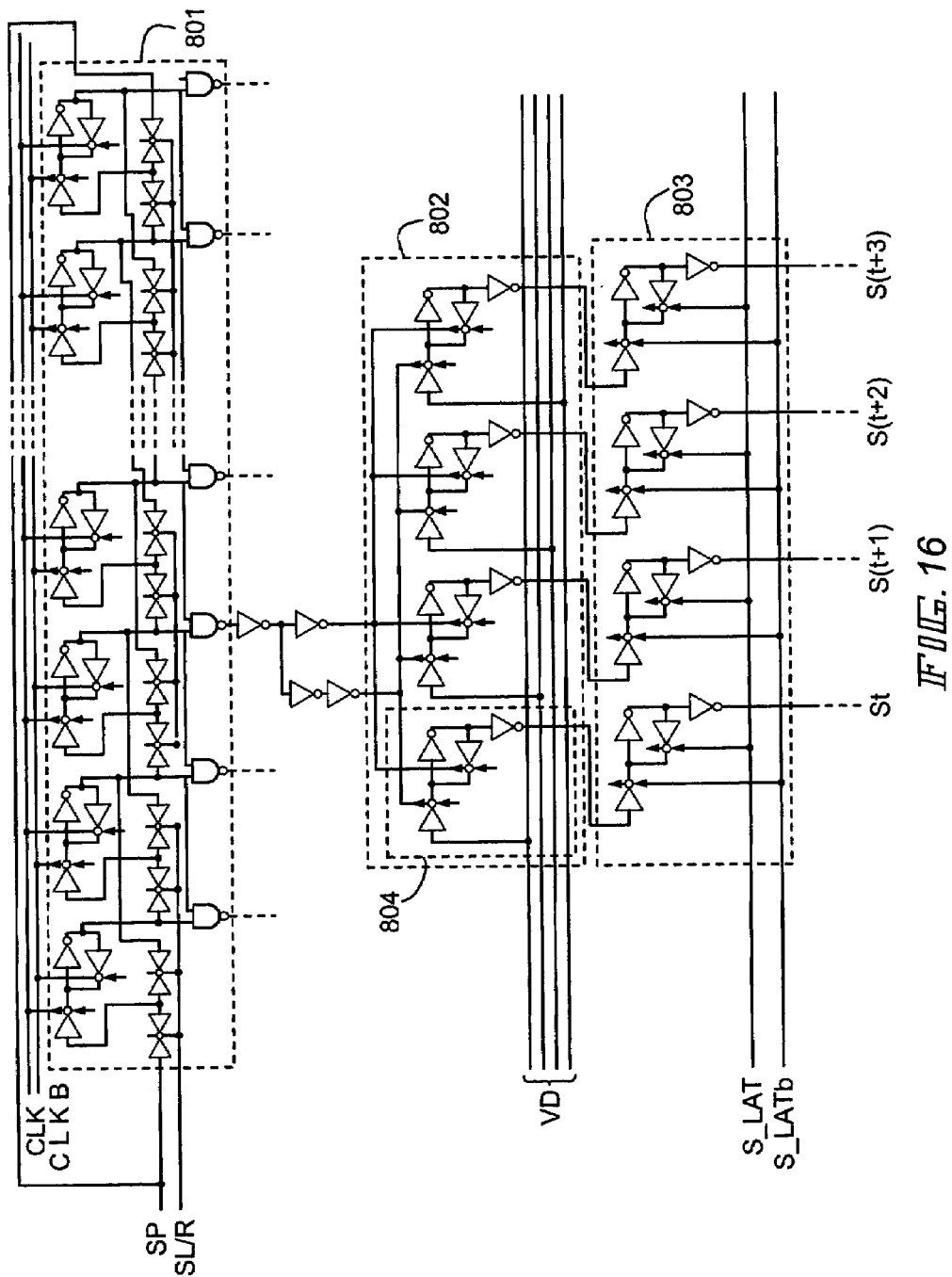
FIG. 16 is a circuit diagram of a source signal line driver circuit of the EL display according to the present invention.

A shift register 801, a latch (A) (802) and latch (B) (803) are placed as shown in FIG. 16. In Embodiment 10, a series of latch (A) (802) and a series of latch (B) (803) correspond to four source signal lines St through S(t+3). Although not provided in this embodiment, the designers may appropriately provide a level shift for varying a width of amplification of a voltage of a signal.

A clock signal CLK, a clock signal CLKB having an inverted polarity of the clock signal CLK, a start pulse signal SP, and a driving direction switching signal SL/R are respectively input to the shift register 801 through wirings shown in the figure. A digital video signal VD is externally input to the latch (A) (802) through a wiring shown in the figure. A latch signal S_LAT and a signal S_LATb having an inverted polarity of the latch signal S_LAT are respectively input to the latch (B) (803) through wirings shown in the figure.

For a detailed structure of the latch (A) (802), a part 804 of the latch (A) (802) corresponding to the source signal line St is described by way of example. The part 804 of the latch (A) (802) includes two clocked inverters and two inverters.

Figure 17:
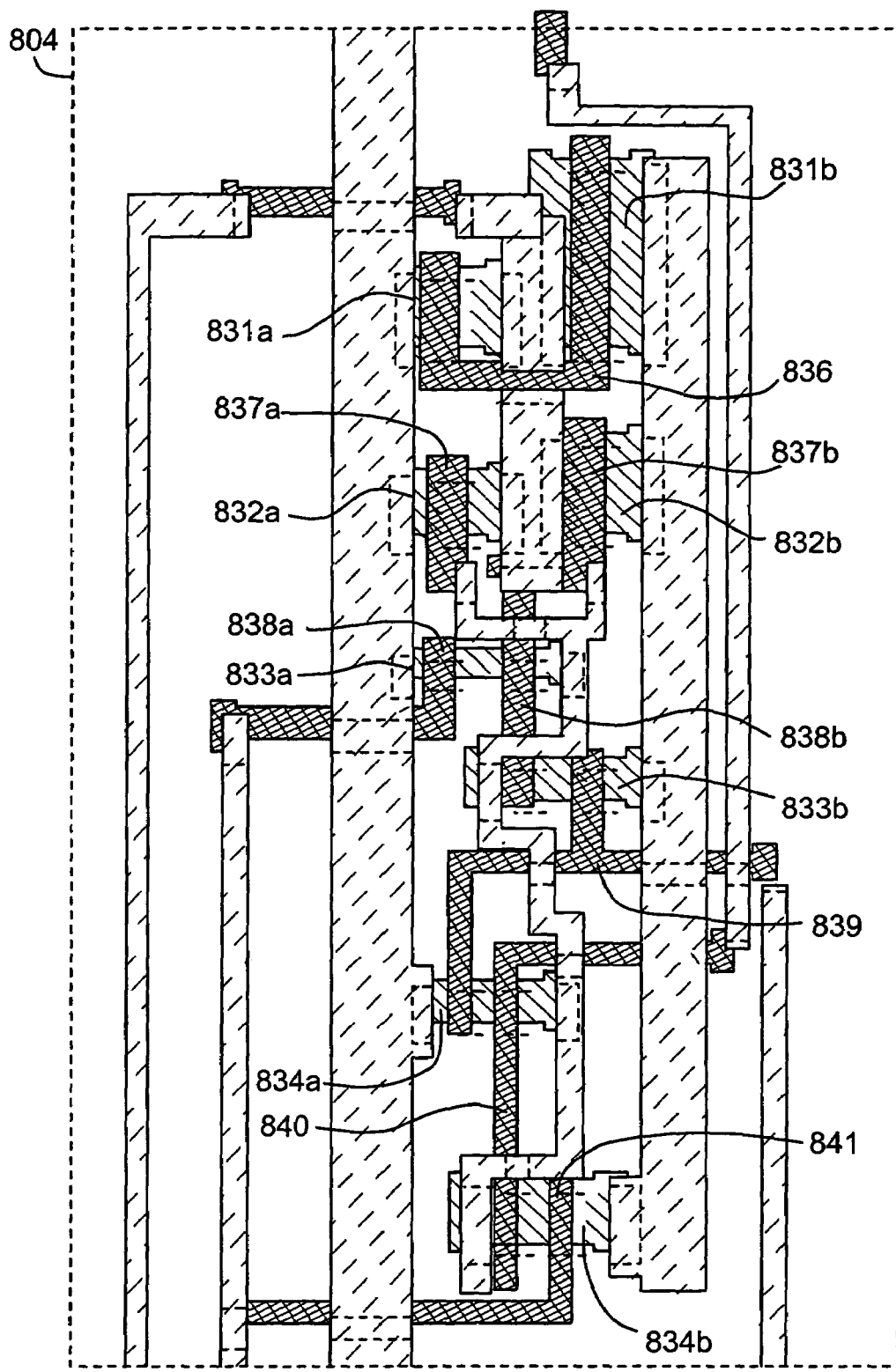
FIG. 17 is top view of a latch of a source signal line driving circuit of the EL display according to the present invention.

FIG. 17 shows a top view of the part 804 of the latch (A) (802). TFTs forming one of the inverters included in the part 804 of the latch (A) (802) have active layers and a gate electrode 836 common to the TFTs forming the inverter. TFTs forming the other inverter included in the part 804 of the latch (A) (802) have active layers 832*a* and 832*b*, respectively. Gate electrodes 837*a* and 837*b* are respectively provided on the active layers 832*a* and 832*b*. Further, the gate electrodes 837*a* and 837*b* are electrically connected with each other.

TFTs forming one of the clocked inverters included in the part 804 of the latch (A) (802) have active layers 833*a* and 833*b*. Gate electrodes 838*a* and 838*b* are provided on the active layer 833*a* to provide a double-gate structure. In the same manner, gate electrodes 838*b* and 839 are provided on the active layer 833*b* to provide a double-gate structure.

TFTs forming the other clocked inverter included in the part 804 of the latch (A) (802) have active layers 834*a* and 834*b*. Gate electrodes 839 and 840 are provided on the active layer 834*a* to provide a double-gate structure. In the same manner, gate electrodes 840 and 841 are provided on the active layer 834*b* to provide a double-gate structure.

[Embodiment 11]

Materials used as an EL layer of an EL element in an EL display according to the present invention are not limited to organic EL materials. The present invention can also be implemented using inorganic EL materials. However, the driving voltage of inorganic EL materials is extremely high at present, and therefore a TFT which is able to withstand the high driving voltage must be used.

Further, provided that organic EL materials with lower driving voltage are developed in the future, it will be possible to apply these materials to the present invention.

Furthermore, it is possible to implement the constitution of Embodiment 11 in combination with Embodiments 1 to 10.

[Embodiment 12]

Organic materials used as EL layers in the present invention may be low molecular weight organic materials, or may be polymer (high molecular weight) organic materials. Materials such as Alq$_3$ (tris-8-aluminum quinolinolate complex) and TPD (triphenylamine derivative) are known as examples of low molecular weight organic materials, and π conjugate polymer materials can be given as polymer organic materials. Typically, materials such as PPV (polyphenylene vinylene), PVK (polyvinyl carbazole), and polycarbonate can be given as examples of such.

Polymer (high molecular weight) organic materials can be formed into a film by an easy thin film formation method such as spin coating also referred to as solution application), dipping, dispensing, printing, or ink jet printing, and have high heat resistance compared to low molecular weight organic materials.

Further, when the EL layers of EL elements of the EL display according to the present invention have an electron transporting layer and a hole transporting layer, the electron transporting layer and the hole transporting layer may also be formed of an inorganic material, for example, an amorphous semiconductor such as amorphous Si or amorphous $Si_{1-x}C_x$, for example.

A large amount of trap levels exist in amorphous semiconductors, and a large amount of interface levels are formed in an interface between the amorphous semiconductor and another layer. Therefore the EL element can emit light at a low voltage, and can be made higher in brightness.

Furthermore, a dopant (impurity) may be added to organic EL layers, and the color of the light emitted from the organic EL layers may also be changed. The following can be given as dopants: DCM1, nile red, librene, coumarin 6, TPB, and quinacridon.

Note that it is possible to implement Embodiment 12 in combination with Embodiments 1 to 11.

[Embodiment 13]

In Embodiment 13, in the case where a method of driving an EL display according to the present invention is used, what type of voltage-current characteristic is required to a region where it is preferable to drive EL driver TFTs (a first EL driver TFT and a second EL driver TFT) will be described using FIGS. 18A and 18B, FIG. 19, and FIG. 20.

With even a slight change in voltage to be applied to the EL element, a current flowing through the EL element exponentially changes in a great manner. From another point of view, even if the amount of a current flowing through the EL element changes, a voltage value to be applied to the EL element does not greatly change. The brightness of the EL element proportionally increases with the amount of a current flowing through the EL element. Therefore, it is easy to control the brightness of the EL element by controlling the amount of a current (current value) flowing through the EL element rather than by controlling a voltage (voltage value) to be applied to the EL element because the control is hardly affected by TFT characteristics.

Figure 18A:
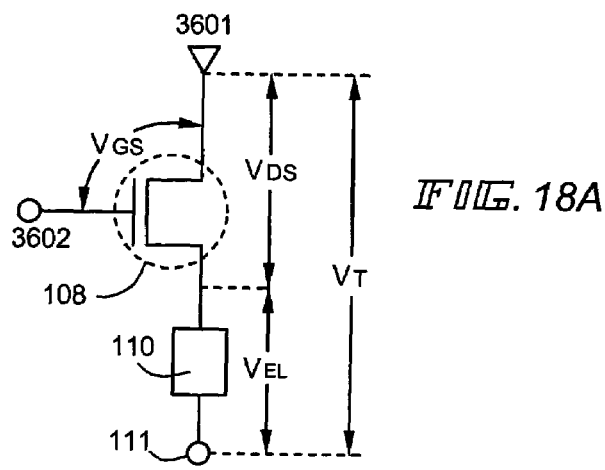
FIGS. 18A and 18B are a diagram showing a structure of a connection between an EL element and an EL driver TFT, and a graph showing voltage-current characteristics of an EL element and an EL driver TFT, respectively.
Figure 18B:
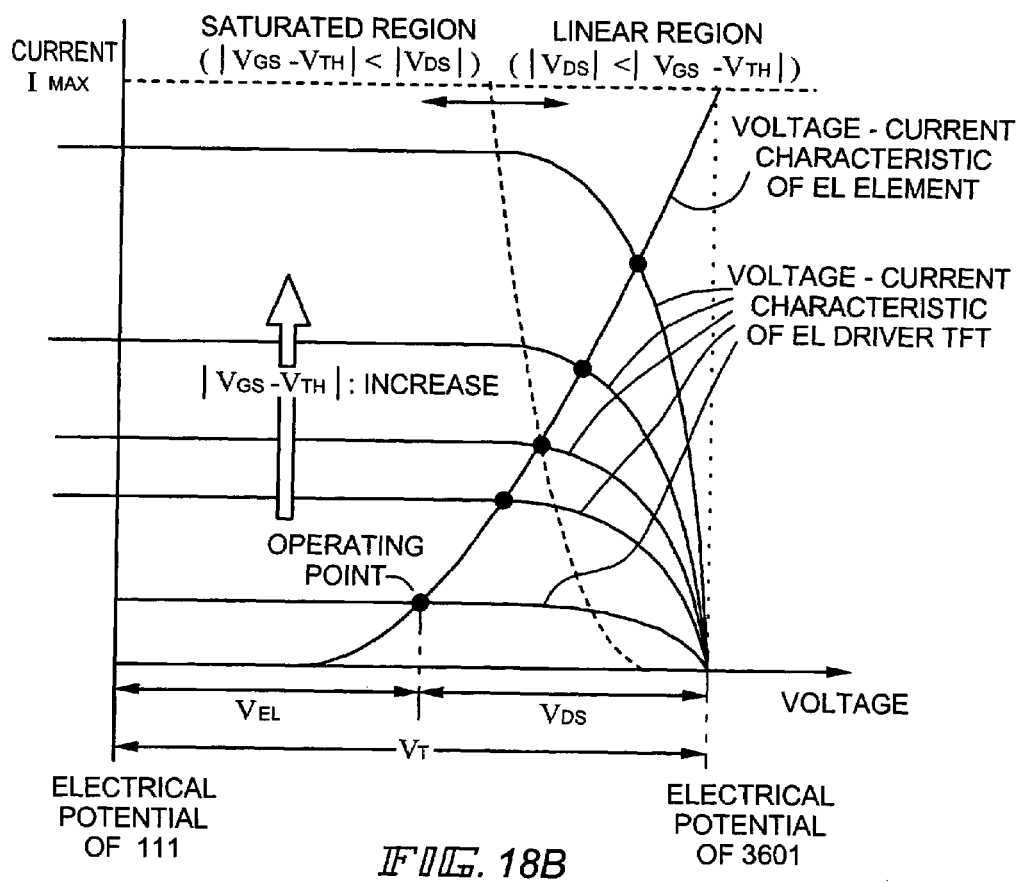

Refer to FIGS. 18A and 18B. FIG. 18A shows only the structure portion of the EL driver TFT 108, and the EL element 110, in the pixel of the EL display of the present invention shown in FIG. 3. Note that, although not shown in FIGS. 18A and 18B in order to simplify the explanation, a first EL driver TFT and a second EL driver TFT are connected in parallel in the EL driver TFT 108.

FIG. 18B shows voltage-current characteristics of the EL driver TFT 108 and the EL element 110 shown in FIG. 18A. A graph of the voltage-current characteristics of the EL driver TFT 108 shown in FIG. 18B shows the amount of a current flowing through a drain region of the EL driver TFT 108 with respect to a voltage $V_{DS}$ between the source region and the drain region. FIG. 18B shows a plurality of graphs at different voltages $V_{GS}$ between the source region and the gate electrode of the EL driver TFT 108.

As shown in FIG. 18A, a voltage applied between the pixel electrode and the opposing electrode 111 of the EL element 110 is denoted by. $V_{EL}$, and a voltage applied between a terminal 3601 connected to the power source supply line and the opposing electrode 111 of the EL element 110 is denoted by $V_T$. A value of $V_T$ is fixed by the electric potential of the power source supply line. A voltage between the source region and the drain region of the EL driver TFT 108 is denoted by $V_{DS}$, and a voltage between a wiring 3602 connected to a gate electrode of the EL driver TFT 108, that is, a voltage between the gate electrode and the source region of the EL driver TFT 108 is denoted by $V_{GS}$.

The EL driver TFT 108 may be formed by either an n-channel TFT or a p-channel TFT. However, it is necessary that the first EL driver TFT and the second EL driver TFT have the same polarity.

The EL driver TFT 108 and the EL element 110 are connected in series with each other. Thus, a current value flowing through both elements (the EL driver TFT 108 and the EL element 110) is the same. Therefore, the EL driver TFT 108 and the EL element 110 shown in FIG. 18A are driven at a point of intersection (operating point) of the graphs showing voltage-current characteristics of both elements. In FIG. 18B, a voltage $V_{EL}$ is a voltage between the electric potential of the opposing electrode 111 and the electric potential at the operating point. A voltage $V_{DS}$ is a voltage between the electric potential at the terminal 3601 of the EL driver TFT 108 and the electric potential at the operating point. Accordingly, the voltage $V_T$ is equal to the sum of $V_{EL}$ and $V_{DS}$.

Then, the case where the voltage $V_{GS}$ is varied is considered. As is seen from FIG. 18B, with increase in value of $|V_{GS}-V_{TH}|$ of the EL driver TFT 108, in other words, with increase in value of $|V_{GS}|$, a current value flowing through the EL driver TFT 108 increases. The voltage $V_{TH}$ is a threshold voltage of the EL driver TFT 108. Therefore, as can be seen from FIG. 18B, a current value flowing through the EL element 110 at the operating point naturally increases. The brightness of the EL element 110 increases in proportion to a current value flowing through the EL element 110.

When a value of $|V_{GS}|$ increases to increase a current value flowing through the EL element 110, a value of $V_{EL}$ also increases in accordance with the current value. Since a value of $V_T$ is determined by the electric potential of the power source supply line, a value of $V_{DS}$ is correspondingly reduced with the increase in $V_{EL}$.

Moreover, as shown in FIG. 18B, the voltage-current characteristics of the EL driver TFT are divided into two regions, based on values of $V_{GS}$ and $V_{DS}$. A region where the relationship: $|V_{GS}-V_{TH}|<|V_{DS}|$ is satisfied is a saturated region, while a region where the relationship: $|V_{GS}-V_{TH}|>|V_{DS}|$ is satisfied is a linear region.

In the saturated region, the following Expression 1 is established. In Expression 1, $I_{DS}$ is a current value flowing through a channel formation region of the EL driver TFT 108. Moreover, $â=\mu C_o W/L$ is established, where $\mu$ is a mobility of the EL driver TFT 108, $C_o$ is a gate capacitance per unit region, and W/L is a ratio of a channel width W to a channel length L of a channel formation region.

$$I_{DS}=â(V_{GS}-V_{TH})^2/2 \qquad \text{(Expression 1)}$$

In the linear region, the following Expression 2 is established.

$$I_{DS}=â\{(V_{GS}-V_{TH})V_{DS}-V_{DS}^2/2\} \qquad \text{(Expression 2)}$$

As is understood from Expression 1, a current value hardly varies by $V_{DS}$ in the saturated region, and is determined uniquely by $V_{GS}$.

On the other hand, as is understood from Expression 2, a current value is determined by $V_{DS}$ and $V_{GS}$ in the linear region. With increase in $|V_{GS}|$, the EL driver TFT 108 operates within the linear region. Correspondingly, $V_{EL}$ gradually increases. Therefore, $V_{DS}$ is reduced by the amount of increase in $V_{EL}$. If $V_{DS}$ is reduced in the linear region, the amount of a current is also reduced. When $|V_{GS}|=\infty$ is established, a current value=$I_{MAX}$. Therefore, even with the greatest value of $|V_{GS}|$, a current larger than $I_{MAX}$ does not flow. Herein, $I_{MAX}$ is a current value flowing through the EL element 110 when $V_{EL}=V_T$ is established.

By controlling $|V_{GS}|$, it is possible to include the operating point in the saturated region or in the linear region.

Although it is desirable that the characteristics of all TFTs for current control are ideally the same, the threshold value $V_{TH}$ and the mobility $\mu$ actually differ for each EL driver TFT in many cases. If the threshold value $V_{TH}$ and the mobility $\mu$ differ in each EL driver TFT, a current value flowing through the channel formation region of the EL driver TFT 108 differs for each TFT even with the same value of $V_{GS}$ as can be understood from Expressions 1 and 2.

Figure 19:
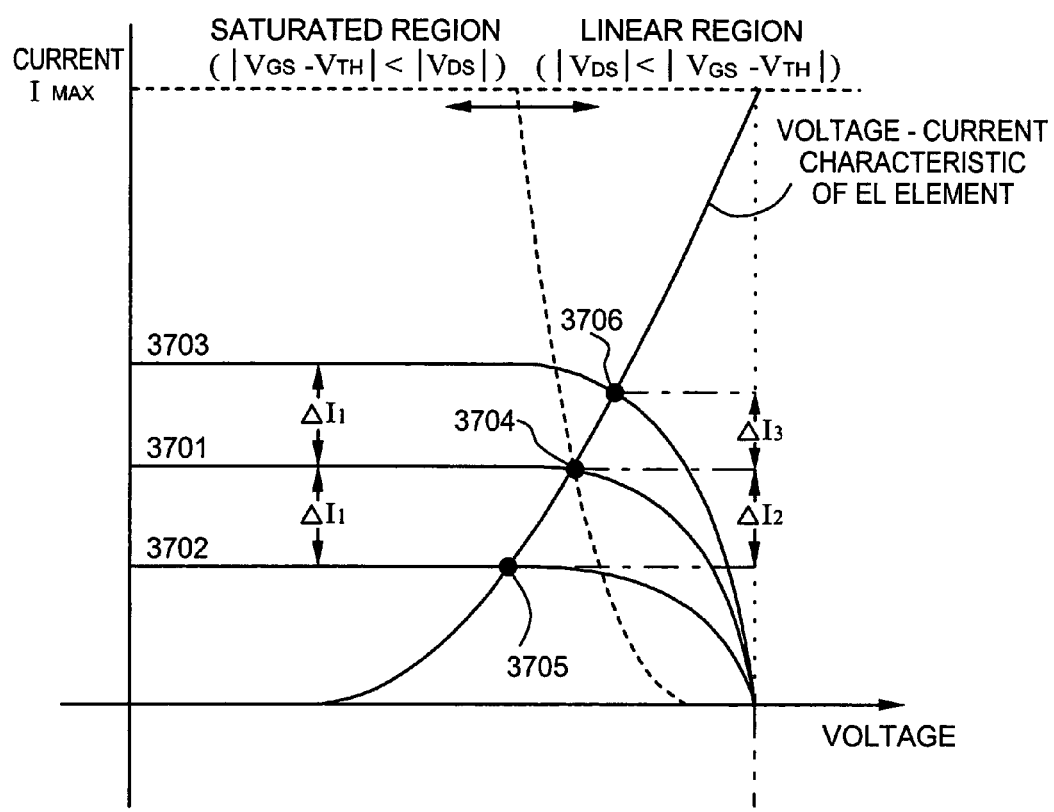
FIG. 19 is a graph showing voltage-current characteristics of the EL element and the EL driver TFT.

FIG. 19 shows current-voltage characteristics of an EL driver TFT with the threshold value $V_{TH}$ and the mobility $\mu$ being shifted. A solid line 3701 is a graph showing the ideal current-voltage characteristic. Solid lines 3702 and 3703 respectively show current-voltage characteristics of an EL driver TFT in the case where the threshold value $V_{TH}$ and the mobility $\mu$ are shifted from the ideal values. It is assumed that the graphs 3702 and 3703 of the current-voltage characteristics are shifted from the graph 3701 showing the current-voltage characteristic having the ideal characteristic by the same current value $ÄI_1$ in the saturated region so that an operating point 3705 of the graph 3702 showing the current-voltage characteristic is present in the saturated region and an operating point 3706 of the graph 3703 of the current-voltage characteristics is present in the linear region. In this case, if the amounts of shift in current value at the operating point 3704 of graph 3701 of the current-voltage characteristic having an ideal characteristic and the current value at the operating points 3705 and 3706 are respectively represented by $ÄI_2$ and $ÄI_3$, the amount of shift in current value is smaller at the operating point 3706 in the linear region than at the operating point 3705 in the saturated region.

Thus, in the case where the digital driving method described in the present invention is employed, the EL driver TFT and the EL element are driven so that the operating point is present within the linear region. As a result, gray-scale display can be performed with unevenness in brightness of the EL element due to shift in characteristics of the EL driver TFT being restrained.

In the case of the conventional analog driving, it is preferred to drive the EL driver TFT and the EL element so that the operating point is present within the saturated region where a current value can be controlled only by $|V_{GS}|$.

Figure 20:
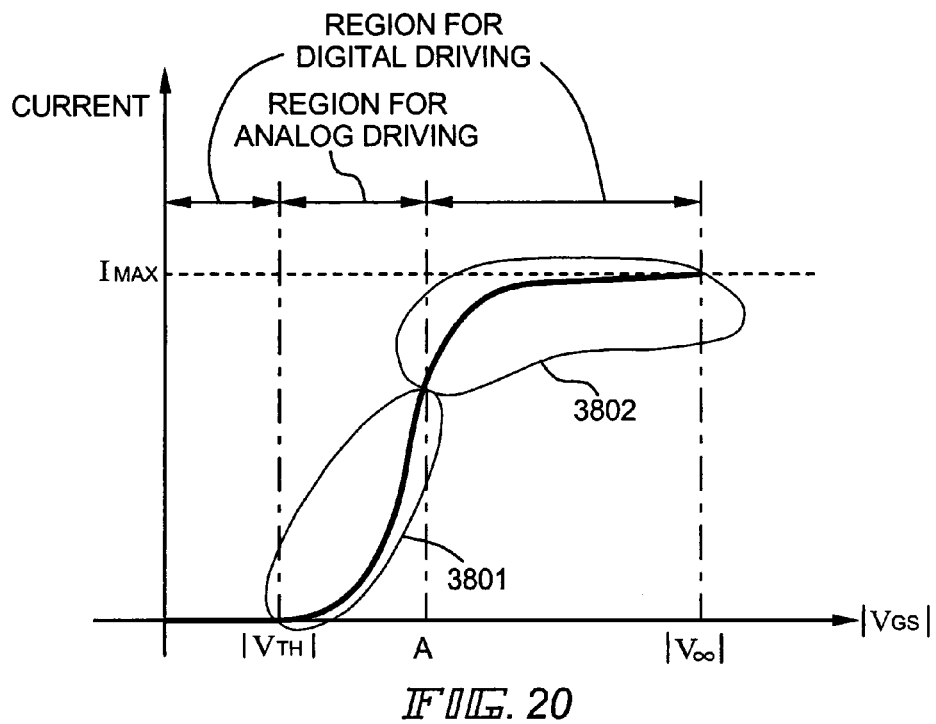
FIG. 20 is a graph showing the relationship between a gate voltage and a drain current of the EL driver TFT.

To summarize the above analysis of operation, FIG. 20 shows a graph of a current value with respect to a gate voltage $|V_{GS}|$ of the EL driver TFT. When a value of $|V_{GS}|$ is increased to be greater than an absolute value $|V_{TH}|$ of a threshold voltage of the EL driver TFT, the EL driver TFT is brought into a conductive state to allow a current to flow therethrough. In this specification, $|V_{GS}|$ at this point is referred to as a lighting starting point. Then, when $|V_{GS}|$ is further increased, $|V_{GS}|$ reaches such a value (this value is assumed as A) that satisfies $|V_{GS}-V_{TH}|=|V_{DS}|$. As a result, $|V_{GS}|$ shifts from the saturated region 3801 toward the linear region 3802. With a further increase in $|V_{GS}|$, a current value is increased to be finally saturated. At this point, $|V_{GS}|=\infty$ is established.

As can be seen from FIG. 20, through the region represented by: $|V_{GS}| \leq |V_{TH}|$, a current scarcely flows. A region represented by: $|V_{TH}| \leq |V_{GS}| \leq A$ is a saturated region where a current value is varied by $|V_{GS}|$. A region represented by: $A \leq |V_{GS}|$ is a linear region where a current value flowing through the EL element is varied by $|V_{GS}|$ and $|V_{DS}|$.

With the digital driving according to the present invention, it is preferred to use a region represented by: $|V_{GS}| \leq |V_{TH}|$ and the linear region represented by: $A \leq |V_{GS}|$.

Embodiment 13 can freely be combined with any of all the other embodiments.

[Embodiment 14]

An example in which the connection structure between an EL display of the present invention and an power source differs from that of FIG. 14A is explained in Embodiment 14.

Figure 21:
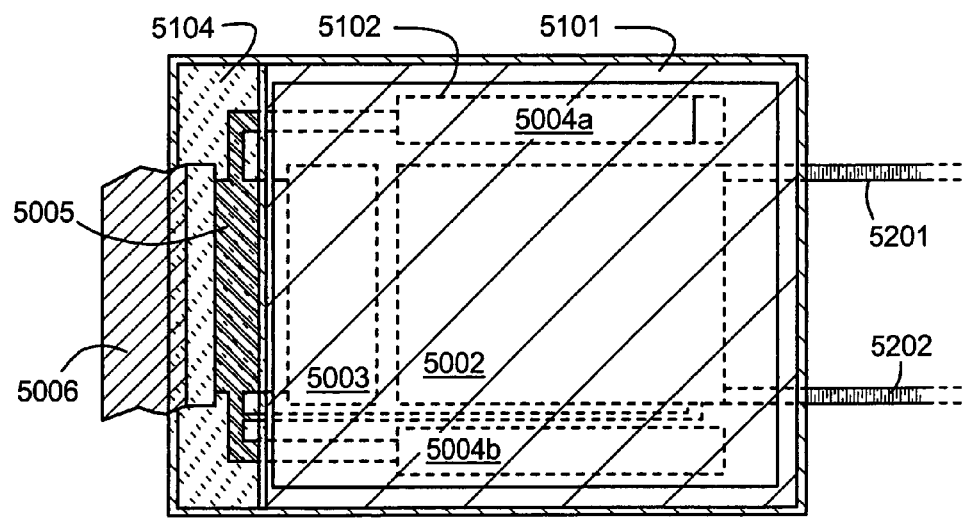
FIG. 21 is a top view of the EL display according to the present invention.

FIG. 21 shows a top surface diagram of an EL display of the present invention. In FIG. 21, reference numeral 5002 denotes a pixel portion, reference numeral 5003 denotes a source signal line driver circuit, reference numeral 5004a denotes a write in gate signal line driver circuit, and reference numeral 5004b denotes an erasure gate signal line driver circuit. Each of the driver circuits is connected to external equipment via a wiring 5005 leading to an FPC (flexible printed circuit) 5006.

A first sealing material 5101, a cover material 5102, a filler material (not shown in the figure), and a second sealing material 5104 are formed so as to surround the pixel portion 5002, the source signal line driver circuit 5003, the write in gate signal line driver circuit 5004a, and the erasure gate signal line driver circuit 5004b.

An power source supply line (not shown in the figure) of the pixel portion 5002 is then connected to a pixel electrode wiring 5201 and is then connected to an external equipment. Further, opposing electrodes (not shown in the figure) of all EL elements of the pixel portion 5002 are connected to an opposing electrode wiring 5202, and are then connected to an external equipment.

It is possible to use known materials, provided that they are materials with conductivity, for the pixel electrode wiring 5201 and the opposing electrode wiring 5202. Copper is used in Embodiment 14.

It is possible, to a certain extent, to freely set the line widths of the pixel electrode wiring 5201 and the opposing electrode wiring 5202, as compared to the pin width of the FPC 5006. It is therefore possible to suppress the wiring resistance of the pixel electrode wiring 5201 and the opposing electrode wiring 5202 compared with the FPC 5006, and the wiring resistance between the opposing electrode of the EL element and external equipment, or the power source supply line and external equipment, can be suppressed in accordance with the above structure.

The number of pins of the FPC 5006 can be reduced, and the mechanical strength of the EL display itself increases.

Note that it is possible to implement Embodiment 14 in combination with Embodiments 1 to 13.

[Embodiment 15]

Figure 22A:
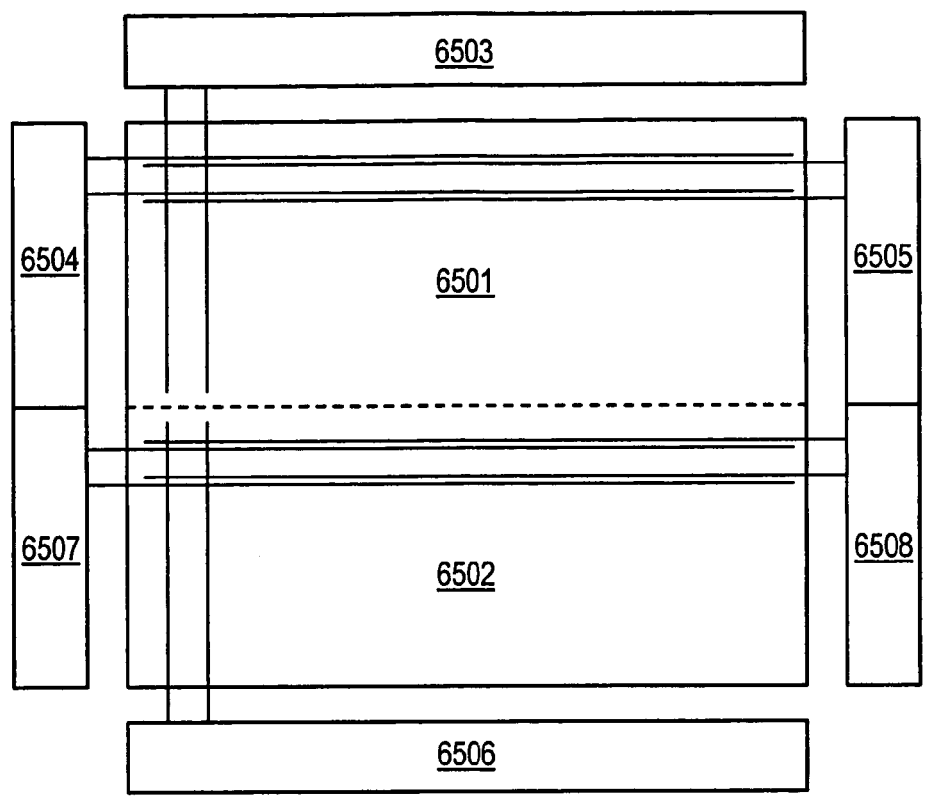
FIG. 22 is a block diagram showing a circuit structure of the EL display according to the present invention.
Figure 22B:
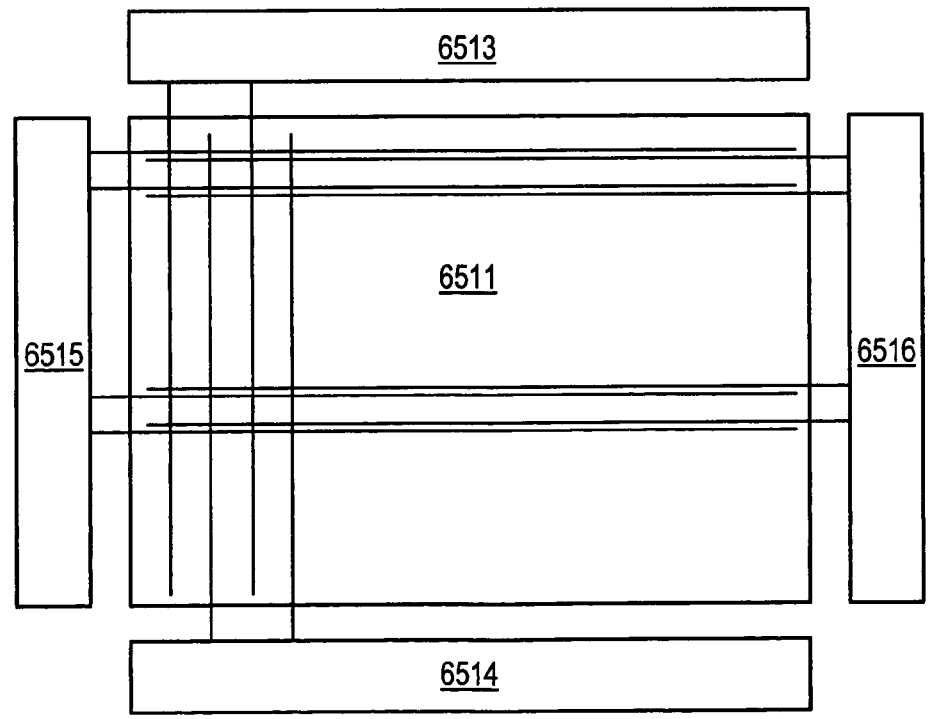

An effective method of driving a pixel portion for implementing the present invention is explained in Embodiment 15 using FIGS. 22A and 22B.

An EL display of Embodiment 15 shown in FIG. 22A has a pixel portion separated into two parts, a pixel portion A 6501 and a pixel portion B 6502. Half of an image is displayed in the pixel portion A 6501 by driving a source signal line driver circuit A 6503, a write in gate signal line driver circuit A 6504, and an erasure gate signal line driver circuit A 6505. Further, the other half of an image is displayed in the pixel portion B 6502 by driving a source signal line driver circuit B 6506, a write in gate signal line driver circuit B 6507, and an erasure gate signal line driver circuit B 6508.

One image is formed by combining the half image displayed in the pixel portion A 6501 with the half image displayed in the pixel portion B 6502.

In an EL display shown in FIG. 22B, digital video signals are input to odd numbered source signal lines from a source signal line driver circuit A 6513, and igital video signals are input to even numbered source signal lines from a source signal line driver circuit B 6514.

Further, the digital video signals input to the odd numbered and even numbered source signal lines are simultaneously input to the pixels in accordance with a write in gate signal line driver circuit 6515 which simultaneously selects two write in gate signal lines. Specifically, the digital video signal is input to a gate electrode of an EL driver TFT through a switching TFT of the pixel.

The power source electric potential of an power source supply line is input to the pixel by an erasure gate signal line driver circuit A 6516 which simultaneously selects two erasure gate signal lines. Specifically, the power source electric potential is imparted to the gate electrode of the EL driver TFT through an erasure TFT of the pixel.

An image can thus be formed in a pixel portion 6511 by the above structure.

Note that it is possible to implement Embodiment 15 in combination with Embodiments 1 to 14.

[Embodiment 16]

In the invention, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical Formula 1)

(M. A. Baldo, D. F. O'Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

(Chemical Formula 2)

(M. A. Baldo, S. Lamansky, P. E. Burrows, M. E. Thompson, S. R. Forrest, Appl. Phys. Lett., 75 (1999) p. 4.) (T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502.)

The molecular formula of an EL material (Ir complex) reported by the above article is represented as follows.

(Chemical Formula 3)

As described above, if phosphorescence from a triplet exciton can be put to practical use, it can realize the external light emitting quantum efficiency three to four times as high as that in the case of using fluorescence from a singlet exciton in principle.

Embodiment 16 can be freely implemented in combination of any structures of the Embodiments 1 to 15.

[Embodiment 17]

An EL display device formed by implementing the present invention has superior visibility in bright locations in comparison to a liquid crystal display device because it is a self-emission type device, and moreover its field of vision is wide. Accordingly, it can be used as a display portion for various electronic devices. For example, it is appropriate to use the EL display device of the present invention as a display portion of an EL display having a diagonal equal to 30 inches or greater (typically equal to 40 inches or greater) for appreciation of TV broadcasts by large screen.

Note that all displays exhibiting (displaying) information such as a personal computer display, a TV broadcast reception display, or an advertisement display are included as the EL display. Further, the EL display device of the present invention can be used as a display portion of the other various electronic devices.

The following can be given as examples of such electronic devices of the present invention: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display device is employed. Examples of these electronic devices are shown in FIGS. 23 and 24.

FIG. 23A is display, containing a casing 2001, a support stand 2002, and a display portion 2003. The EL device of the present invention can be used in the display portion 2003. Since the EL display is a self-emission type device with no need of a back light, its display portion can be made thinner than a liquid crystal display device.

FIG. 23B is a video camera, containing a main body 2101, a display portion 2102, an audio input portion 2103, operation switches 2104, a battery 2105, and an image receiving portion 2106. The EL display device of the present invention can be used in the display portion 2102.

FIG. 23C is a portion of a head mounted type light emitting device (right side), containing a main body 2201, a signal cable 2202, a head fixing band 2203, a screen portion 2204, an optical system 2205, and a display portion 2206. The EL display device of the present invention can be used in the display portion 2206.

FIG. 23D is an image playback device (specifically, a DVD playback device) provided with a recording medium, containing a main body 2301, a recording medium (such as a DVD) 2302, operation switches 2303, a display portion (a) 2304, and a display portion (b) 2305. The display portion (a) 2304 is mainly used for displaying image information, and the display portion (b) 2305 is mainly used for displaying character information, and the EL display device of the present invention can be used in the display portion (a) 2304 and in the display portion (b) 2305. Note that domestic game equipment is included as the image playback device provided with a recording medium.

FIG. 23E is a goggle type display device (head mounted display), containing a main body 2401, a display portion 2402, and arm portion 2403. The EL display device of the present invention can be used in the display portion 2402.

FIG. 23F is a personal computer, containing a main body 2501, a casing 2502, a display portion 2503, and a keyboard 2504. The EL display device of the present invention can be used in the display portion 2503.

Note that if the emission luminance of EL materials becomes higher in the future, it will be possible to use the EL display device of the present invention in a front type or a rear type projector by projecting light including outputted images, which can be enlarged by lenses or the like.

The above electronic devices are becoming more often used to display information provided through an electronic telecommunication line such as the Internet or CATV (cable television), and in particular, opportunities for displaying animation information are increasing. The response speed of EL materials is extremely high, and therefore the EL display device is favorable for performing animation display.

Since the light emitting portion of the EL display device consumes power, it is preferable to display information so as to have the emitting portion become as small as possible. Therefore, when using the EL display device in a display portion which mainly displays character information, such as a portable information terminal, in particular, a portable telephone and an audio reproducing device, it is preferable to drive it by setting non-emitting portions as background and forming character information in emitting portions.

Figure 24A:
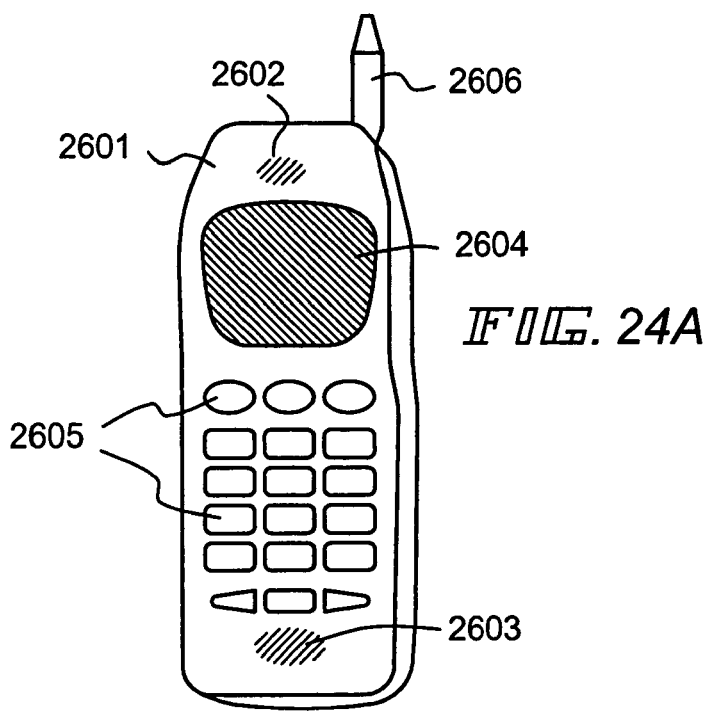
FIGS. 24A and 24B are electric appliances using the EL display according to the present invention.

FIG. 24A is a portable telephone, containing a main body 2601, an audio output portion 2602, an audio input portion 2603, a display portion 2604, operation switches 2605, and an antenna 2606. The EL display device of the present invention can be used in the display portion 2604. Note that by displaying white characters in a black background in the display portion 2604, the power consumption of the portable telephone can be reduced.

Figure 24B:
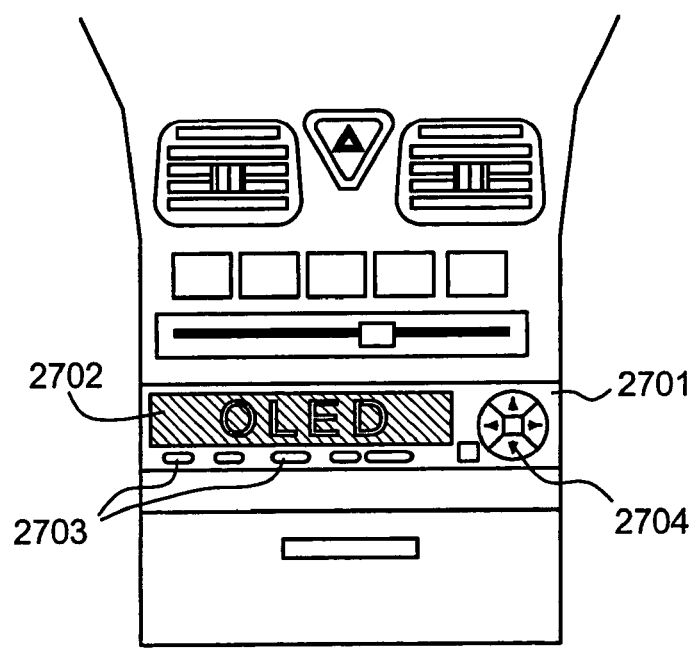
Figure 25:
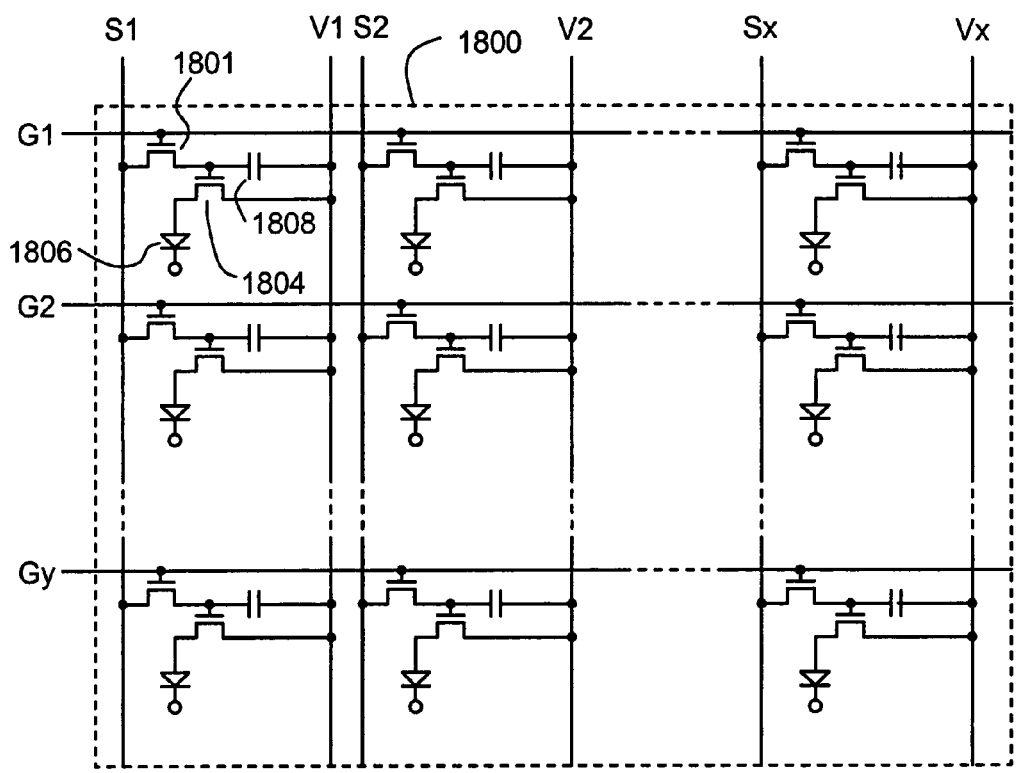
FIG. 25 is a circuit diagram showing a pixel portion of a conventional EL display.
Figure 26:
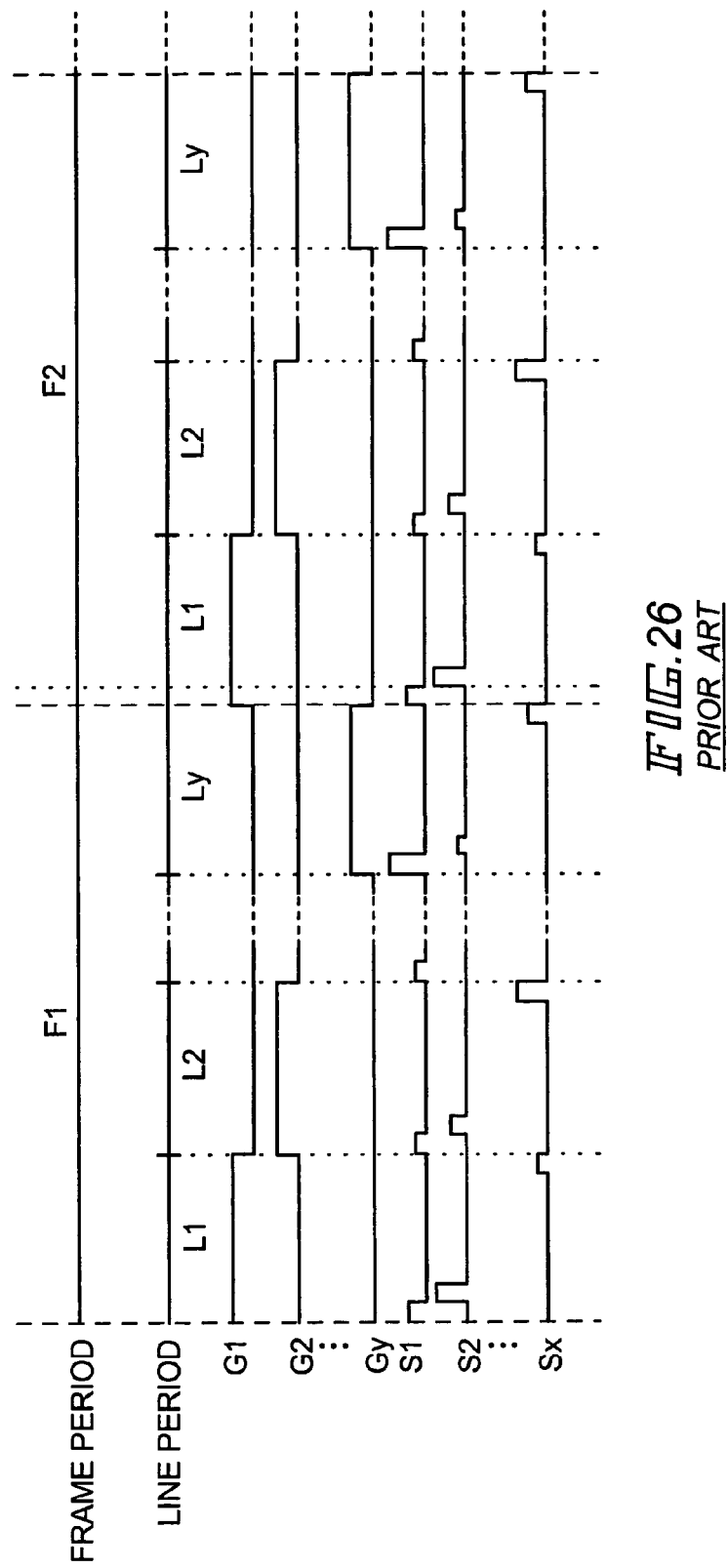
FIG. 26 is a timing chart showing a driving method of the conventional EL display.
Figure 27A:
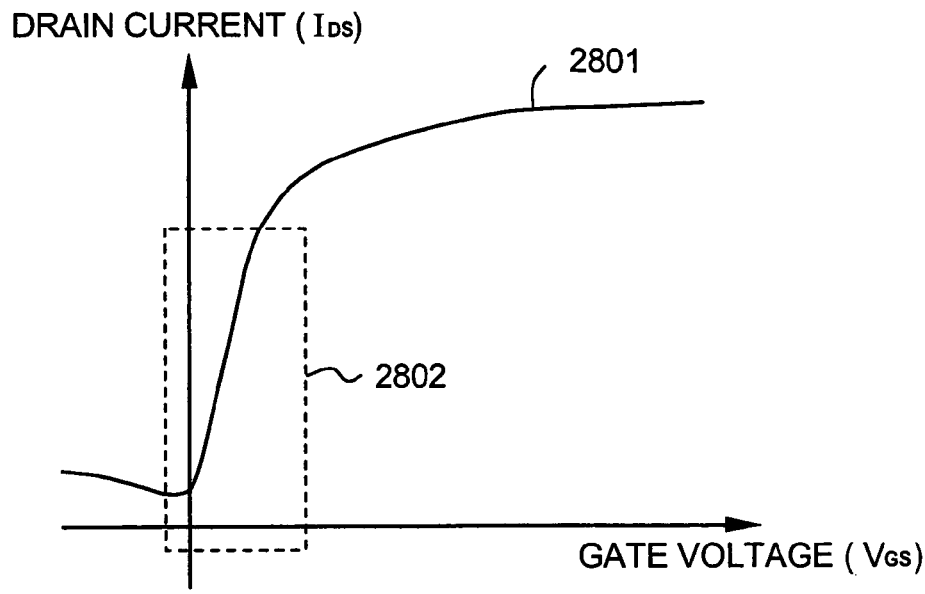
FIGS. 27A and 27B are graphs showing an $I_{DS}$-$V_{GS}$ characteristic of the TFT.
Figure 27B:
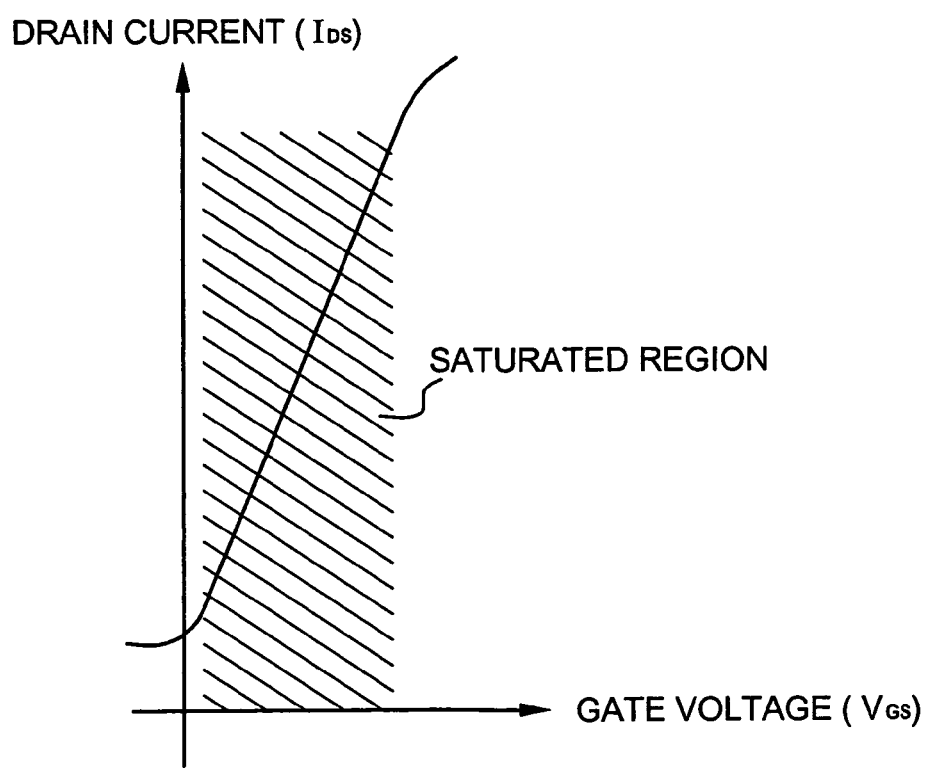

FIG. 24B is an audio reproducing device, specifically a car audio system, containing a main body 2701, a display portion 2702, and operation switches 2703 and 2704. The EL display device of the present invention can be used in the display portion 3412. Furthermore, an audio reproducing device for a car is shown in Embodiment 17, but it may also be used for a portable type and a domestic type of audio reproducing device. Note that by displaying white characters in a black background in the display portion 2702, the power consumption can be reduced. This is particularly effective in a portable type audio reproducing device.

The range of applications of the present invention is thus extremely wide, and it is possible to apply the present invention to electronic devices in all fields. Furthermore, Embodiment 17 can be implemented in combination of any structures of the Embodiments 1 to 16.

In accordance with the above structure of the present invention, even if there is some fluctuation in the $I_{DS}$-$V_{GS}$ characteristic of the EL driver TFT, fluctuation in the amount of electric current output when equal gate voltages are applied to the EL driver TFTs can be suppressed. Therefore, it becomes possible to avoid a situation in which, due to the fluctuation of the $I_{DS}$-$V_{GS}$ characteristic, the amount of light emitted from the EL element differs greatly for adjacent pixels when signals of the same voltage are input.

Non-light emitting periods during which display is not performed can be formed according to the present invention If a completely white image is displayed in an EL display device using a conventional analog driving method, the EL elements always emit light and degradation of the EL layers is made quicker. Non-light emitting periods can be formed with the present invention, and therefore degradation of the EL layers can be suppressed to a certain extent.

What is claimed is:

1. A method of driving a light emitting device comprising: a source signal line driver circuit; a first gate signal line driver circuit; a second gate signal line driver circuit; a pixel portion; a plurality of source signal lines connected to the source signal line driver circuit; a plurality of first gate signal lines connected to the first gate signal line driver circuit; a plurality of second gate signal lines connected to the second gate signal line driver circuit; and a plurality of power source supply lines;

wherein said pixel portion comprises a plurality of pixels;

wherein each of said plurality of pixels comprises a switching TFT; a first EL driver TFT; a second EL driver TFT; an erasure TFT; and an EL element;

wherein said first EL driver TFT and said second EL driver TFT are connected in parallel;

wherein a gate electrode of said switching TFT is connected to one of said plurality of first gate signal lines;

wherein one of a source region and a drain region of the switching TFT is connected to one of said plurality of source signal lines, and the other of said source region and said drain region is connected to a gate electrode of said first EL driver TFT and to a gate electrode of said second EL driver TFT;

wherein a gate electrode of said erasure TFT is connected to one of said plurality of second gate signal lines;

wherein one of a source region and a drain region of said erasure TFT is connected to one of said plurality of power source supply lines, and the other of said source region and said drain region is connected to said gate electrode of said first EL driver TFT and to said gate electrode of said second EL driver TFT;

wherein a source region of said first EL driver TFT and a source region of said second EL driver TFT are connected to said power source supply line;

wherein a drain region of said first EL driver TFT and a drain region of said second EL driver TFT are connected to said EL element;

wherein n write in periods Ta1, Ta2, . . . , Tan and (m−1) erasure periods Te1, Te2, . . . , Te(m−1), (m is an arbitrary number from 2 to n) are formed within one frame period;

wherein a digital video signal output from said source signal line driver circuit is input to a gate electrode of said first EL driver TFT and to a gate electrode of said second EL driver TFT in said write in periods Ta1, Ta2, . . . , Tan;

wherein said digital video signal input to said gate electrode of said first EL driver TFT and to said gate electrode of said second EL driver TFT is erased in said erasure periods Te1, Te2, . . . , Te(m−1);

wherein the write in periods Ta1, Ta2, . . . , Tam from among said write in periods Ta1, Ta2, . . . , Tan, and said erasure periods Te1, Te2, . . . , Te(m−1) partly overlap mutually;

wherein periods which begin when said write in periods Ta1, Ta2, . . . , Tan begin and finish when the next write in period Ta1, Ta2, . . . , Tan begin, or periods which begin when said write in periods Ta1, Ta2, . . . , Tan begin and finish said erasure periods Te1, Te2, . . . , Te(m−1) begin, are display periods Tr1, Tr2, . . . , Trn, respectively;

wherein periods begin when said erasure periods Te1, Te2, . . . , Te(m−1) begin and finish when the write in periods after said erasure periods Te1, Te2, . . . , Te(m−1) begin, are non-display periods Td1, Td2, . . . , Td(m−1), respectively;

wherein it is selected whether said plurality of EL elements emit light or do not emit light in said display periods Tr1, Tr2, . . . , Trn in accordance with said digital video signal; and wherein the ratio of the lengths of said display periods Tr1, Tr2, . . . , Trn is expressed by $2^0 : 2^1 \ldots : 2^{(n-1)}$.

2. A method of driving said light emitting device according to claim 1, wherein said first EL driver TFT and said second EL driver TFT have the same polarity.

3. A method of driving said light emitting device according to claim 1, wherein said switching TFT, said erasure TFT, said first EL driver TFT, or said second EL driver TFT is a top gate TFT.

4. A method of driving said light emitting device according to claim 1, wherein said switching TFT, said erasure TFT, said first EL driver TFT, or said second EL driver TFT is a bottom gate TFT.

5. A method of driving said light emitting device according to claim 1, wherein said source signal line driver circuit comprises a shift register, a first latch, and a second latch.

6. A method of driving said light emitting device according to claim 1, wherein said first latch or said second latch comprises two clocked inverters and two inverters.

7. A method of driving said light emitting device according to claim 1, wherein said first EL driver TFT or said second EL driver TFT is driven in a linear region.

8. A method of driving said light emitting device according to claim 1, wherein said light emitting device is one of a computer, a video camera, and a DVD player.

9. A method of driving said light emitting device according to claims 1, wherein said light emitting device compnses a gate wiring connected to said gate electrode of said first EL driver TFT and to said gate electrode of said second EL driver TFT; and a capacitor wiring connected to said power source supply line; and wherein a gate insulating film of said switching TFT, said erasure TFT, said first EL driver TFT, and said second EL driver TFT is provided between said gate wiring and said capacitor wiring.

10. A method of driving said light emitting device according claim 1, wherein, from among said plurality of pixels, two pixels along the direction in which said plurality of first gate signal lines are formed, are adjacent with one of said plurality of power source supply lines therebetween; and wherein a source region of said first EL driver TFT and a source region of said second EL driver TET of each of said two pixels are connected to said power source supply line.

11. A method of driving said light emitting device according to claim 1, wherein two pixels along the direction in which said plurality of first gate signal lines are formed, are adjacent with one of said plurality of second gate signal lines therebetween;

wherein a gate electrode of said first EL driver TFT and a gate electrode of said second EL driver TFT of each of said two pixels are connected to said plurality of second gate signal line; and wherein a source region of said first EL driver TFT and a source region of said second EL driver TFT of each of said two pixels are connected to one of said plurality of power source supply lines.

12. A method of driving said light emitting device according to claim 1, wherein said plurality of first gate signal lines and said plurality of second gate signal lines are formed in parallel.

13. A method of driving said light emitting device according to claim 12, wherein said plurality of first gate signal lines and said plurality of second gate signal lines overlap with an insulating film therebetween.

14. A method of driving said light emitting device according to claim 1, wherein said plurality of source signal lines and said plurality of power source supply lines are formed in parallel.

15. A method of driving said light emitting device according to claim 14, wherein said plurality of source signal lines and the plurality of power source supply lines overlap with an insulating film therebetween.

16. A method of driving said light emitting device according to claim 1, wherein said plurality of first gate signal lines and said plurality of power source supply lines are formed in parallel.

17. A method of driving said light emitting device according to claim 16, wherein said plurality of first gate signal lines and said plurality of power source supply lines overlap with an insulating film therebetween.

18. A method of driving said light emitting device according to claim 1, wherein said plurality of second gate signal lines and said plurality of power source supply lines are formed in parallel.

19. A method of driving said light emitting device according to claim 18, wherein said plurality of second gate signal lines and said plurality of power source supply lines overlap with an insulating film therebetween.

20. A method of driving said light emitting device according to claim 1, wherein the order of appearance of said display periods Tr1, Tr2, . . . , Trn is random.

21. A method of driving said light emitting device according to claim 1, wherein the longest non-display period from among the non-display periods Td1, Td2, . . . , Td(m−1) appears last within said frame period.

22. A method of driving said light emitting device according to claim 1, wherein said write in periods Ta1, Ta2, . . . , Tan do not mutually overlap.

23. A method of driving said light emitting device according to claim 1, wherein said erasure periods Te1, Te2, . . . , Te(m−1) do not mutually overlap.

24. A method of driving a light emitting device comprising: a source signal line driver circuit; a first gate signal line driver circuit; a second gate signal line driver circuit; a pixel portion; a plurality of source signal lines connected to the source signal line driver circuit; a plurality of first gate signal lines connected to the first gate signal line driver circuit; a plurality of second gate signal lines connected to the second gate signal line driver circuit; and a plurality of power source supply lines;

wherein said pixel portion comprises a plurality of pixels;

wherein each of said plurality of pixels comprises a switching TFT; a first EL driver TFT; a second EL driver TFT; an erasure TFT; and an EL element;

wherein said first EL driver TFT and said second EL driver TFT are connected in parallel;

wherein said EL element comprises a pixel electrode, an opposing electrode maintained at a constant electric potential, and an EL layer provided between said pixel electrode and said opposing electrode;

wherein a gate electrode of said switching TFT is connected to one of said plurality of first gate signal lines;

wherein one of a source region and a drain region of the switching TFT is connected to one of said plurality of source signal lines, and the other of said source region and said drain region is connected to a gate electrode of said first EL driver TFT and to a gate electrode of said second EL driver TFT;

wherein a gate electrode of said erasure TFT is connected to one of said plurality of second gate signal lines;

wherein one of a source region and a drain region of said erasure TFT is connected to one of said plurality of power source supply lines, and the other of said source region and said drain region is connected to said gate electrode of said first EL driver TFT and to said gate electrode of said second EL driver TFT;

wherein a source region of said first EL driver TFT and a source region of said second EL driver TFT are connected to said power source supply line;

wherein a drain region of said first EL driver TFT and a drain region of said second EL driver TFT are connected to said pixel electrode of said EL element;

wherein n write in periods Ta1, Ta2, . . . , Tan and (m−1) erasure periods Te1, Te2, . . . , Te(m−1), (m is an arbitrary number from 2 to n) are formed within one frame period;

wherein a digital video signal output from said source signal line driver circuit is input to a gate electrode of said first EL driver TFT and to a gate electrode of said second EL driver TFT in said write in periods Ta1, Ta2, . . . , Tan;

wherein said digital video signal input to said gate electrode of said first EL driver TFT and to said gate electrode of said second EL driver TFT is erased in said erasure periods Te1, Te2, . . . , Te(m−1);

wherein the write in periods Ta1, Ta2, . . . , Tam from among said write in periods Ta1, Ta2, . . . , Tan, and said erasure periods Te1, Te2, . . . , Te(m−1) partly overlap mutually;

wherein periods which begin when said write in periods Ta1, Ta2, . . . , Tan begin and finish when the next write in period Ta1, Ta2, . . . , Tan begin, or periods which begin when said write in periods Ta1, Ta2, . . . , Tan begin and finish said erasure periods Te1, Te2, . . . , Te(m−1) begin, are display periods Tr1, Tr2, . . . , Trn, respectively;

wherein periods begin when said erasure periods Te1, Te2, . . . , Te(m−1) begin and finish when the write in periods after said erasure periods Te1, Te2, . . . , Te(m−1) begin, are non-display periods Td1, Td2, . . . , Td(m−1), respectively;

wherein it is selected whether said plurality of EL elements emit light or do not emit light in said display periods Tr1, Tr2, . . . , Trn in accordance with said digital video signal; and wherein the ratio of the lengths of said display periods Tr1, Tr2, . . . , Trn is expressed by $2^0 : 2^1 : \ldots : 2^{(n-1)}$.

25. A method of driving said light emitting device according to claim 24, wherein said EL layer is formed of a low-molecular organic material or a polymer organic material.

26. A method of driving said light emitting device according to claim 24, wherein said low-molecular organic material is made of Alq$_3$ (tris-8-quinolilite-aluminium) or TPD (triphenylamine derivative).

27. A method of driving said light emitting device according to claim 24, wherein said polymer organic material is made of PPV (polyphenylene vinylene), PVK (polyvinylcarbazole) or polycarbonate.

28. A method of driving said light emitting device according to claim 24, wherein said first EL driver TFT and said second EL driver TFT are p-channel TFTs when said pixel electrode is an anode.

29. A method of driving said light emitting device according to claim 24, wherein said first EL driver TFT and said second EL driver TFT are n-channel TFTs when said pixel electrode is a cathode.

30. A method of driving said light emitting device according to claim 24,
wherein said pixel electrode and said drain region of said first EL driver TFT, and said pixel electrode and said drain region of said second EL driver TFT are connected through at least one wiring; and
wherein a bank is formed on a region where said pixel electrode said is connected to said at least one wiring.

* * * * *